(12) United States Patent
Itoi et al.

(10) Patent No.: US 10,777,747 B2
(45) Date of Patent: Sep. 15, 2020

(54) AMINE COMPOUND AND ORGANIC ELECTROLUMINESCENCE DEVICE INCLUDING THE SAME

(71) Applicant: Samsung Display Co., Ltd., Yongin-si, Gyeonggi-do (KR)

(72) Inventors: Hiroaki Itoi, Yokohama (JP); Akinori Yamatani, Yokohama (JP); Hideo Miyake, Yokohama (JP); Masatsugu Ueno, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 326 days.

(21) Appl. No.: 15/830,956

(22) Filed: Dec. 4, 2017

(65) Prior Publication Data

US 2018/0159046 A1    Jun. 7, 2018

(30) Foreign Application Priority Data

Dec. 5, 2016  (KR) .................... 10-2016-0164513

(51) Int. Cl.
*H01L 51/50* (2006.01)
*H01L 51/00* (2006.01)
*C07F 7/08* (2006.01)

(52) U.S. Cl.
CPC .......... *H01L 51/0059* (2013.01); *C07F 7/081* (2013.01); *H01L 51/0094* (2013.01); *H01L 51/5056* (2013.01); *H01L 2251/308* (2013.01)

(58) Field of Classification Search
None
See application file for complete search history.

(56) References Cited

U.S. PATENT DOCUMENTS 7,846,558 B2   12/2010  Je et al.
7,927,719 B2    4/2011  Hwang et al.
(Continued)

FOREIGN PATENT DOCUMENTS

EP    1 921 082 B1    4/2010
JP    2009-29726 A    2/2009
(Continued)

OTHER PUBLICATIONS

Abstract Publication No. 10-2011-0069077, dated Jun. 22, 2011, for KR 10-1325329 B1, 3 pages.
(Continued)

*Primary Examiner* — Gregory D Clark
(74) *Attorney, Agent, or Firm* — Lewis Roca Rothgerber Christie LLP

(57) ABSTRACT

Provided are an amine compound and an organic electroluminescence device including the same. The amine compound according to an embodiment of the inventive concept is represented by Formula 1 below.

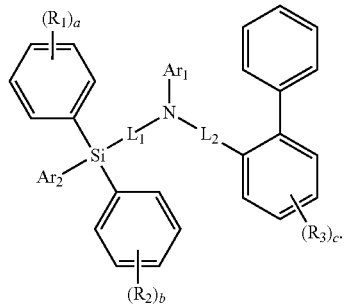

Formula 1

19 Claims, 1 Drawing Sheet

(56) References Cited

U.S. PATENT DOCUMENTS

| | | |
|---|---|---|
| 2011/0220881 A1 | 9/2011 | Yokoyama et al. |
| 2013/0328027 A1 | 12/2013 | Sotoyama et al. |
| 2014/0209869 A1 | 7/2014 | Jung et al. |
| 2014/0312287 A1 | 10/2014 | Stoessel et al. |
| 2015/0270502 A1* | 9/2015 | Fuchiwaki .......... H01L 51/0059 257/40 |
| 2015/0333281 A1 | 11/2015 | Kim et al. |
| 2016/0118595 A1 | 4/2016 | Itoi |

FOREIGN PATENT DOCUMENTS

| | | |
|---|---|---|
| JP | 2009-267255 A | 11/2009 |
| JP | 4538752 B2 | 7/2010 |
| JP | 2012-49518 A | 3/2012 |
| JP | 2015-502960 A | 1/2015 |
| JP | 2015-133362 A | 7/2015 |
| KR | 10-0846590 B1 | 7/2008 |
| KR | 10-2011-0056728 A | 5/2011 |
| KR | 10-2011-0068239 A | 6/2011 |
| KR | 10-2011-0081274 A | 7/2011 |
| KR | 10-1325329 B1 | 10/2013 |
| KR | 10-2014-0074228 A | 6/2014 |
| KR | 10-2015-0036721 A | 4/2015 |
| KR | 10-2015-0048137 A | 5/2015 |
| KR | 10-2015-0090021 A | 8/2015 |
| KR | 10-2015-0092696 A | 8/2015 |
| KR | 10-2015-0093995 A | 8/2015 |
| KR | 10-2015-0106501 A | 9/2015 |
| KR | 10-1558623 B1 | 10/2015 |
| KR | 10-1626889 B1 | 5/2016 |
| WO | WO 2012/011756 A1 | 1/2012 |
| WO | WO 2014/077558 A1 | 5/2014 |
| WO | WO 2014/088047 A1 | 6/2014 |
| WO | WO 2014/088285 A1 | 6/2014 |

OTHER PUBLICATIONS

Abstract Publication No. 10-2010-0039393, dated Apr. 15, 2010, for KR 10-1558623 B1, 3 pages.

Abstract Publication No. 10-2015-0077581, dated Jul. 8, 2015, for KR 10-1626889 B1, 2 pages.

* cited by examiner

AMINE COMPOUND AND ORGANIC ELECTROLUMINESCENCE DEVICE INCLUDING THE SAME

CROSS-REFERENCE TO RELATED APPLICATION

This patent application claims priority to and the benefit of Korean Patent Application No. 10-2016-0164513, filed on Dec. 5, 2016, the entire content of which is hereby incorporated by reference.

BACKGROUND

One or more aspects of one or more embodiments of the present disclosure herein are directed toward an amine compound and an organic electroluminescence device including the same.

Development on organic electroluminescence displays as image display devices has been actively conducted. An organic electroluminescence display is a self-luminescent display and is different from a liquid crystal display, for example, in that it accomplishes display (of an image) by recombining holes and electrons injected from a first electrode and a second electrode in an emission layer and emitting light via a luminescent organic compound material included in the emission layer.

As an example of an organic electroluminescence device, an organic device may be composed of a first electrode, a hole transport layer disposed (e.g., positioned) on the first electrode, an emission layer disposed on the hole transport layer, an electron transport layer disposed on the emission layer, and a second electrode disposed on the electron transport layer. Holes are injected from the first electrode, and the injected holes move via the hole transport layer and are injected into the emission layer. Meanwhile, electrons are injected from the second electrode, and the injected electrons move via the electron transport layer and are injected into the emission layer. By recombining the injected holes and electrons in the emission layer, excitons are generated in the emission layer. The organic electroluminescence device emits light during the transition of the excitons back to a ground state. However, the configuration of an organic electroluminescence device is not limited thereto, and various suitable modifications may be possible. For applying an organic electroluminescence device in a display, the decrease of a driving voltage and the increase of emission efficiency of the organic electroluminescence device are desired.

SUMMARY

One or more aspects of one or more embodiments of the present disclosure are directed toward an amine compound which may be used (e.g., utilized) in an organic electroluminescence device. The organic electroluminescence device including the amine compound may have low driving voltage, increased life, and high emission efficiency.

In one or more embodiments of the present disclosure, an organic electroluminescence device having a low driving voltage, increased life, and high emission efficiency is provided.

In an embodiment of the inventive concept, an amine compound is represented by the following Formula 1:

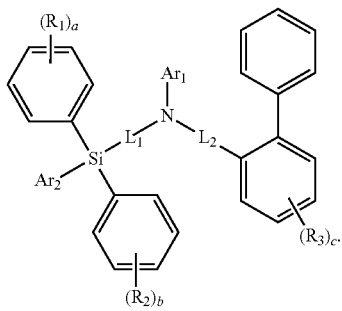

Formula 1

In Formula 1, $Ar_1$ and $Ar_2$ may each independently be a substituted or unsubstituted aryl group having 6 to 30 carbon atoms for forming a ring, or a substituted or unsubstituted heteroaryl group having 2 to 30 carbon atoms for forming a ring; $L_1$ may be a substituted or unsubstituted phenylene group, or a substituted or unsubstituted divalent biphenyl group; $L_2$ may be a direct linkage, a substituted or unsubstituted arylene group having 6 to 30 carbon atoms for forming a ring, or a substituted or unsubstituted heteroarylene group having 2 to 30 carbon atoms for forming a ring; $R_1$ to $R_3$ may each independently be selected from hydrogen, deuterium, a halogen atom, a substituted or unsubstituted alkyl group having 1 to 20 carbon atoms, a substituted or unsubstituted aryl group having 6 to 30 carbon atoms, and a substituted or unsubstituted heteroaryl group having 2 to 30 carbon atoms for forming a ring; "a" and "b" may each independently be an integer of 0 to 5; and "c" may be an integer of 0 to 4.

In an embodiment, the amine compound represented by Formula 1 may be represented by the following Formula 2:

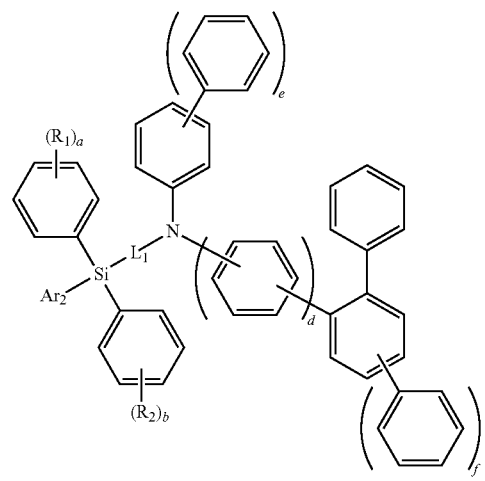

Formula 2

In Formula 2, "d" may be 0 or 1, "e" may be 0 or 1, "f" may be an integer of 0 to 2, wherein if "f" is 2 and "d" is 1, "e" is 0; and $L_1$, $R_1$, $R_2$, $Ar_2$, "a" and "b" are the same as defined above.

In an embodiment, $Ar_1$ may be a substituted or unsubstituted phenyl group, or a substituted or unsubstituted biphenyl group.

In an embodiment, $Ar_2$ may be a substituted or unsubstituted phenyl group, or a substituted or unsubstituted naphthyl group.

In an embodiment, the amine compound represented by Formula 1 may be represented by one of the following Formulae 3-1 to 3-7:

Formula 3-1

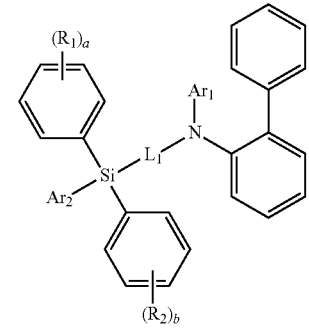

Formula 3-2

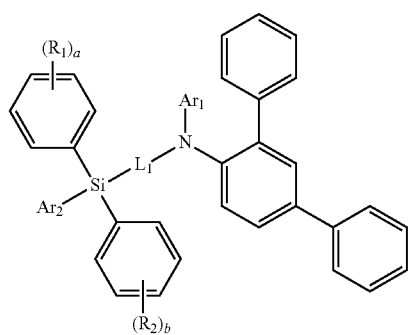

Formula 3-3

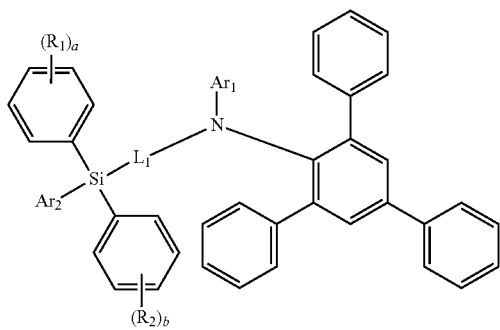

Formula 3-4

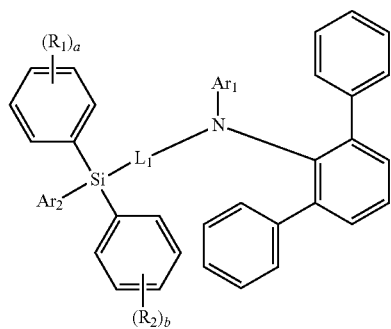

Formula 3-5

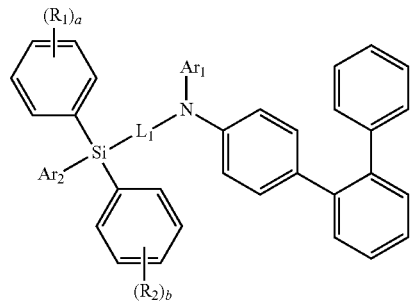

Formula 3-6

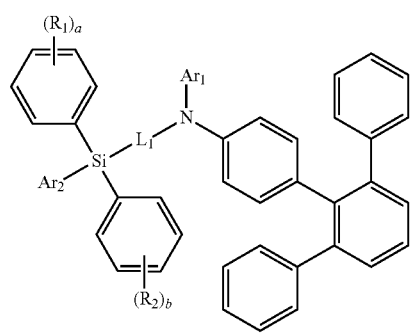

Formula 3-7

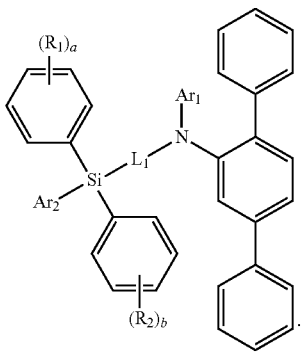

In Formulae 3-1 to 3-7, $R_1$, $R_2$, $Ar_1$, $Ar_2$, $L_1$, "a" and "b" are the same as defined above.

In an embodiment, the amine compound represented by Formula 1 may be represented by one of the following Formulae 4-1 to 4-4:

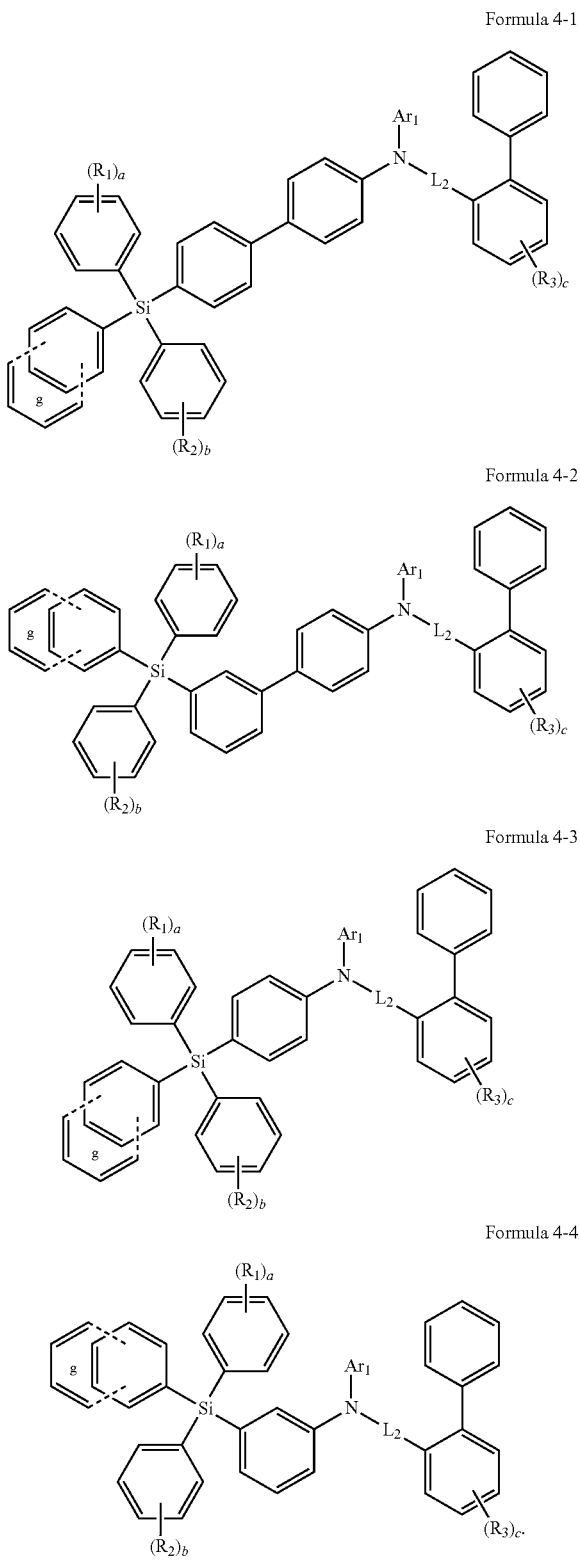

In Formulae 4-1 to 4-4, "g" is 0 or 1, and $R_1$, $R_2$, $R_3$, $Ar_1$, $L_2$, "a", "b" and "c" are the same as defined above.

In an embodiment, the amine compound represented by Formula 1 may have a molecular weight of about 600 to about 830.

In an embodiment of the inventive concept, an organic electroluminescence device includes a first electrode, a hole transport region on the first electrode, an emission layer on the hole transport region, an electron transport region on the emission layer, and a second electrode on the electron transport region. The hole transport region may include an amine compound according to an embodiment of the inventive concept.

In an embodiment, the hole transport region may include a hole injection layer on the first electrode, and a hole transport layer on the hole injection layer, and the hole transport layer may include the amine compound represented by Formula 1.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
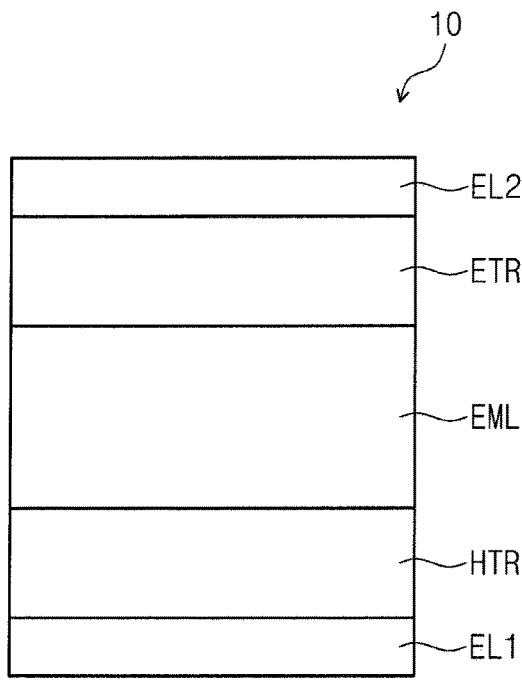
FIG. 1 is a schematic cross-sectional view of an organic electroluminescence device according to an embodiment of the inventive concept.

The above objects, as well as other objects, features and advantages of the present inventive concept should be easily understood from the description of example embodiments with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Like reference numerals refer to like elements throughout the specification and drawings. In the drawings, the sizes of elements may be enlarged for clarity. It will be understood that, although the terms "first," "second," etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, indicate the presence of stated features, numerals, steps, operations, elements, parts, or a combination thereof, but do not preclude the presence or addition of one or more other features, numerals, steps, operations, elements, parts, or a combination thereof.

It will also be understood that when a layer, a film, a region, a plate, etc. is referred to as being "on" another element, it can be directly on the other element, or intervening elements may also be present. Similarly, when a layer, a film, a region, a plate, etc. is referred to as being "under" another element, it can be directly under" the other element, or intervening elements may also be present.

In the present disclosure, the term "substituted or unsubstituted" may refer to a group that is either unsubstituted or is substituted with at least one substituent selected from deuterium, halogen, cyano group, nitro group, amino group, silyl group, boron, aryl amine, phosphine oxide, phosphine sulfide, alkyl group, alkenyl group, aryl group, and heterocyclic group. In addition, each of the substituents illustrated above may itself be substituted or unsubstituted. For example, a biphenyl group may be referred to as an aryl group, or a phenyl group substituted with a phenyl group.

In the present disclosure, the expression "forming a ring by combining adjacent groups with each other" may refer to forming a substituted or unsubstituted hydrocarbon ring or a substituted or unsubstituted heterocycle by combining adjacent groups (or substituents) with each other. A hydrocarbon ring may include an aliphatic hydrocarbon ring and an aromatic hydrocarbon ring. The heterocycle may include an aliphatic heterocycle and aromatic heterocycle. The hydrocarbon ring and heterocycle may each independently be a monocycle or a polycycle. In addition, the ring formed by combining adjacent groups may be connected with another ring to form a Spiro structure.

In the present disclosure, the term "an adjacent group" may refer to a substituent at an atom that is directly connected with another atom at which a corresponding substituent is substituted, another substituent at the same atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, a direct linkage may refer to a single bond.

In the present disclosure, a halogen atom may include a fluorine atom, a chlorine atom, a bromine atom, and/or an iodine atom.

In the present disclosure, the term "atoms for forming a ring" may refer to ring-forming atoms.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

In the present disclosure, the alkyl group may have a linear, branched or cyclic shape. The carbon number of the alkyl group may be 1 to 30, 1 to 20, 1 to 15, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl group may refer to an aromatic hydrocarbon ring. The aryl group may be monocyclic aryl or polycyclic aryl. The number of carbon atoms in the aryl group for forming a ring may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present disclosure, the fluorenyl group may be substituted, and two substituents may optionally be combined with each other to form a spiro structure.

In the present disclosure, the heteroaryl group may refer to an aromatic cyclic group including at least one of O, N, P, S, or Si as a ring-forming atom. The heteroaryl group may be a monocyclic heteroaryl group or a polycyclic heteroaryl group. The number of carbon atoms in the heteroaryl group for forming a ring may be 2 to 30, or 2 to 20. Examples of the heteroaryl group may include thiophenyl, furanyl, pyrrolyl, imidazolyl, thiazolyl, oxazolyl, oxadiazolyl, triazolyl, pyridyl, bipyridyl, pyrimidyl, triazinyl, triazolyl, acridyl, pyridazinyl, pyrazinyl, quinolinyl, quinazolinyl, quinoxalinyl, phenoxazyl, phthalazinyl, pyrido pyrimidinyl, pyrido pyrazinyl, pyrazino pyrazinyl, isoquinolinyl, indolyl, carbazolyl, N-arylcarbazolyl, N-heteroaryl carbazolyl, N-alkyl carbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, thiazolyl, isooxazolyl, oxadiazolyl, thiadiazolyl, benzothiazolyl, phenothiazinyl, dibenzosilolyl, dibenzofuranyl, etc., without limitation.

In the present disclosure, an arylene group may refer to a divalent group having the same structure as the aryl group.

In the present disclosure, the silyl group may include alkyl silyl group and an aryl silyl group. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the boron may include alkyl boron and aryl boron. Examples of the boron may include trimethyl boron, triethyl boron, t-butyl dimethyl boron, triphenyl boron, diphenyl boron, phenyl boron, etc., without limitation.

In the present disclosure, the alkenyl group may be linear or branched hydrocarbon group having at least one carbon-carbon double bond at one or more positions along the hydrocarbon chain. The carbon number of the alkenyl group is not specifically limited, however may be 2 to 30, 2 to 20, or 2 to 10. Examples of the alkenyl group may include vinyl, 1-butenyl, 1-pentenyl, 1,3-butadienyl aryl, styrenyl, etc., without limitation.

In the present disclosure, the carbon number of the amine is not specifically limited, but may be 1 to 30. The amine may include alkyl amine and aryl amine. Examples of the amine may include methylamine, dimethylamine, phenylamine, diphenylamine, naphthylamine, 9-methyl-anthracenylamine, triphenylamine, etc., without limitation.

Hereinafter, the amine compound according to an embodiment of the inventive concept will be explained in more detail. The amine compound according to an embodiment of the inventive concept may be a monoamine compound.

The amine compound according to an embodiment of the inventive concept may be represented by the following Formula 1:

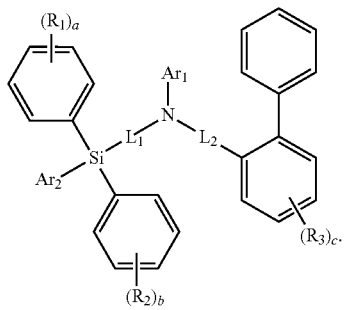

Formula 1

In Formula 1, $Ar_1$ and $Ar_2$ may each independently be a substituted or unsubstituted aryl group having 6 to 30 carbon atoms for forming a ring, or a substituted or unsubstituted heteroaryl group having 2 to 30 carbon atoms for forming a ring. In an embodiment, $Ar_1$ and $Ar_2$ may each independently be a substituted or unsubstituted aryl group having 6 to 15 carbon atoms for forming a ring. $Ar_1$ may be a substituted or unsubstituted phenyl group, or a substituted or unsubstituted biphenyl group. $Ar_2$ may be a substituted or unsubstituted phenyl group, or a substituted or unsubstituted naphthyl group. $Ar_1$ and $Ar_2$ may be the same or different from each other. For example, $Ar_1$ and $Ar_2$ may be the same and may each be a substituted or unsubstituted phenyl group. In an embodiment, $Ar_1$ may be a substituted or unsubstituted biphenyl group, and $Ar_2$ may be a substituted or unsubstituted naphthyl group.

$L_1$ may be a substituted or unsubstituted phenylene group, or a substituted or unsubstituted divalent biphenyl group. For example, $L_1$ may be an unsubstituted phenylene group, or an unsubstituted divalent biphenyl group.

$L_2$ may be a direct linkage, a substituted or unsubstituted arylene group having 6 to 30 carbon atoms for forming a ring, or a substituted or unsubstituted heteroarylene group having 2 to 30 carbon atoms for forming a ring. In an embodiment, $L_2$ may be a direct linkage, or a substituted or unsubstituted arylene group having 6 to 15 carbon atoms for forming a ring. For example, $L_2$ may be a direct linkage, or a substituted or unsubstituted phenylene group.

$R_1$ to $R_3$ may each independently be selected from hydrogen, deuterium, a halogen atom, a substituted or unsubstituted alkyl group having 1 to 20 carbon atoms, a substituted or unsubstituted aryl group having 6 to 30 carbon atoms, and a substituted or unsubstituted heteroaryl group having 2 to 30 carbon atoms for forming a ring. For example, $R_1$ to $R_3$ may each independently be hydrogen, deuterium, a substituted or unsubstituted methyl group, or a substituted or unsubstituted phenyl group.

$R_3$ may be a substituted or unsubstituted phenyl group. In an embodiment, $R_3$ is a substituent bonded to an o-biphenyl group which is connected to an amine group. $R_3$ may be bonded at an ortho, meta or para position with respect to $L_2$ which is connected with an o-biphenyl group. For example, $R_3$ may be bonded at an ortho or para position with respect to $L_2$ in Formula 1.

"a" and "b" are each independently an integer of 0 to 5. When "a" is 0, the amine compound represented by Formula 1 is not substituted with $R_1$. When "b" is 0, the amine compound represented by Formula 1 is not substituted with $R_2$. If "a" is an integer of 2 or more, a plurality of $R_1$ may be the same or different. If "b" is an integer of 2 or more, a plurality of $R_2$ may be the same or different.

"c" is an integer of 0 to 4. When "c" is 0, the amine compound represented by Formula 1 is not substituted with $R_3$. If "c" is an integer of 2 or more, a plurality of $R_3$ may be the same or different.

The amine compound represented by Formula 1 may have a molecular weight of about 600 to about 830. If the molecular weight is greater than about 830, an evaporation temperature may increase, thermal decomposition may be generated, and the life of a device may be affected.

The amine compound represented by Formula 1 may be represented by the following Formula 2:

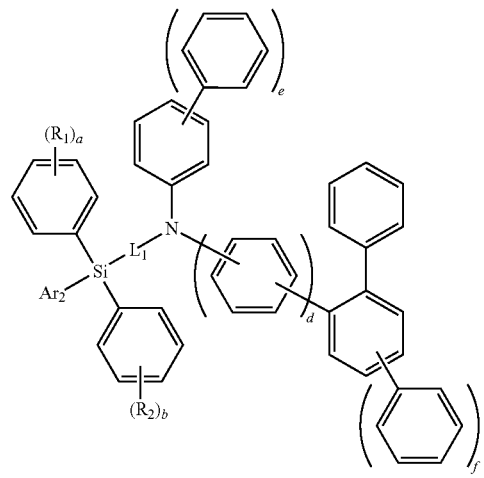

Formula 2

In Formula 2, $L_1$, $R_1$, $R_2$, $Ar_1$, $Ar_2$, "a" and "b" are the same as defined above.

"d" may be 0 or 1. When "d" is 0, $L_2$ in Formula 1 is a direct linkage. When "d" is 1, $L_2$ in Formula 1 is an unsubstituted phenylene group.

"e" may be 0 or 1. When "e" is 0, $Ar_1$ in Formula 1 is an unsubstituted phenyl group. When "e" is 1, $Ar_1$ in Formula 1 is an unsubstituted biphenyl group.

"f" may be an integer of 0 to 2. If "f" is 2 and "d" is 1, "e" may be 0.

The amine compound represented by Formula 1 may be represented by one of the following Formulae 3-1 to 3-7:

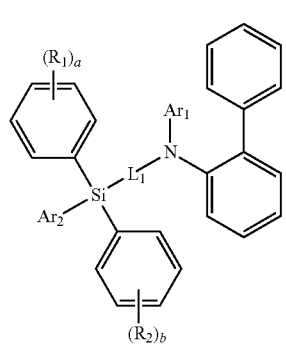

Formula 3-1

Formula 3-2
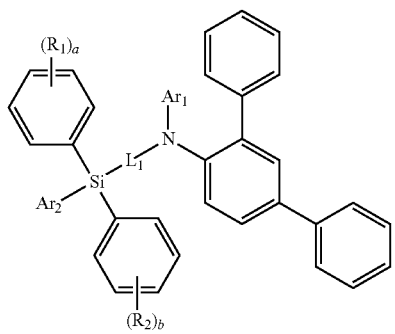
Formula 3-3
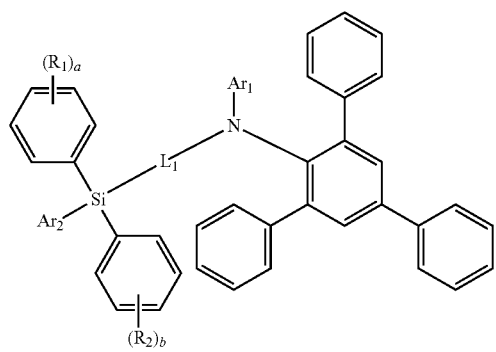
Formula 3-4
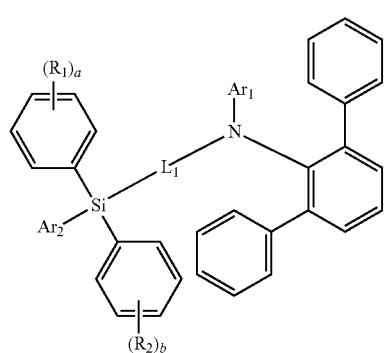
Formula 3-5
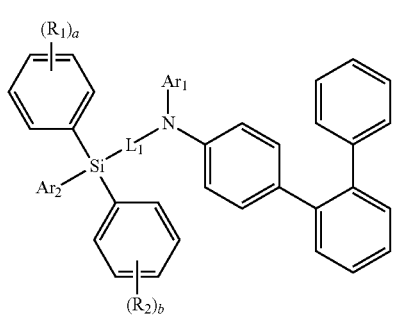
Formula 3-6
Formula 3-7
In Formulae 3-1 to 3-7, $R_1$, $R_2$, $Ar_1$, $Ar_2$, $L_1$, "a" and "b" are the same as defined above.
The amine compound represented by Formula 1 may be represented by one of the following Formulae 4-1 to 4-4:
Formula 4-1
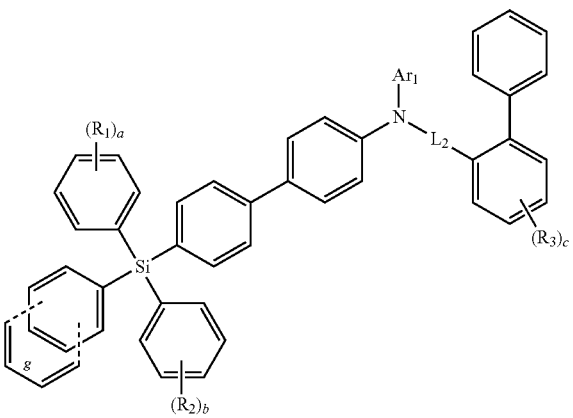

Formula 4-2

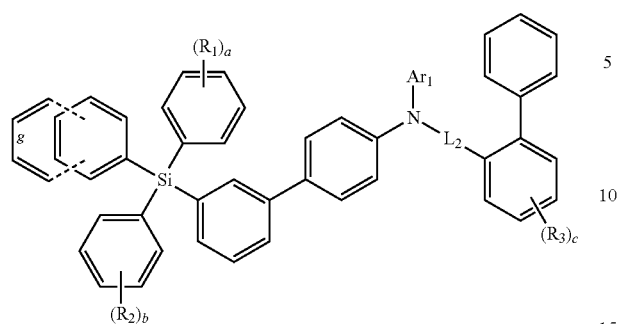

Formula 4-3

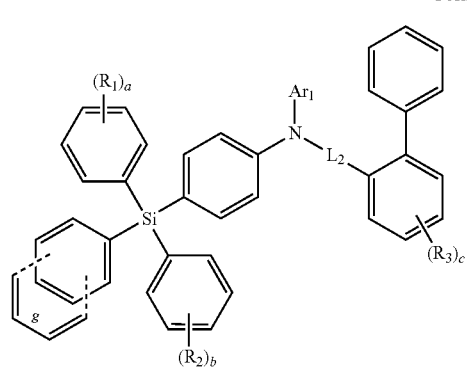

Formula 4-4

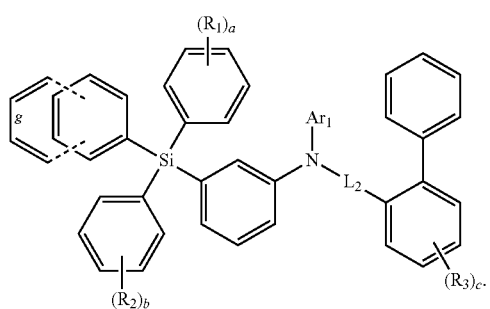

In Formulae 4-1 to 4-4, $R_1$, $R_2$, $R_3$, $Ar_1$, $L_2$, "a", "b" and "c" are the same as defined above.

In Formulae 4-1 to 4-4, "g" may be 0 or 1. When "g" is 0, $Ar_2$ in Formula 1 is an unsubstituted phenyl group. When "g" is 1, $Ar_2$ in Formula 1 is an unsubstituted naphthyl group.

The amine compound represented by Formula 1 may be any one selected from Compounds 1 to 17 represented in Compound Group 1 below. However, an embodiment of the inventive concept is not limited thereto.

Compound Group 1

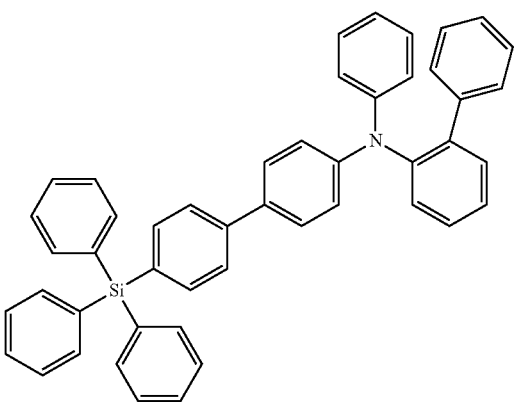

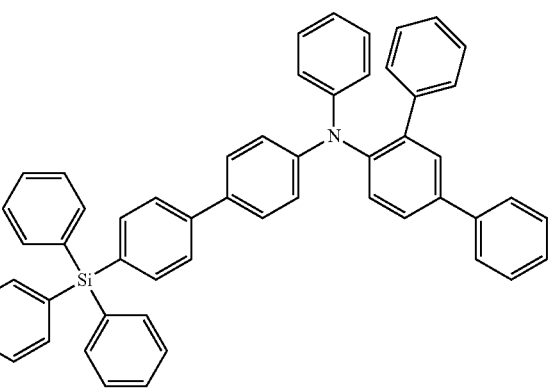

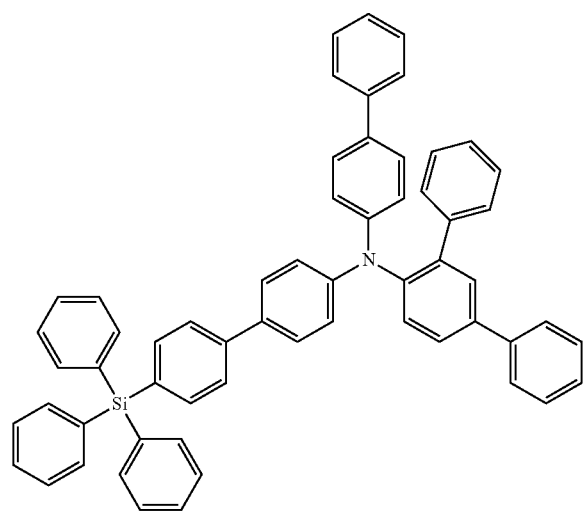
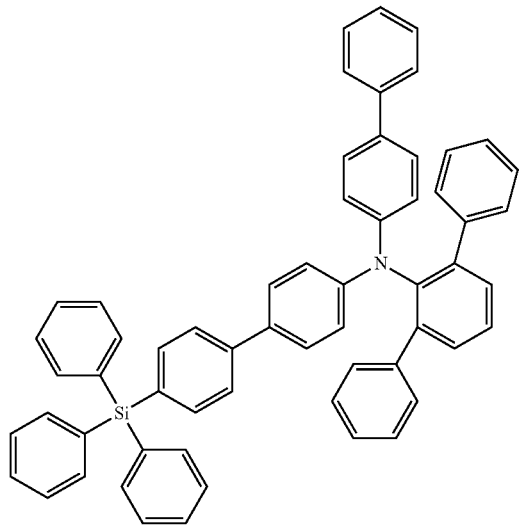

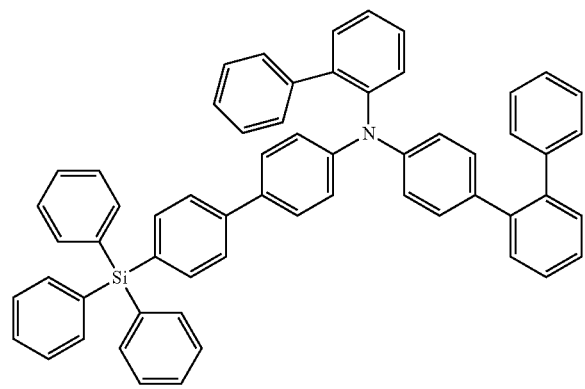
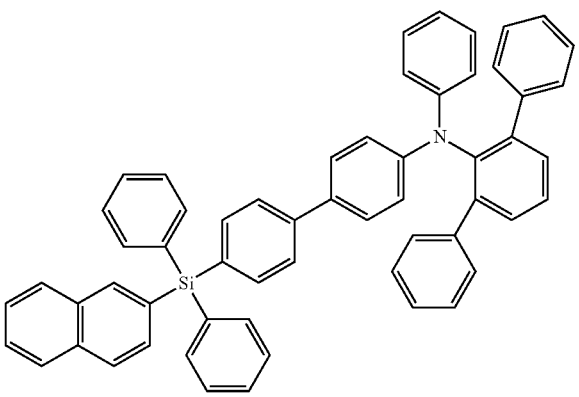
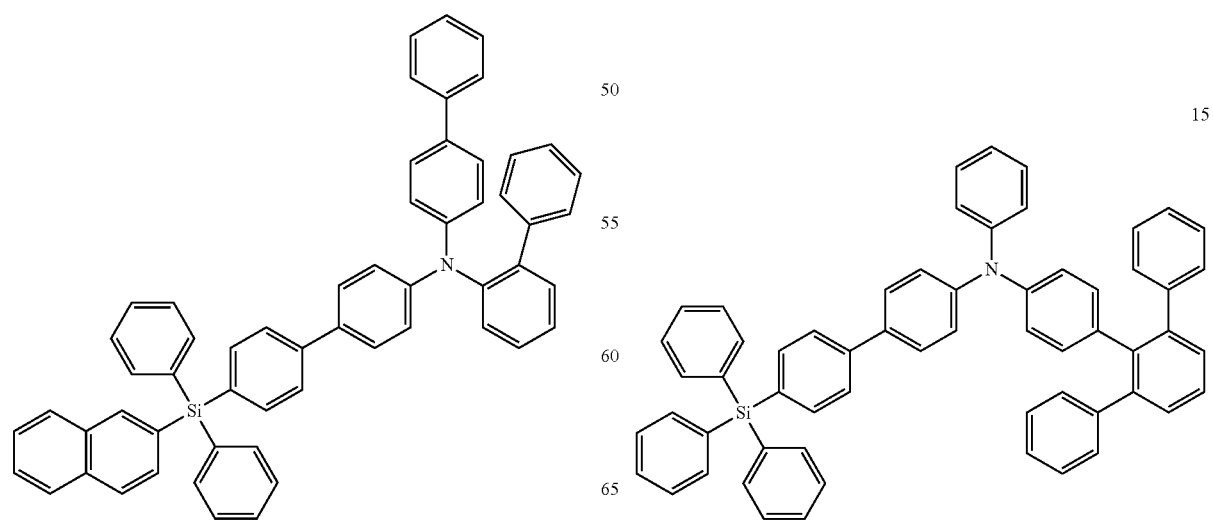

16
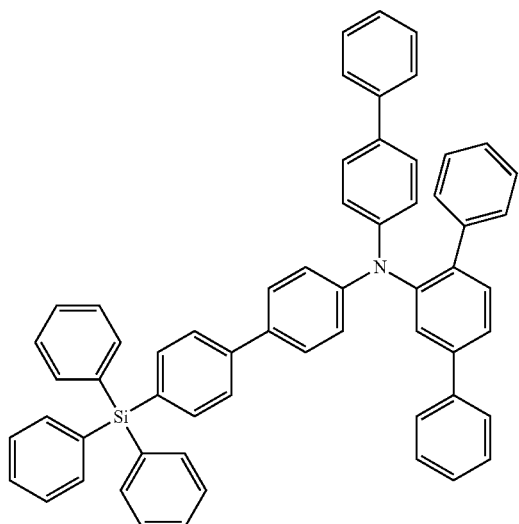
17
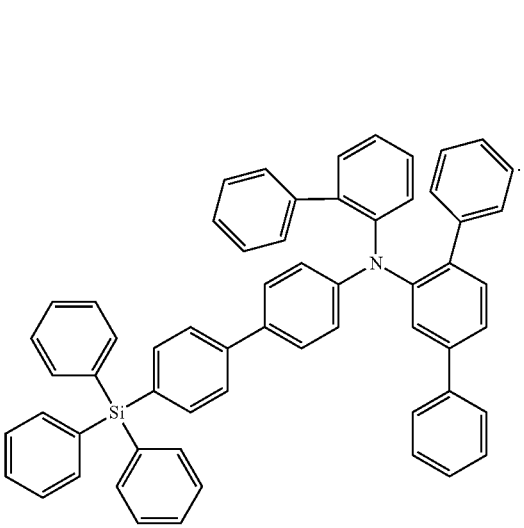
The amine compound represented by Formula 1 may be any one selected from Compounds 18 to 28 represented in Compound Group 2 below. However, an embodiment of the inventive concept is not limited thereto.
Compound Group 2
18
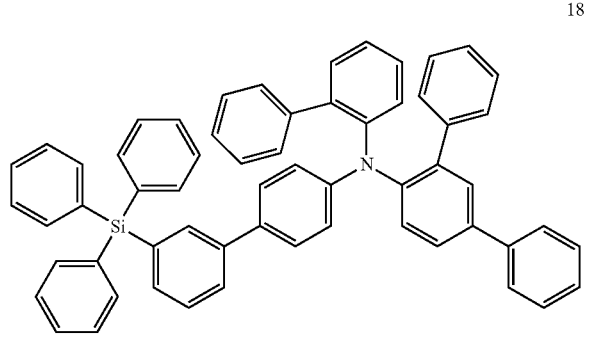
19
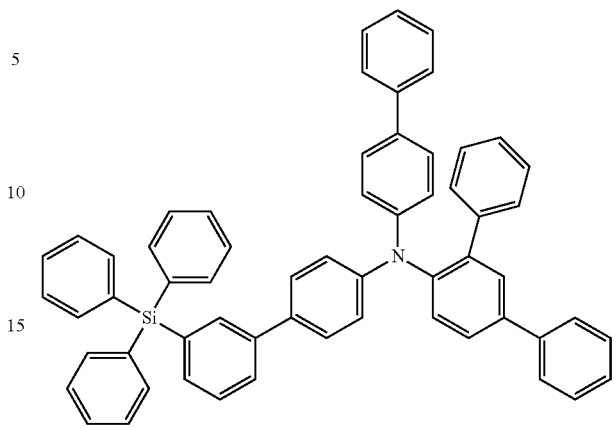
20
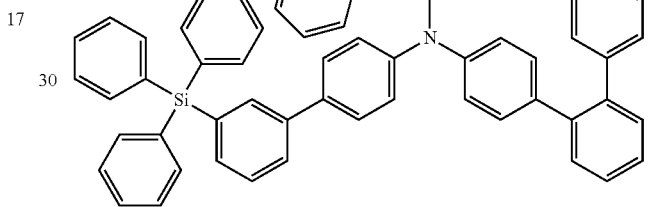
21
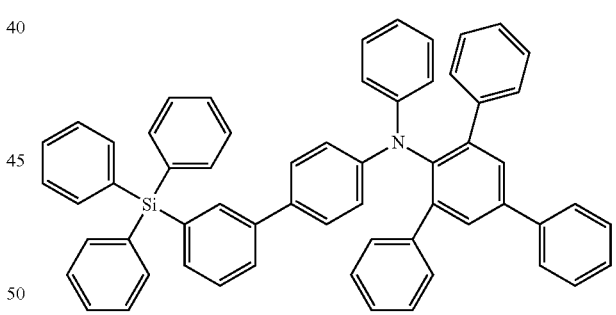
22
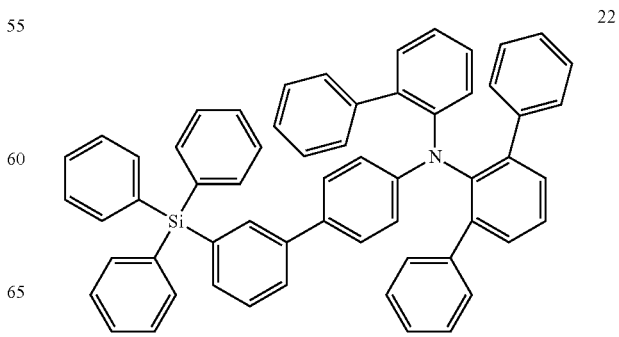

23
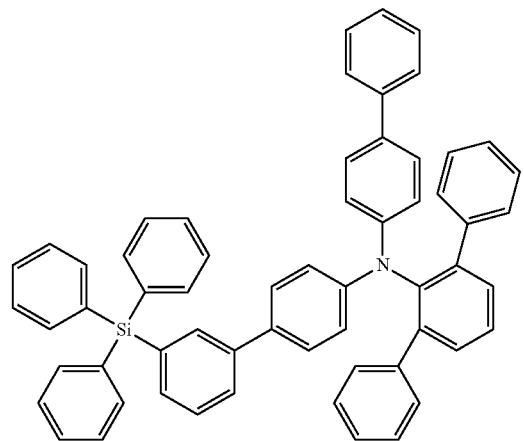
24
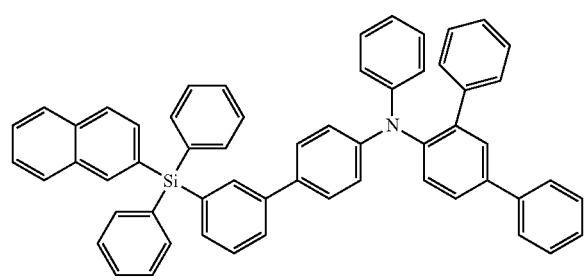
25
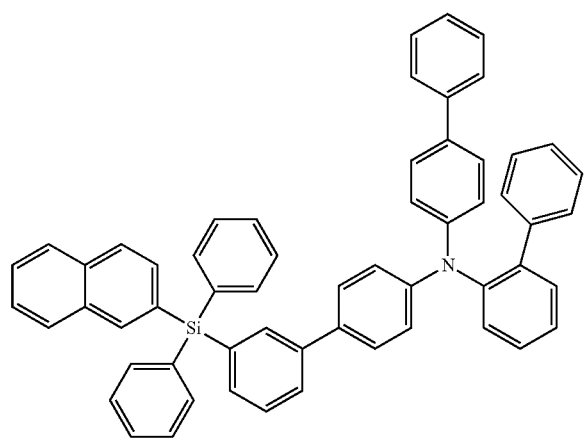
26
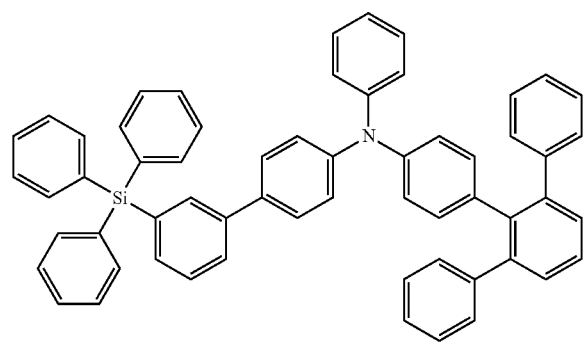
27
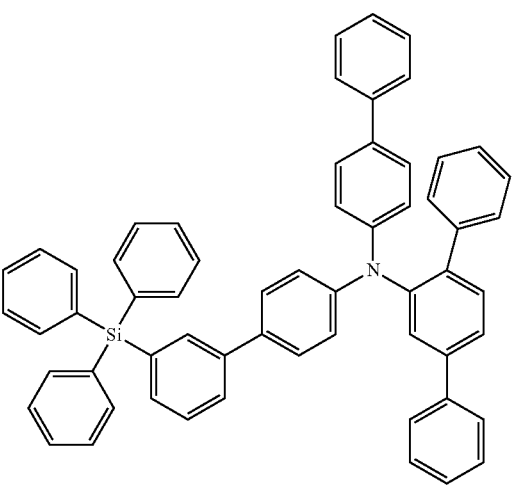
28
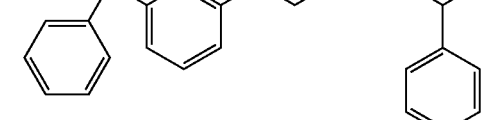
The amine compound represented by Formula 1 may be any one selected from Compounds 29 to 44 represented in Compound Group 3 below. However, an embodiment of the inventive concept is not limited thereto.
Compound Group 3
29
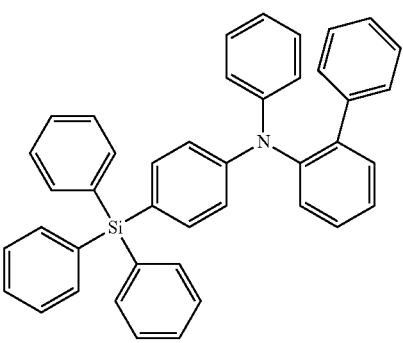

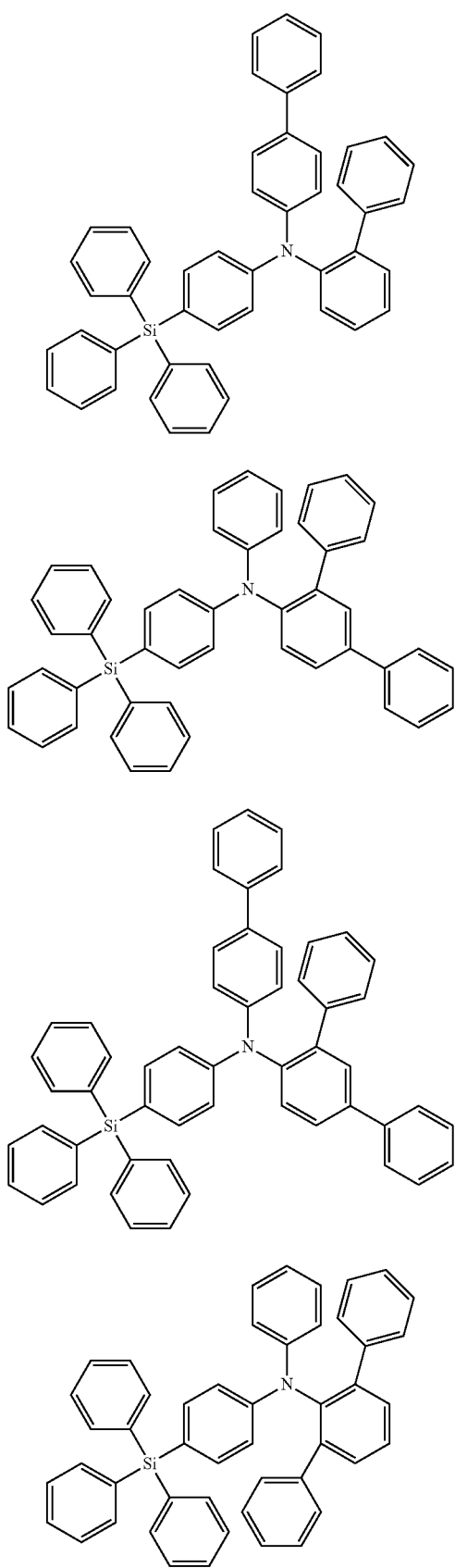
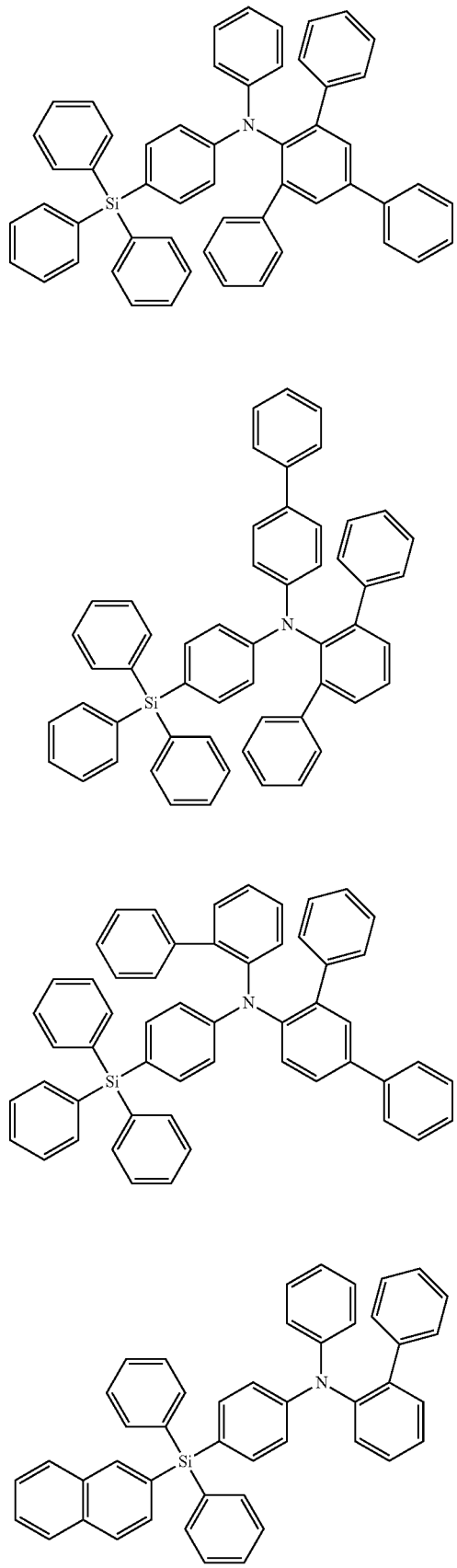

-continued
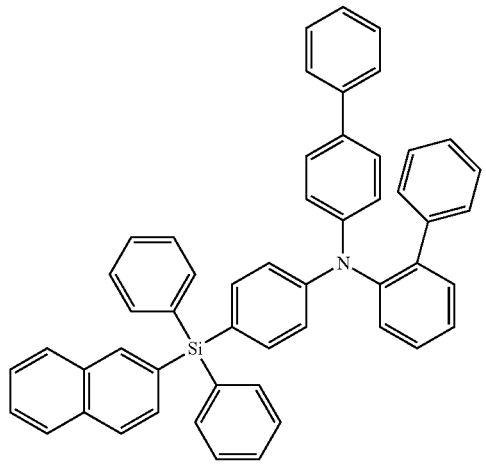
38
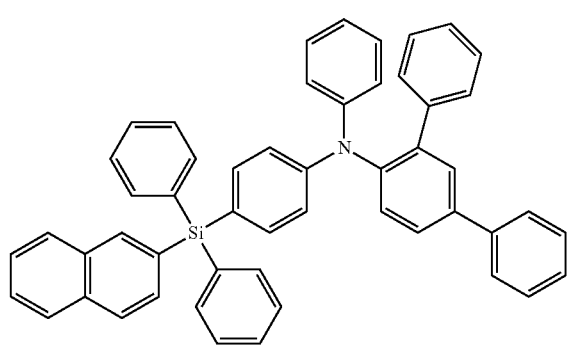
39
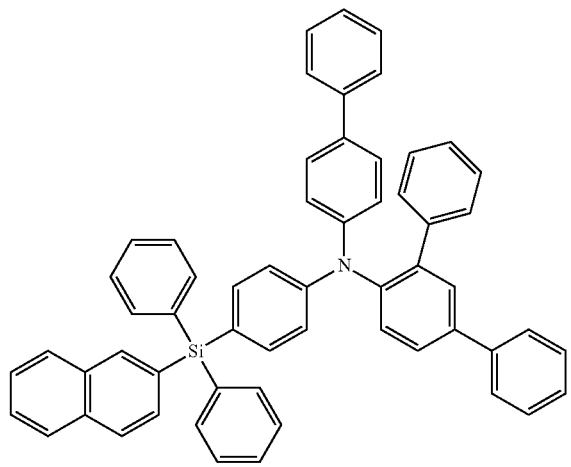
40
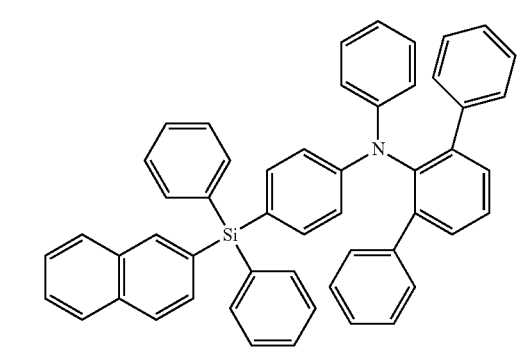
41
-continued
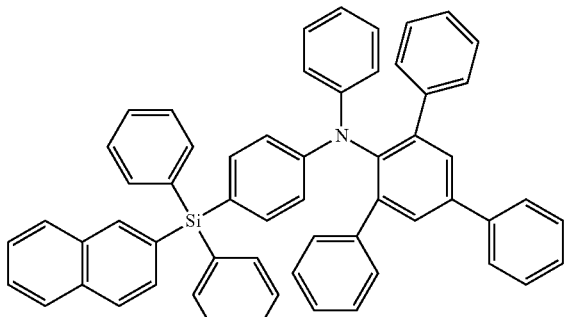
42
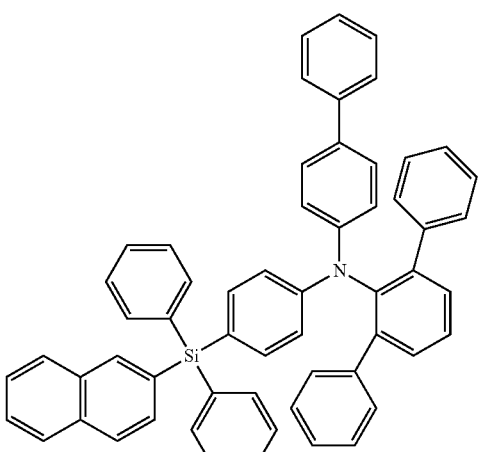
43
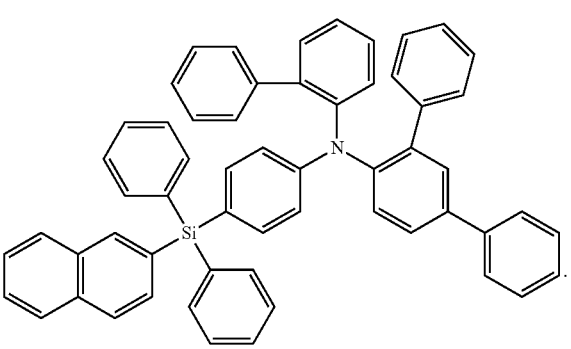
44
The amine compound represented by Formula 1 may be any one selected from Compounds 45 to 60 represented in Compound Group 4 below. However, an embodiment of the inventive concept is not limited thereto.

Compound Group 4
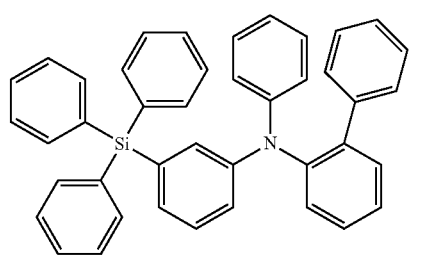
45
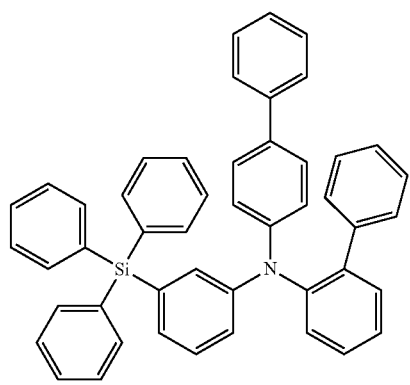
46
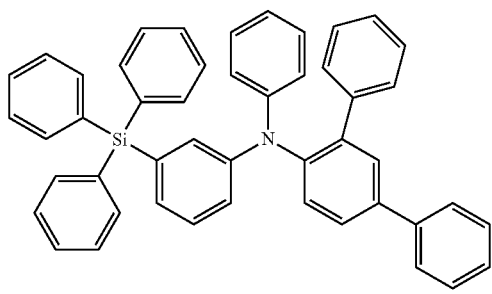
47
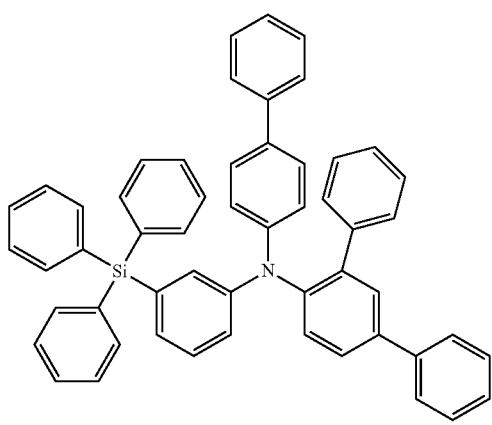
48
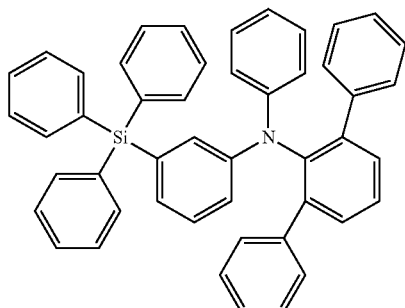
49
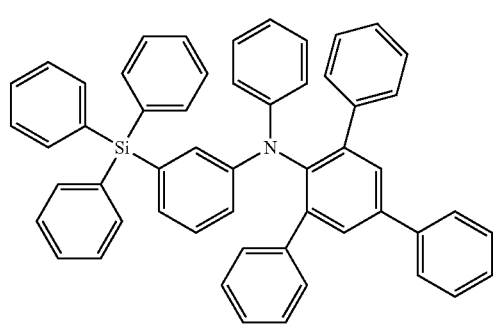
50
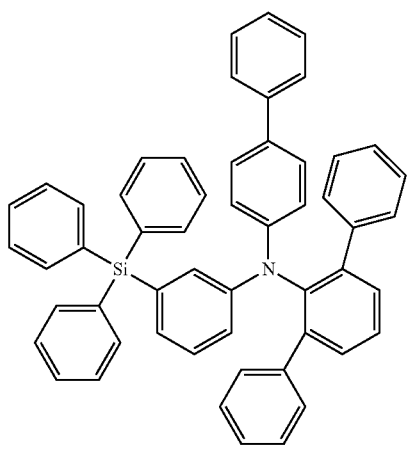
51
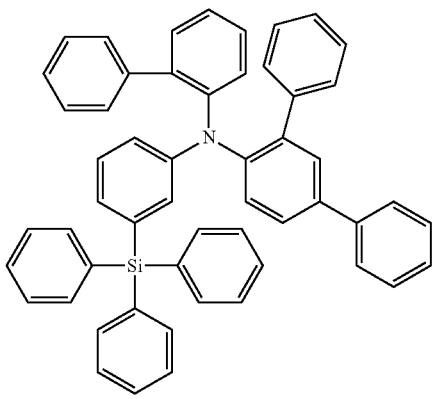
52

53
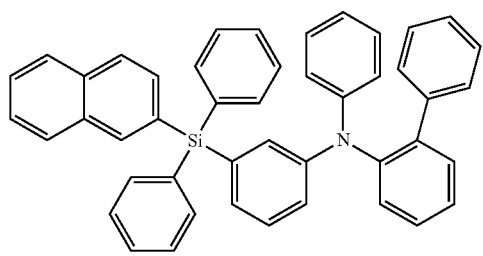
54
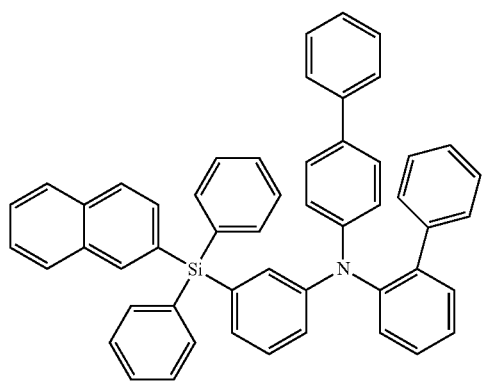
55
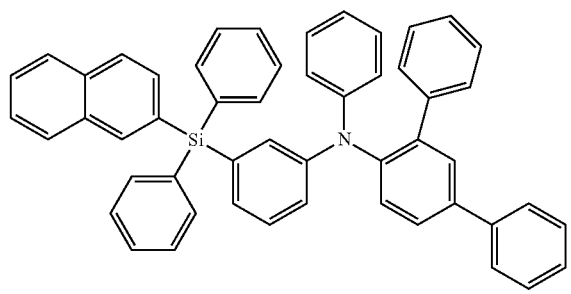
56
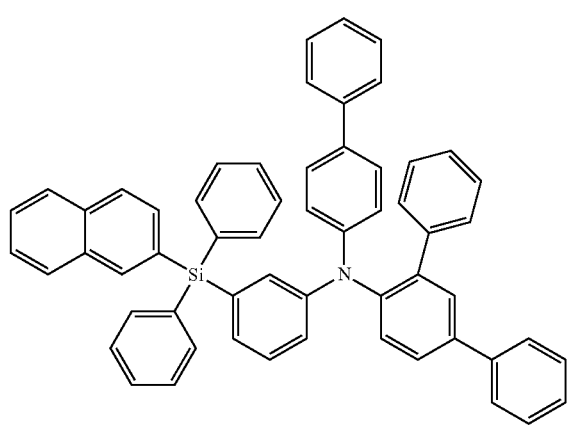
57
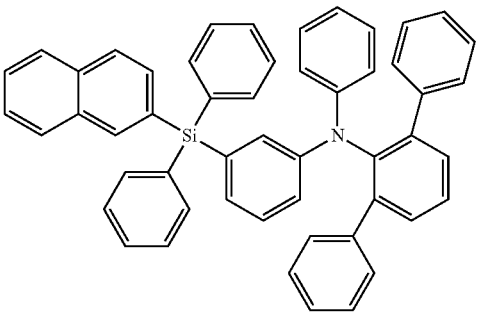
58
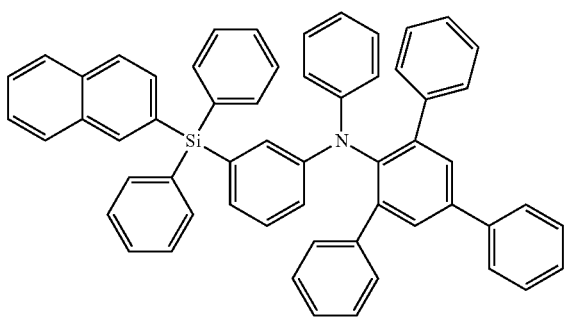
59
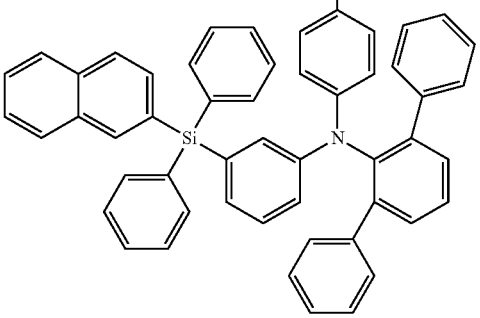
60
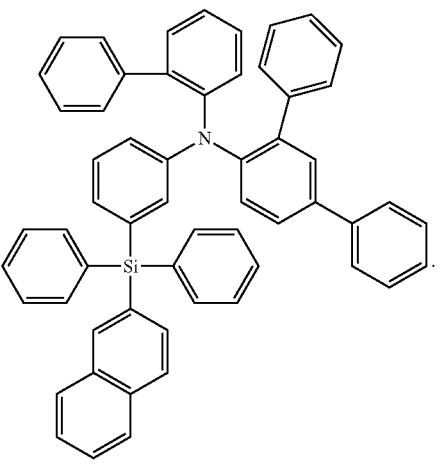
The amine compound according to an embodiment of the inventive concept includes an o-biphenyl group and a triarylsilyl group. When the amine compound represented by Formula 1 is applied in an organic electroluminescence device, high emission efficiency, low driving voltage and long life may be secured. Since the amine compound including the o-biphenyl group and the triarylsilyl group maintains suitable hole transport properties and enhances sublimation properties, the organic electroluminescence device to which the amine compound is applied may attain decreased thermal load and long life. In addition, in the amine compound according to an embodiment of the inventive concept, rigidity of the whole molecule (e.g., the entire molecular structure) is increased and molecular motion is suppressed due to the large volume of the o-biphenyl group. Accordingly, the organic electroluminescence device including the amine compound may have low driving voltage and high efficiency.

Hereinafter, an organic electroluminescence device according to an embodiment of the present disclosure will be explained in more detail. The following explanation will mainly focus on the features other than the above-described amine compound according to an embodiment of the inventive concept, and features that are not explained hereinbelow should be apparent from the above-provided description of the amine compound according to an embodiment of the inventive concept.

An organic electroluminescence device according to an embodiment of the inventive concept includes the amine compound according to an embodiment of the inventive concept.

Figure 2:
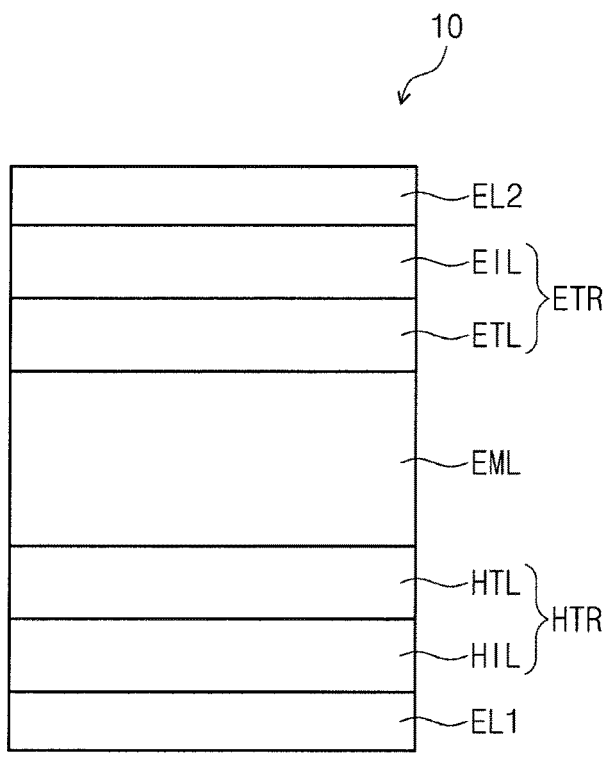
FIG. 2 is a schematic cross-sectional view of an organic electroluminescence device according to an embodiment of the inventive concept.

FIG. 1 is a schematic cross-sectional view illustrating an organic electroluminescence device according to an embodiment of the inventive concept. FIG. 2 is a schematic cross-sectional view illustrating an organic electroluminescence device according to an embodiment of the inventive concept.

Referring to FIGS. 1 and 2, an organic electroluminescence device 10 according to an embodiment of the inventive concept includes a first electrode EL1, a hole transport region HTR, an emission layer EML, an electron transport region ETR, and a second electrode EL2.

The first electrode EL1 has conductivity. The first electrode EL1 may be a pixel electrode or an anode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). Also, the first electrode EL1 may have a structure including a plurality of layers including a reflective layer or transflective layer formed using any of the above materials, and a transparent layer formed using ITO, IZO, ZnO, and/or ITZO.

Hereinafter, a case where the amine compound according to an embodiment of the inventive concept is included in a hole transport region HTR, will be explained. However, an embodiment of the inventive concept is not limited thereto. The amine compound according to an embodiment of the inventive concept may be included in at least one organic layer provided between the first electrode EL1 and the second electrode EL2. For example, the amine compound according to an embodiment of the inventive concept may be included in the emission layer EML.

The organic electroluminescence device according to an embodiment of the inventive concept may include the amine compound according to an embodiment of the inventive concept in a hole transport region HTR. For example, the organic electroluminescence device according to an embodiment of the inventive concept may include an amine compound represented by Formula 1 in a hole transport region HTR:

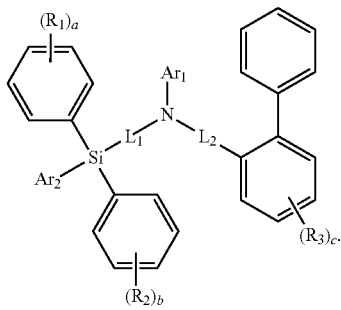

Formula 1

In Formula 1, definitions for $Ar_1$, $Ar_2$, $L_1$, $L_2$, $R_1$ to $R_3$, "a" to "c" are respectively the same as those provided above, and thus will not be provided again.

A more detailed explanation on the amine compound represented by Formula 1 is provided above and thus will not be provided again.

The hole transport region HTR may be disposed (e.g., positioned) on the first electrode EL1. The hole transport region HTR may include at least one of a hole injection layer HIL, a hole transport layer HTL, a hole buffer layer, or an electron blocking layer.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In some embodiments, the hole transport region HTR may have a single layer structure formed using a plurality of different materials, or a laminated structure from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, without limitation.

The hole transport region HTR may be formed using any suitable method selected from a vacuum deposition method, a spin coating method, a cast method, a Langmuir-Blodgett (LB) method, an inkjet printing method, a laser printing method, and a laser induced thermal imaging (LITI) method.

The hole transport region HTR may include the above-described amine compound according to an embodiment of the inventive concept. The hole transport region HTR may include the amine compound according to an embodiment of the inventive concept as a hole transport material.

If the hole transport layer HTL includes the amine compound according to an embodiment of the inventive concept, the hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, etc.

The hole transport layer HTL may further include any suitable material, in addition to the amine compound according to an embodiment of the inventive concept. The hole transport layer HTL may include, for example, carbazole derivatives (such as N-phenyl carbazole and/or polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthyl)-N,N'-diphenylbenzidine (NPB), 4,4'-cyclohexylidene bis[N,N-bis(4-methylphenyl)benzenamine] (TAPC), 4,4'-bis[N,N'-(3-tolypamino]-3,3'-dimethylbiphenyl (HMTPD), etc.

The thickness of the hole transport region HTR may be from about 150 Å to about 10,000 Å, for example, from about 150 Å to about 1,500 Å. If the hole transport region HTR includes both the hole injection layer HIL and the hole transport layer HTL, the thickness of the hole injection layer HIL may be from about 100 Å to about 1,000 Å, and the thickness of the hole transport layer HTL may be from about 30 Å to about 1,000 Å. If the thicknesses of the hole transport region HTR, the hole injection layer HIL, and the hole transport layer HTL satisfy any of the above-described ranges, satisfactory (or suitable) hole transport properties may be obtained without the substantial increase of a driving voltage.

The hole transport region HTR may further include a charge generating material, in addition to the above-described materials, to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds, without limitation. Non-limiting examples of the p-dopant may include quinone derivatives (such as tetracyanoquinodimethane (TCNQ) and/or 2,3,5,6-tetrafluoro-tetracyanoquinodimethane (F4-TCNQ)), and metal oxides (such as tungsten oxide and/or molybdenum oxide), without limitation.

As described above, the hole transport region HTR may further include at least one of a hole buffer layer or an electron blocking layer, in addition to the hole injection layer HIL and the hole transport layer HTL. The hole buffer layer may compensate an optical resonance distance according to the wavelength of light emitted from the emission layer EML and increase light emission efficiency. Any of the materials included in the hole transport region HTR may be used as materials included in the hole buffer layer. The electron blocking layer may function to prevent or reduce the electron injection from the electron transport region ETR into the hole transport region HTR.

The emission layer EML may be disposed on the hole transport region HTR. The thickness of the emission layer EML may be, for example, from about 100 Å to about 300 Å. The emission layer EML may have a single layer formed using a single material, a single layer formed using a plurality of different materials, or a multilayer structure having a plurality of layers formed using a plurality of different materials.

The emission layer EML may emit one of red light, green light, blue light, white light, yellow light, or cyan light. The emission layer EML may include a fluorescent material or a phosphorescent material. In an embodiment, the emission layer EML may include a host and a dopant. The emission layer EML may have a thickness of, for example, about 100 Å to about 600 Å.

The host material of the emission layer EML may be selected from anthracene derivatives, fluoranthene derivatives, pyrene derivatives, arylacetylene derivatives, fluorene derivatives, perylene derivatives, chrysene derivatives, phenanthrene derivatives, and the like, for example, from pyrene derivatives, perylene derivatives, chrysene derivatives, phenanthrene derivatives, and anthracene derivatives. For example, as the host material of the emission layer EML, anthracene derivative represented by Formula 5 below may be used:

Formula 5

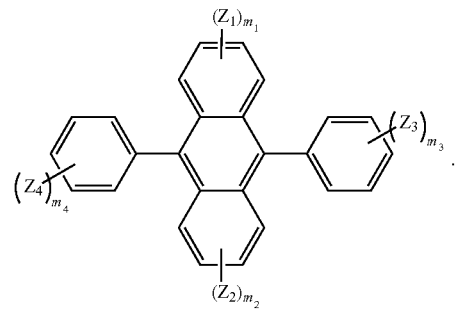

In Formula 5, $Z_1$ to $Z_4$ may each independently be selected from hydrogen, deuterium, a halogen atom, a substituted or unsubstituted silyl group, a substituted or unsubstituted alkyl group having 1 to 15 carbon atoms, a substituted or unsubstituted aryl group having 6 to 30 carbon atoms for forming a ring, and a substituted or unsubstituted heteroaryl group having 2 to 30 carbon atoms for forming a ring; $m_1$ and $m_2$ may each independently be an integer of 0 to 4; $m_3$ and $m_4$ may each independently be an integer of 0 to 5. In Formula 5, $Z_3$ and $Z_4$ may each independently be combined with an adjacent group (e.g., with an adjacent $Z_3$ and $Z_4$, respectively) to form a ring.

The compound represented by Formula 5 may include any of Compounds a-1 to a-12 represented by the following structures. However, examples of the compound represented by Formula 5 are not limited thereto.

a-1

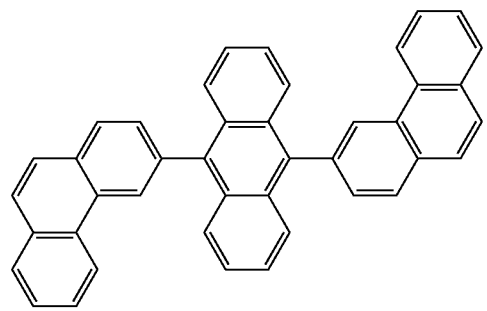

-continued
a-2
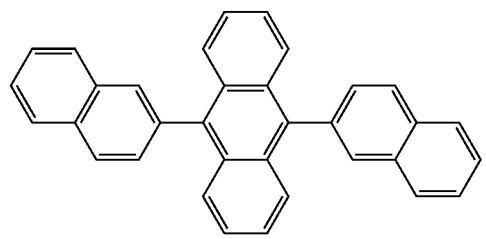
a-3
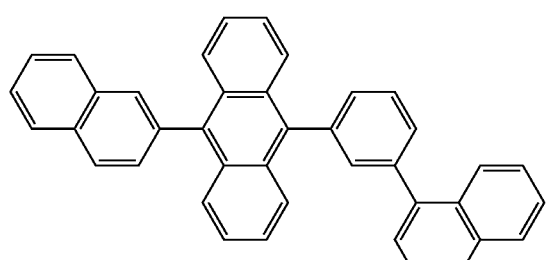
a-4
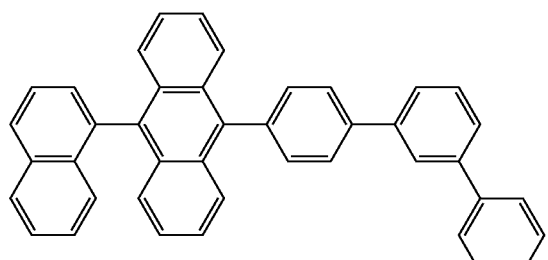
a-5
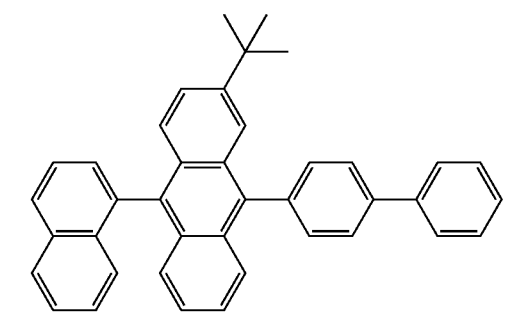
a-6
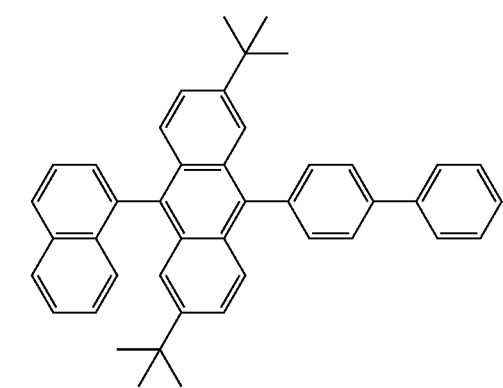
-continued
a-7
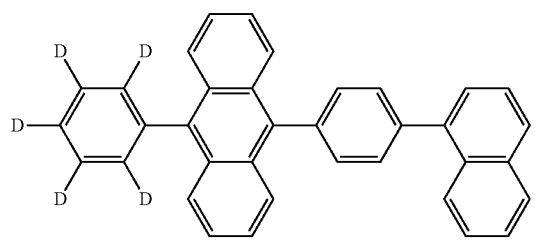
a-8
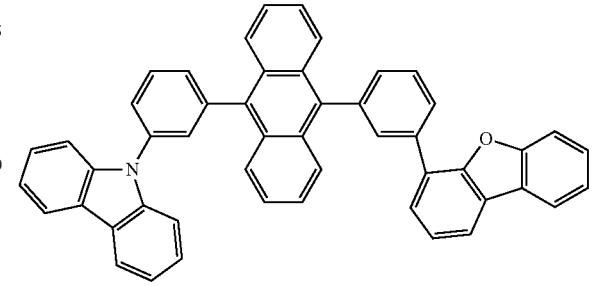
a-9
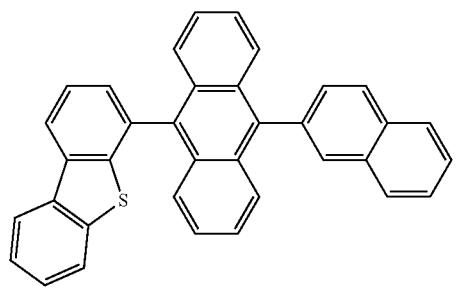
a-10
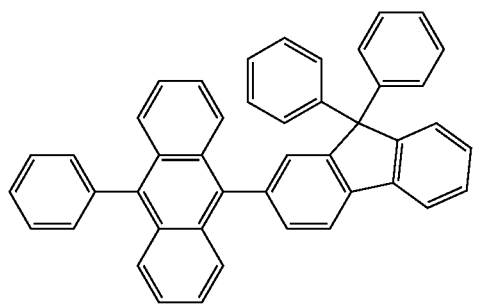
a-11
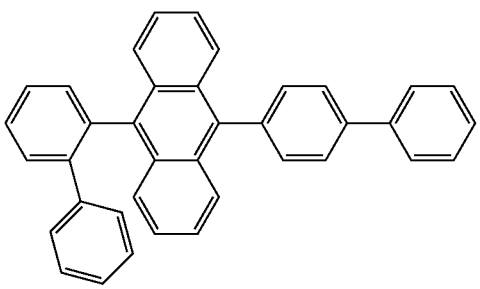

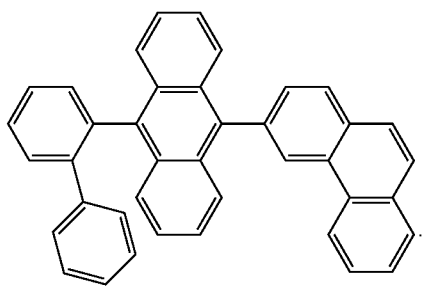

a-12

In some embodiments, the host may be any suitable material without specific limitation, and may include, for example, tris(8-hydroxyquinolino)aluminum ($Alq_3$), 4,4'-bis (N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethylbiphenyl (CDBP), 2-methyl-9,10-bis(naphthalen-2-yl) anthracene (MADN), etc.

The dopant may include, for example, styryl derivatives (e.g., 1,4-bis[2-(3-N-ethylcarbazolyl)vinyl]benzene (BC-zVB), 4-(di-p-tolylamino)-4'-[(di-p-tolylamino)styryl]stilbene (DPAVB), N-(4-((E)-2-(6-((E)-4-(diphenylamino) styryl)naphthalen-2-yl)vinyl)phenyl)-N-phenylbenzenamine (N-BDAVBi)), perylene and the derivatives thereof (e.g., 2,5,8,11-tetra-tert-butylperylene (TBP)), pyrene and the derivatives thereof (e.g., 1,1-dipyrene, 1,4-dipyrenylbenzene, 1,4-bis(N,N-diphenylamino)pyrene), etc.

When the emission layer EML emits red light, the emission layer EML may further include, for example, tris (dibenzoylmethanato)phenanthroline europium (PBD:Eu $(DBM)_3$(Phen)), or a fluorescent material including perylene. When the emission layer EML emits red light, the dopant included in the emission layer EML may be selected from a metal complex or an organometallic complex (such as bis(1-phenylisoquinoline)acetylacetonate iridium (PIQIr (acac)), bis(1-phenylquinoline)acetylacetonate iridium (PQIr(acac), tris(1-phenylquinoline)iridium (PQIr), and/or octaethylporphyrin platinum (PtOEP)), rubrene and the derivatives thereof, and 4-dicyanomethylene-2-(p-dimethylaminostyryl)-6-methyl-4H-pyran (DCM) and the derivatives thereof.

When the emission layer EML emits green light, the emission layer EML may further include a fluorescent material including, for example, tris(8-hydroxyquinolino) aluminum ($Alq_3$). When the emission layer EML emits green light, the dopant included in the emission layer EML may be selected from a metal complex or an organometallic complex (such as fac-tris(2-phenylpyridine)iridium (Ir(ppy) 3)), coumarin, or the derivatives thereof.

When the emission layer EML emits blue light, the emission layer EML may further include a fluorescent material including, for example, at least one selected from spiro-DPVBi, spiro-6P, distyryl-benzene (DSB), distyryl-arylene (DSA), a polyfluorene (PFO)-based polymer, and a poly(p-phenylene vinylene) (PPV)-based polymer. When the emission layer EML emits blue light, the dopant included in the emission layer EML may be selected from, for example, a metal complex or an organometallic complex (such as $(4,6-F_2ppy)_2Irpic$), and perylene and the derivatives thereof.

The electron transport region ETR may be provided on the emission layer EML. The electron transport region ETR may include at least one of an electron blocking layer, an electron transport layer ETL or an electron injection layer EIL, without limitation.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of the electron injection layer EIL or the electron transport layer ETL, or a single layer structure formed using an electron injection material and an electron transport material. In addition, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation.

The electron transport region ETR may be formed using any suitable method selected from a vacuum deposition method, a spin coating method, a cast method, a Langmuir-Blodgett (LB) method, an inkjet printing method, a laser printing method, and a laser induced thermal imaging (LITI) method.

If the electron transport region ETR includes the electron transport layer ETL, the electron transport region ETR may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato)aluminum (BAlq), berylliumbis(benzoquinolin-10-olate ($Bebq_2$), 9,10-di(naphthalene-2-yl) anthracene (ADN), or a mixture thereof, without limitation. The thickness of the electron transport layer ETL may be from about 100 Å to about 1,000 Å, and may be from about 150 Å to about 500 Å. If the thickness of the electron transport layer ETL satisfies the above-described range, satisfactory (or suitable) electron transport properties may be obtained without substantial increase of a driving voltage.

When the electron transport region ETR includes the electron injection layer EIL, the electron injection layer EIL may include a metal selected from Al, Ag, Li, Mg and Ca, and mixtures thereof. However, an embodiment of the inventive concept is not limited thereto. For example, the electron injection layer EIL may include LiF, lithium quinolate (Liq), $Li_2O$, BaO, NaCl, CsF, a lanthanide metal such as Yb, or a metal halide such as RbCl and/or RbI, without limitation. The electron injection layer EIL also may be formed using a mixture material of an electron transport material and an insulating organo-metallic salt. The organometallic salt may be a material having an energy band gap of about 4 eV or more. The organo-metallic salt may include, for example, a metal acetate, a metal benzoate, a metal acetoacetate, a metal acetylacetonate, and/or a metal stearate. The thickness of the electron injection layer EIL may be from about 1 Å to about 100 Å, for example, from about 3 Å to about 90 Å. If the thickness of the electron injection layer EIL satisfies the above described range, satisfactory (or suitable) electron injection properties may be obtained without inducing the substantial increase of a driving voltage.

The electron transport region ETR may include a hole blocking layer as described above. The hole blocking layer may include, for example, at least one of 2,9-dimethyl-4,7-diphenyl-1,10-phenanthroline (BCP), or 4,7-diphenyl-1,10-phenanthroline (Bphen), without limitation.

The second electrode EL2 may be disposed on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may be formed using transparent metal oxides, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Cr, Li, Ca, LiF/Ca, LiF/Al, Mo, Ti, a compound thereof, or a mixture thereof (e.g., a mixture of Ag and Mg). The second electrode EL2 may have a multilayered structure including a reflective layer or a transflective layer formed using any of the above-described materials and a transparent conductive layer formed using ITO, IZO, ZnO, and/or ITZO, etc.

In an embodiment, the second electrode EL2 may be connected (or coupled) with an auxiliary electrode. If the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are then recombined in the emission layer EML to generate excitons, and light may be emitted via the transition of the excitons from an excited state to a ground state.

If the organic electroluminescence device 10 is a top emission organic electroluminescence device, the first electrode EL1 may be a reflective electrode, and the second electrode EL2 may be a transmissive electrode or a transflective electrode. If the organic electroluminescence device 10 is a bottom emission organic electroluminescence device, the first electrode EL1 may be a transmissive electrode or a transflective electrode, and the second electrode EL2 may be a reflective electrode.

The organic electroluminescence device according to an embodiment of the inventive concept includes the amine compound represented by Formula 1, thereby securing high emission efficiency, low driving voltage and long life. The amine compound according to an embodiment of the inventive concept may be disposed (e.g., included) in the hole transport region HTR of the organic electroluminescence device, thereby attaining high hole transport properties and decreased thermal load, and securing low driving voltage, high emission efficiency and long life. In one or more embodiments, the amine compound represented by Formula 1 includes an o-biphenyl group and a triarylsilyl group, and thus, hole transport properties may be maintained and sublimation properties may be enhanced. Accordingly, an organic electroluminescence device including the amine compound may attain decreased thermal load and long life.

In addition, since the rigidity of a whole molecule (e.g., of the entire molecular structure) is increased, and molecular motion is suppressed (or reduced) due to the large volume of the o-biphenyl group, hole transport properties may be improved, and the organic electroluminescence device including the amine compound may secure low driving voltage and high efficiency.

Hereinafter, the inventive concept of the present disclosure will be explained in more detail with reference to embodiments and comparative embodiments. However, the following embodiments are illustrated only for assisting the understanding of the inventive concept, and the scope of the inventive concept is not limited thereto.

The amine compounds according to example embodiments of the present disclosure may be synthesized, for example, as follows. However, embodiments of the inventive concept are not limited to the synthesis methods described herein.

Synthesis Examples

1. Synthesis of Compound 4
(Synthesis of Intermediate A)

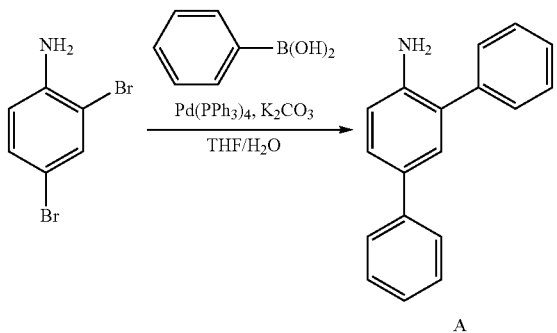

Under an argon (Ar) atmosphere, 4.50 g of 2,4-dibromobenzenamine, 5.10 g of phenylboronic acid, 15.1 g of K$_2$CO$_3$, and a mixture solution of THF/water (20%) in which 1.03 g of Pd(PPh$_3$)$_4$ was dissolved, were heated and stirred at about 70° C. for about 5 hours in a 200 ml, three-neck flask. After air cooling the obtained mixture, dichloromethane was added thereto, an organic layer was separately taken therefrom, and solvents were evaporated. The crude product thus obtained was separated by silica gel column chromatography (solvent: hexane/AcOEt) to obtain 3.56 g (yield 81%) of Intermediate A as a pale yellow solid. The molecular weight of Intermediate A measured by Fast Atom Bombardment-Mass Spectrometry (FAB-MS) was 245.

(Synthesis of Intermediate B)

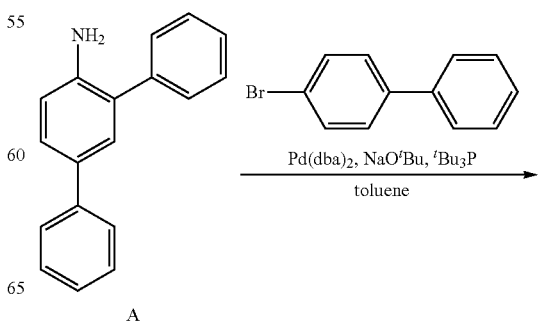

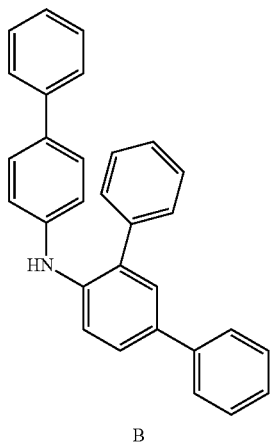

B

Under an argon (Ar) atmosphere, 3.00 g of Intermediate A, 1.47 g of 4-bromobiphenyl, 0.130 g of Pd(dba)$_2$, 0.90 g of NaO$^t$Bu, and 0.11 g of $^t$Bu$_3$P were added to a 200 ml, three-neck flask, and then heated and refluxed while stirring in 45 ml of a toluene solvent for about 3 hours. After air cooling the obtained mixture, water was added thereto, an organic layer was separately taken therefrom, and solvents were evaporated. The crude product thus obtained was separated by silica gel column chromatography (solvent: hexane/toluene) to obtain 3.38 g (yield 91%) of Intermediate B as a white solid. The molecular weight of Intermediate B measured by FAB-MS was 398.

(Synthesis of Compound 4)

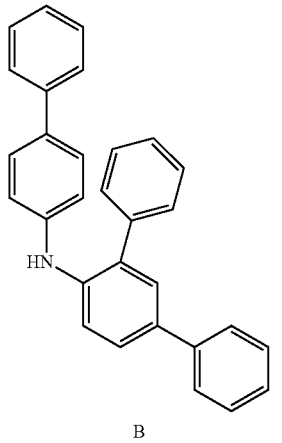

B

+

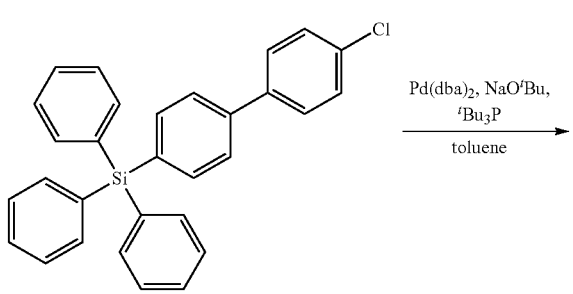

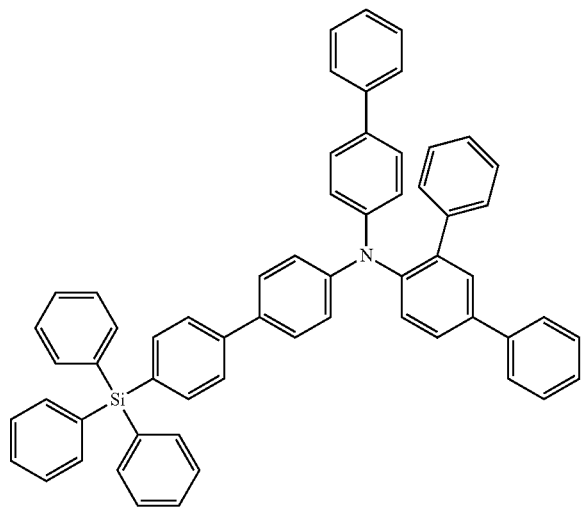

4

Under an argon (Ar) atmosphere, 4.20 g of Intermediate B, 5.20 g of 4'-chloro-[1,1'-biphenyl]-4-yl)triphenylsilane, 0.240 g of Pd(dba)$_2$, 2.51 g of NaO$^t$Bu, and 0.25 g of $^t$Bu$_3$P were added to a 200 ml, three-neck flask, and then heated and refluxed while stirring in 70 ml of a mixture solvent of toluene for about 6 hours. After air cooling the obtained mixture, water was added thereto, an organic layer was separately taken therefrom, and solvents were evaporated. The crude product thus obtained was separated by silica gel column chromatography (solvent: hexane/toluene) to obtain 7.26 g (yield 85%) of Compound 4 as a white solid. The molecular weight of the resulting compound measured by FAB-MS was 808. In addition, the chemical shift values of the compound measured by $^1$H-NMR were 8.45 (dd, 4H), 8.41 (d, 1H), 8.25 (dd, 4H), 8.10 (d, 2H), 8.02-7.89 (m, 8H), 7.69-7.62 (m, 8H), 7.48-7.43 (m, 3H), 7.41-7.25 (m, 10H), 7.18-7.02 (m, 5H). From these results, the obtained white solid compound was identified as Compound 4.

2. Synthesis of Compound 2

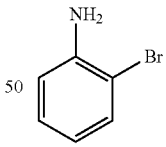 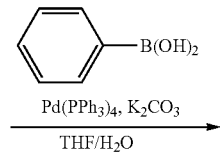

Pd(PPh$_3$)$_4$, K$_2$CO$_3$
THF/H$_2$O

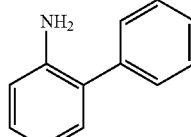

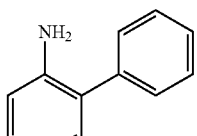 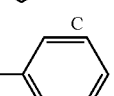

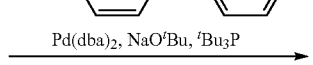

Pd(dba)$_2$, NaO$^t$Bu, $^t$Bu$_3$P
toluene

C

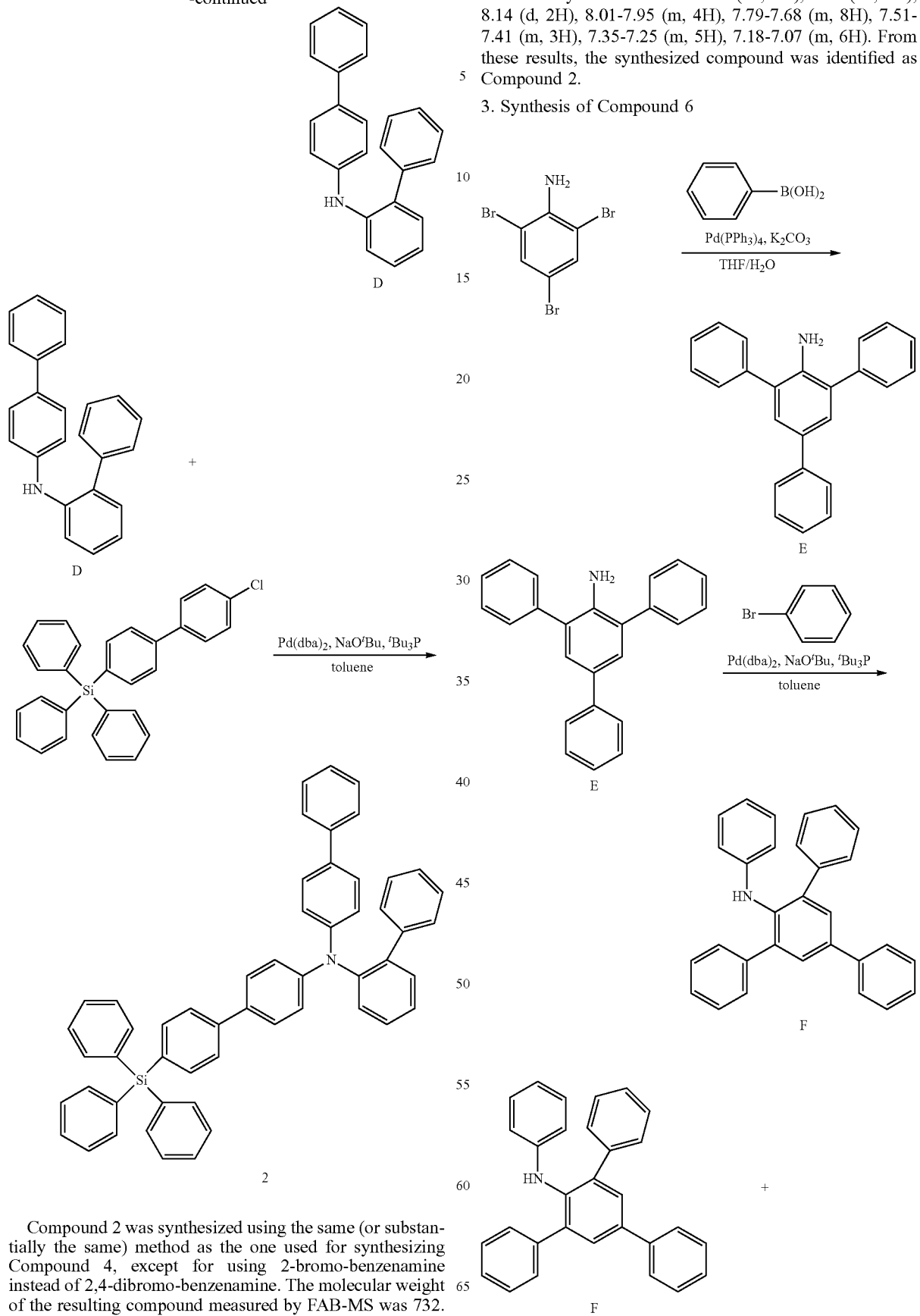

measured by $^1$H-NMR were 8.35 (dd, 4H), 8.20 (dd, 4H), 8.14 (d, 2H), 8.01-7.95 (m, 4H), 7.79-7.68 (m, 8H), 7.51-7.41 (m, 3H), 7.35-7.25 (m, 5H), 7.18-7.07 (m, 6H). From these results, the synthesized compound was identified as Compound 2.

3. Synthesis of Compound 6

Compound 2 was synthesized using the same (or substantially the same) method as the one used for synthesizing Compound 4, except for using 2-bromo-benzenamine instead of 2,4-dibromo-benzenamine. The molecular weight of the resulting compound measured by FAB-MS was 732. In addition, the chemical shift values of the compound

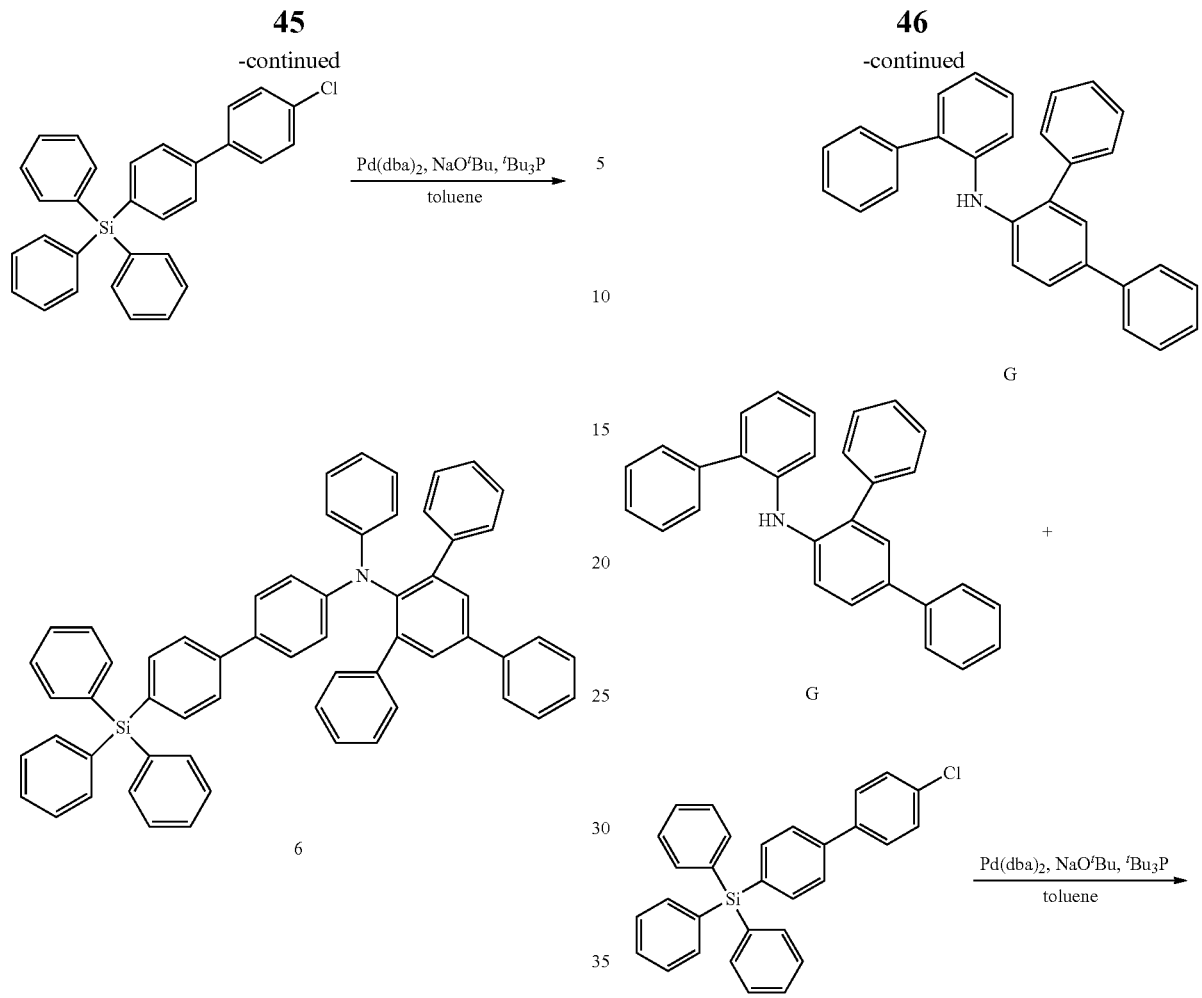

Compound 6 was synthesized by using the same (or substantially the same) method as the one used for synthesizing Compound 4, except for using 2,4,6-tribromo-benzenamine instead of 2,4-dibromo-benzenamine, and using bromobenzene instead of 4-bromobiphenyl. The molecular weight of the resulting compound measured by FAB-MS was 808. In addition, the chemical shift values of the compound measured by $^1$H-NMR were 8.33 (dd, 4H), 8.30 (d, 2H), 8.15 (dd, 4H), 8.10 (d, 2H), 8.04-7.77 (m, 8H), 7.71-7.65 (m, 7H), 7.51-7.49 (m, 3H), 7.41-7.30 (m, 10H), 7.20-7.10 (m, 5H). From these results, the synthesized compound was identified as Compound 6.

4. Synthesis of Compound 8

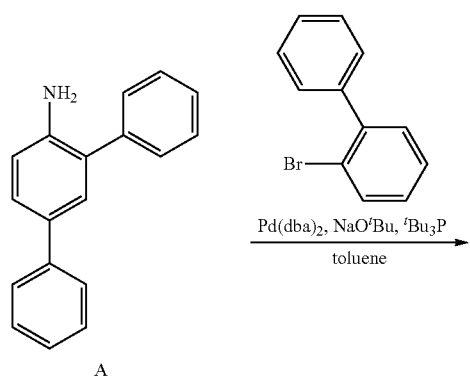

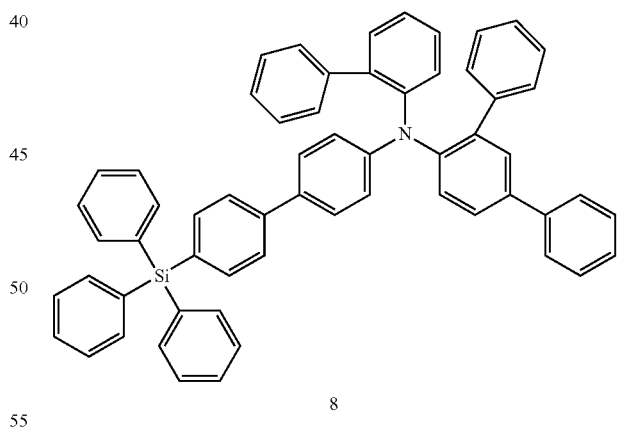

Compound 8 was synthesized by using the same (or substantially the same) method as the one used for synthesizing Compound 4, except for using 2-bromobiphenyl instead of 4-bromobiphenyl. The molecular weight of the resulting compound measured by FAB-MS was 808. In addition, the chemical shift values of the compound measured by $^1$H-NMR were 8.45 (dd, 4H), 8.41 (d, 1H), 8.25 (dd, 4H), 8.11 (d, 2H), 8.02-7.89 (m, 8H), 7.69-7.62 (m, 8H), 7.52-7.48 (m, 3H), 7.41-7.25 (m, 10H), 7.20-7.10 (m, 5H). From these results, the synthesized compound was identified as Compound 8.

Device Manufacturing Examples

Organic electroluminescence devices according to Examples 1 to 4 were manufactured using Compounds 2, 4, 6 and 8 as the hole transport layer materials.

Example Compounds

2

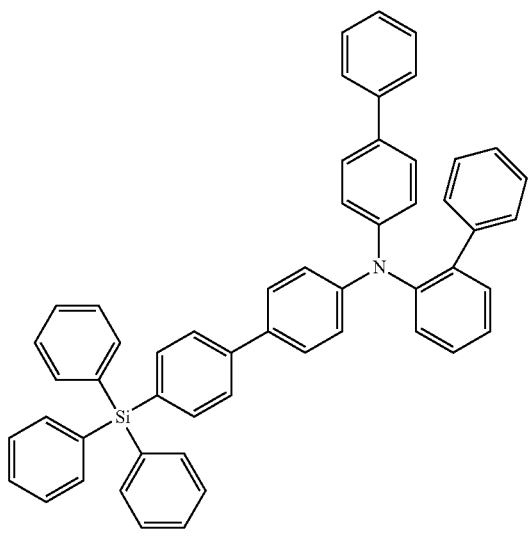

8

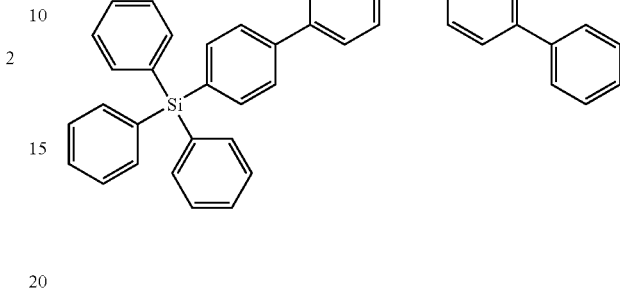

Organic electroluminescent devices of Comparative Examples 1 to 4 were manufactured using the following Comparative Compounds X-1 to X-4 as hole transport layer materials.

Comparative Compounds

4

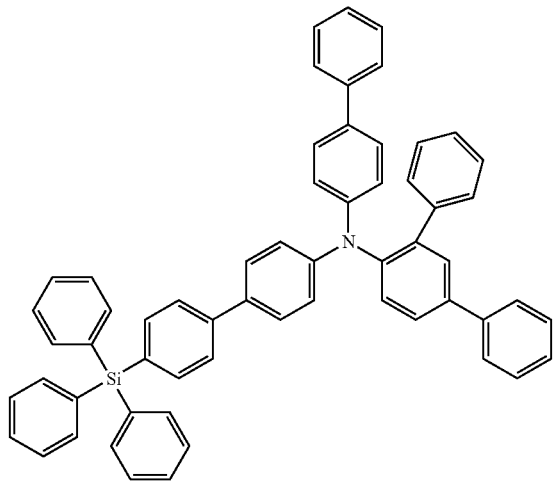

X-1

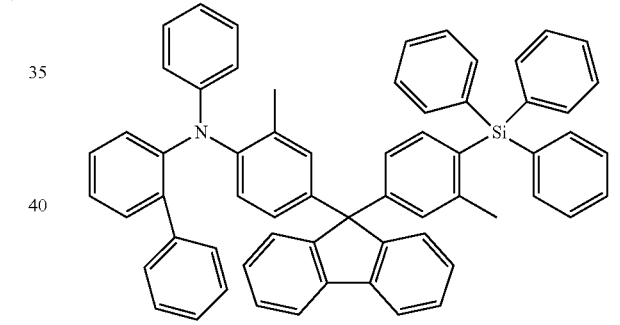

6

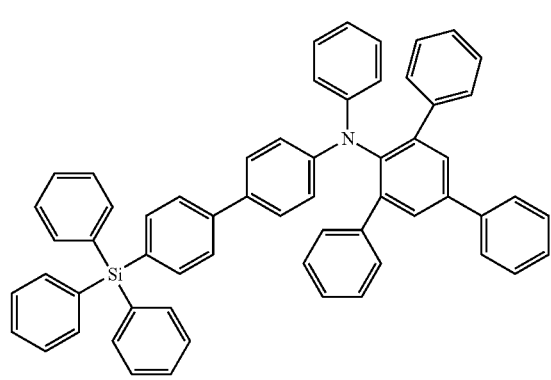

X-2

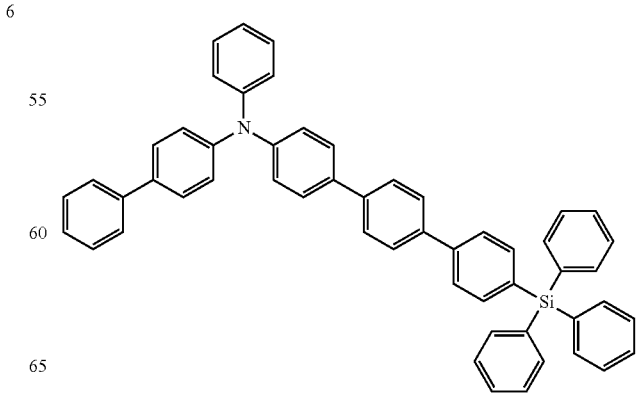

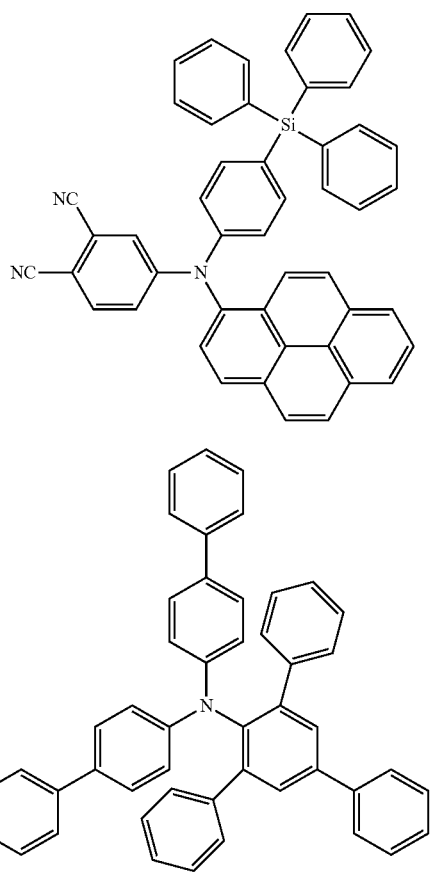

The organic electroluminescence devices according to Examples 1 to 4 and Comparative Examples 1 to 4 were each independently manufactured by forming a first electrode using ITO to a thickness of about 150 nm, forming a hole injection layer using 4,4',4''-tris[2-naphthyl(phenyl)amino]triphenylamine (TNATA) to a thickness of about 60 nm, forming a hole transport layer using the respective Example Compound or Comparative Compound to a thickness of about 30 nm, forming an emission layer using dinaphthylanthracene (ADN) doped with 3% 2,5,8,11-tetra-tert-butylperylene (TBP) to a thickness of about 25 nm, forming an electron transport layer using Alq$_3$ to a thickness of about 25 nm, forming an electron injection layer using LiF to a thickness of about 1 nm, and forming a second electrode using Al to a thickness of about 100 nm. Each layer was formed by a deposition method in a vacuum atmosphere.

Evaluation Results

Sublimation properties of each of Example Compounds 2, 4, 6 and 8 and Comparative Compounds X-1 to X-4 were verified via the measurement of the rate of mass reduction and the layer purity. The rate of mass reduction was measured with respect to a target material for forming a layer for experiment after maintaining thereof in an inert gas atmosphere at about 350 degrees for about 4 hours. The layer purity was measured by dissolving the compound used for forming a layer on a glass substrate in THF and using high-performance liquid chromatography (HPLC). The evaluation results on the rate of mass reduction and the layer purity thus measured are shown in Table 1 below. The sublimation experiment was conducted by using E-120 of ALS technology Co., Ltd. For verifying the purity, Nexera XR of Shimadzu Corporation was used as HPLC, and Shim-pack XR was used as a column. The solvent for measurement was THF:CH$_3$CN=15:85.

TABLE 1

| Compound | Mass reducing rate (%) | Layer purity (%) |
|---|---|---|
| Example Compound 2 | 98.7 | 99.8 |
| Example Compound 4 | 99.0 | 99.7 |
| Example Compound 6 | 99.9 | 99.8 |
| Example Compound 8 | 99.9 | 99.9 |
| Comparative Example X-1 | 98.9 | 96.3 |
| Comparative Example X-2 | 80.1 | 93.2 |
| Comparative Example X-3 | 69.1 | 90.8 |
| Comparative Example X-4 | 99.9 | 95.0 |

Referring to the results shown Table 1, Example Compounds 2, 4, 6 and 8 including an o-biphenyl group and a silyl group exhibited enhanced sublimation properties. Thus, high rate of mass reduction and high layer purity were obtained.

In contrast, Comparative Compound X-1, which included a fluorenyl group, an o-biphenyl group and a silyl group, but also included a quaternary carbon, exhibited high sublimation properties, but had degraded thermal tolerance and thus decreased layer purity value. Comparative Compound X-2 did not include an o-biphenyl group, and thus sublimation properties were decreased, thereby decreasing the values of the rate of mass reduction and the layer purity. Comparative Compound X-3 had high stacking due to the planarity of a pyrene group, and thus sublimation properties were degraded, thereby resulting in relatively small values of the rate of mass reduction and the layer purity.

The driving voltage, life and emission efficiency of the organic electroluminescence devices thus manufactured were evaluated. Evaluation results are shown in Table 2 below. The driving voltage of each organic electroluminescence device of Examples and Comparative Examples was a measured value at a current density of about 10 mA/cm$^2$.

TABLE 2

| Device manufacturing example | Hole transport layer | Driving voltage (V) | Life LT$_{50}$(h) | Emission efficiency (cd/A) |
|---|---|---|---|---|
| Example 1 | Example Compound 2 | 5.5 | 1950 | 6.5 |
| Example 2 | Example Compound 4 | 5.6 | 1900 | 6.7 |
| Example 3 | Example Compound 6 | 5.6 | 1850 | 6.6 |
| Example 4 | Example Compound 8 | 5.7 | 1975 | 6.7 |
| Comparative Example 1 | Comparative Compound X-1 | 6.3 | 1500 | 5.1 |
| Comparative Example 2 | Comparative Compound X-2 | 6.2 | 1510 | 5.2 |
| Comparative Example 3 | Comparative Compound X-3 | 6.3 | 1530 | 5.2 |
| Comparative Example 4 | Comparative Compound X-4 | 6.4 | 1520 | 5.3 |

Referring to the results of Table 2, it may be found that the organic electroluminescence devices of Examples 1 to 4 had a decreased driving voltage, increased device life and improved emission efficiency, when compared to the organic electroluminescence devices of Comparative Examples 1 to 4. In the organic electroluminescence device of Examples 1 to 4, including the amine compound containing an o-biphenyl group and a silyl group in the hole transport layer, the amine properties were maintained and thermal load was degraded, thereby attaining long life. In addition, due to the large volume of an o-biphenyl group, the rigidity of the compound forming the hole transport layer may be increased, and molecular motion may be suppressed or reduced. Thus, hole transport properties may be improved, and low driving voltage and high emission efficiency may be attained.

In Comparative Compound X-1 (which was used to form a hole transport layer in Comparative Example 1), a fluorenyl group is included and quaternary carbon with low durability is included. Thus, life of the organic electroluminescence device including the Comparative Compound X-1 is short, a driving voltage is high, and emission efficiency is decreased. In Comparative Example 2 (using the Comparative Compound X-2), an o-biphenyl group is not included and sublimation properties are degraded. Thus, impurities are included during the formation of the layer (e.g., hole transport layer), life is short, driving voltage is high, and emission efficiency is decreased. In Comparative Example 3 (using Comparative Compound X-3), a pyrene group is included and electron blocking properties are degraded. Thus, excitons generated in emission layer are not efficiently blocked, life of the device is short, driving voltage is high, and emission efficiency is decreased. In Comparative Example 4 (using Comparative Compound X-4), a triarylsilyl group is not included. Thus, charge tolerance is degraded, life is short, driving voltage is high, and emission efficiency is decreased.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present invention have been described herein, it will be understood that the present invention should not be limited to these example embodiments, but that various changes and modifications can be made by one of ordinary skilled in the art within the spirit and scope of the present invention as defined by the following claims and equivalents thereof.

What is claimed is:

1. An amine compound represented by the following Formula 1:

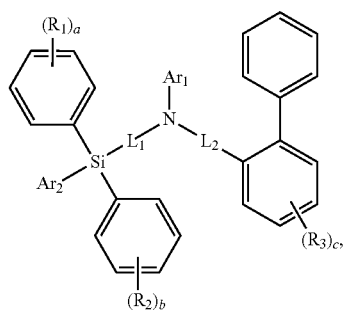

Formula 1 wherein $Ar_1$ and $Ar_2$ are each independently a substituted or unsubstituted aryl group having 6 to 30 carbon atoms for forming a ring, or a substituted or unsubstituted heteroaryl group having 2 to 30 carbon atoms for forming a ring, $L_1$ is a substituted or unsubstituted phenylene group, or a substituted or unsubstituted divalent biphenyl group, $L_2$ is a direct linkage, a substituted or unsubstituted arylene group having 6 to 30 carbon atoms for forming a ring, or a substituted or unsubstituted heteroarylene group having 2 to 30 carbon atoms for forming a ring, $R_1$ to $R_3$ are each independently selected from hydrogen, deuterium, a halogen atom, a substituted or unsubstituted alkyl group having 1 to 20 carbon atoms, a substituted or unsubstituted aryl group having 6 to 30 carbon atoms, and a substituted or unsubstituted heteroaryl group having 2 to 30 carbon atoms for forming a ring, "a" and "b" are each independently an integer of 0 to 5, and "c" is an integer of 0 to 4.

2. The amine compound of claim 1, wherein the amine compound represented by Formula 1 is represented by the following Formula 2:

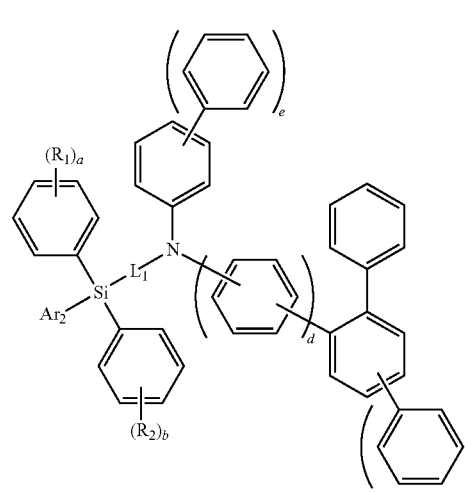

Formula 2 wherein in Formula 2, "d" is 0 or 1, "e" is 0 or 1, "f" is an integer of 0 to 2, wherein if "f" is 2 and "d" is 1, "e" is 0; and $L_1$, $R_1$, $R_2$, $Ar_2$, "a" and "b" are the same as defined in Formula 1.

3. The amine compound of claim 1, wherein $Ar_1$ is a substituted or unsubstituted phenyl group, or a substituted or unsubstituted biphenyl group.

4. The amine compound of claim 1, wherein $Ar_2$ is a substituted or unsubstituted phenyl group, or a substituted or unsubstituted naphthyl group.

5. The amine compound of claim 1, wherein the amine compound represented by Formula 1 is represented by one of the following Formulae 3-1 to 3-7:

Formula 3-1

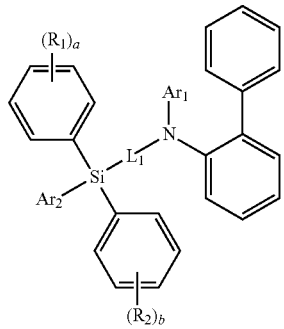

Formula 3-2

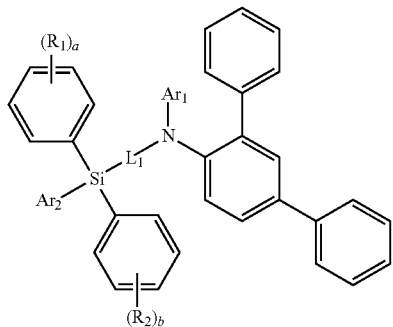

Formula 3-3

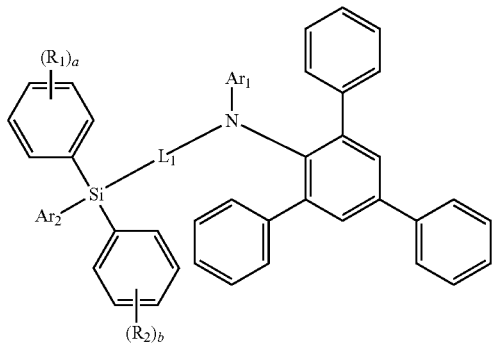

-continued

Formula 3-4

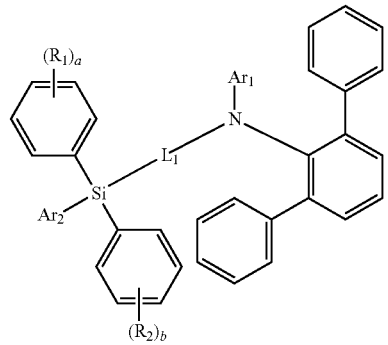

Formula 3-5

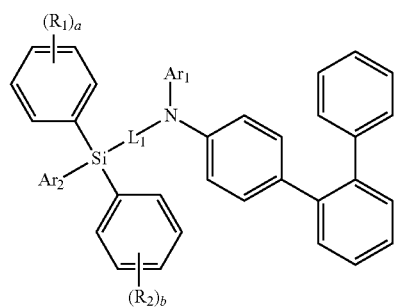

Formula 3-6

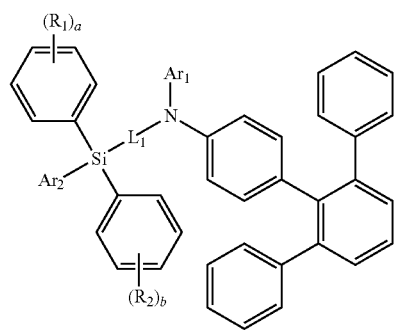

Formula 3-7

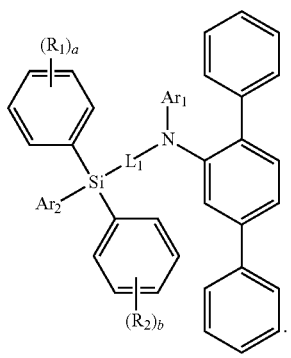

wherein in Formulae 3-1 to 3-7, $R_1$, $R_2$, $Ar_1$, $Ar_2$, $L_1$, "a" and "b" are the same as defined in Formula 1.

6. The amine compound of claim 1, wherein the amine compound represented by Formula 1 is represented by one of the following Formulae 4-1 to 4-4:

Formula 4-1

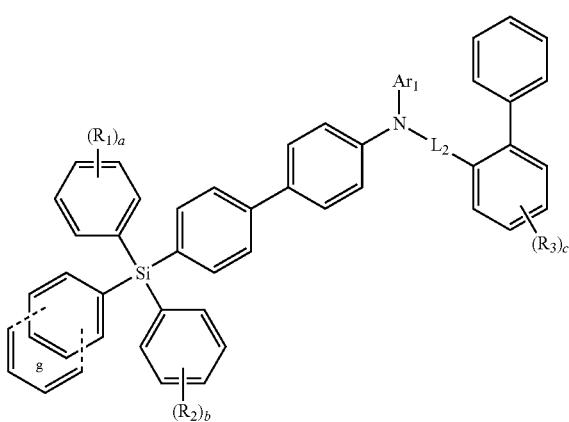

Formula 4-2

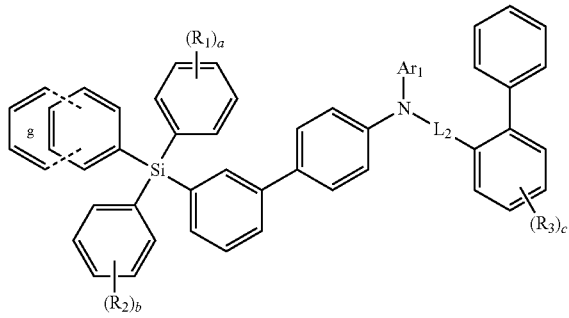

Formula 4-3

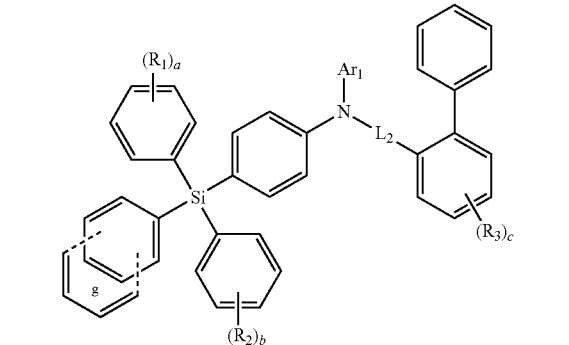

Formula 4-4

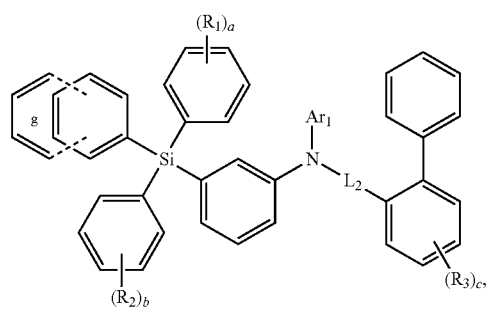

wherein in Formulae 4-1 to 4-4,

"g" is 0 or 1, and $R_1$, $R_2$, $R_3$, $Ar_1$, $L_2$, "a", "b" and "c" are the same as defined in Formula 1.

7. The amine compound of claim 1, wherein the amine compound represented by Formula 1 has a molecular weight of about 600 to about 830.

8. The amine compound of claim 1, wherein the amine compound represented by Formula 1 is any one selected from Compounds 1 to 17 in the following Compound Group 1:

Compound Group 1

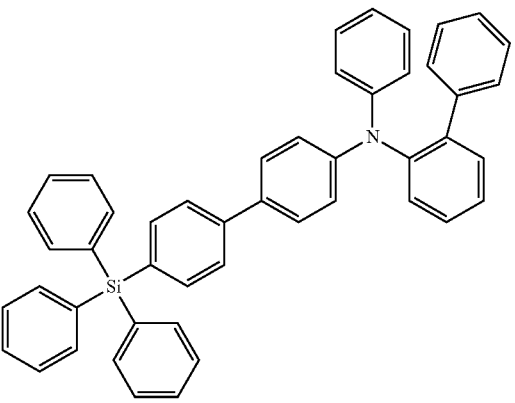

1

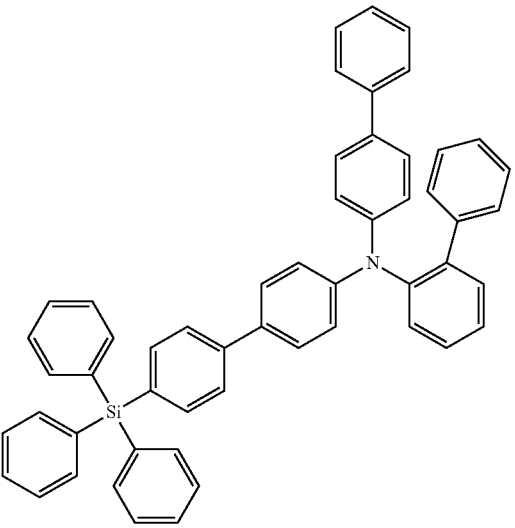

2

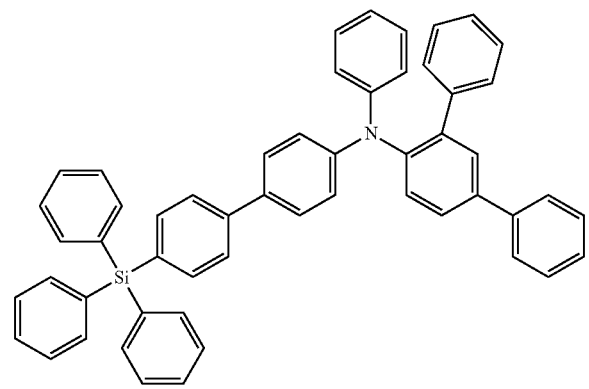

3

4
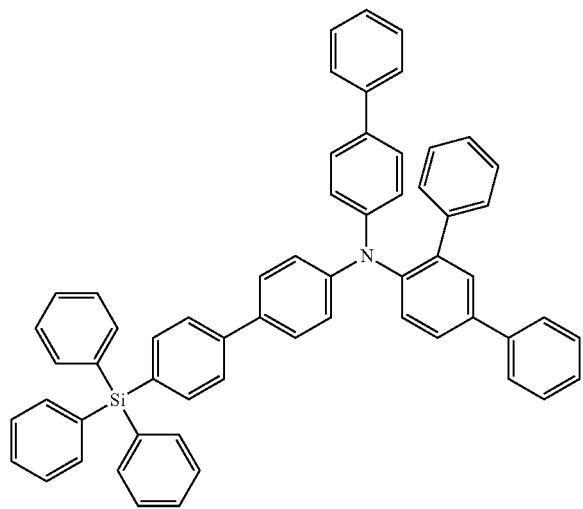
5
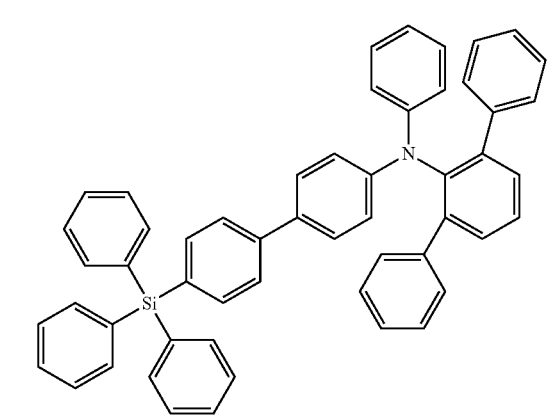
6
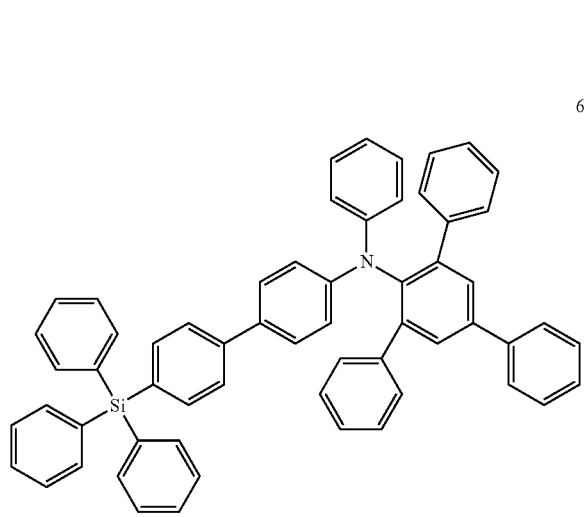
7
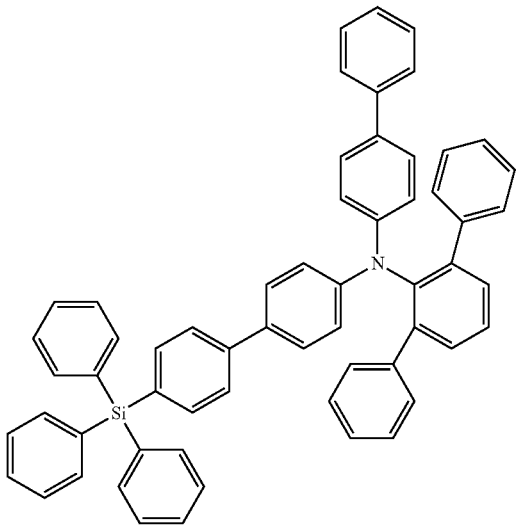
8
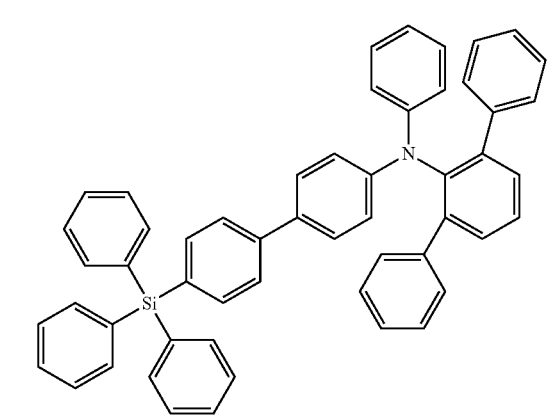
9
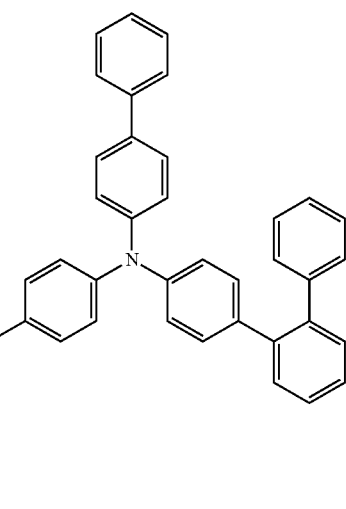

10
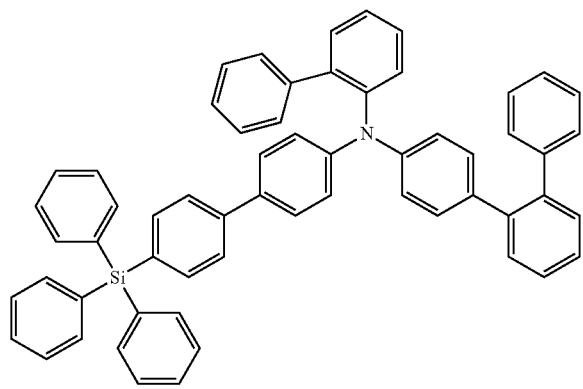
11
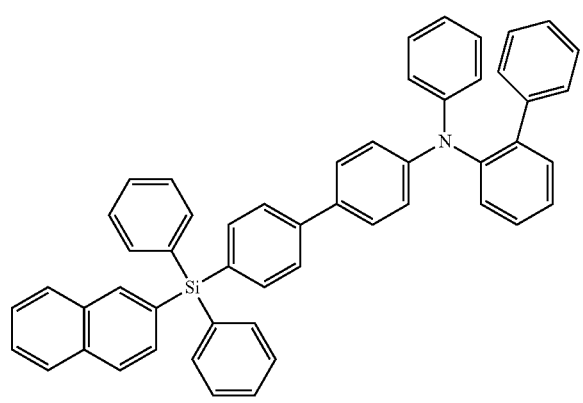
12
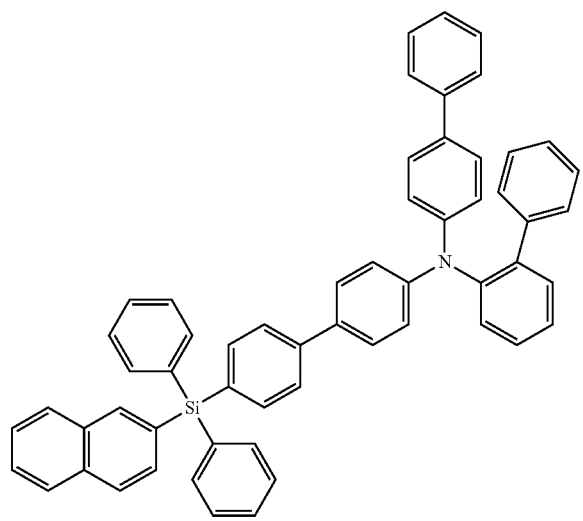
13
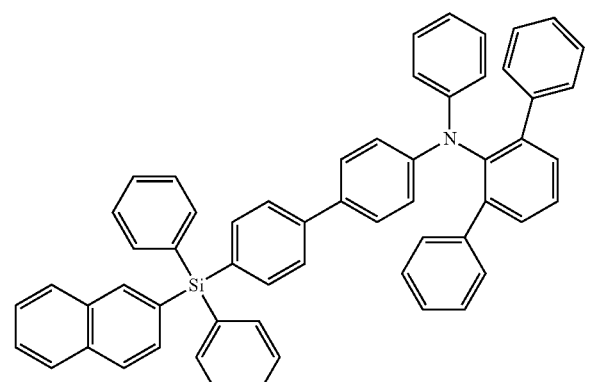
14
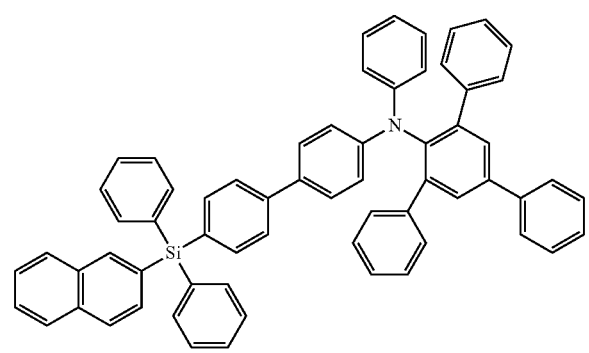
15
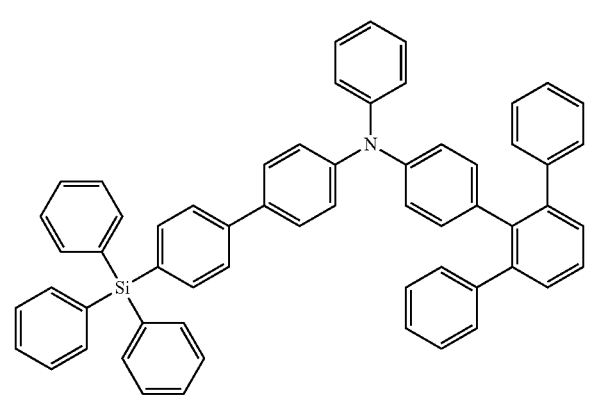

16
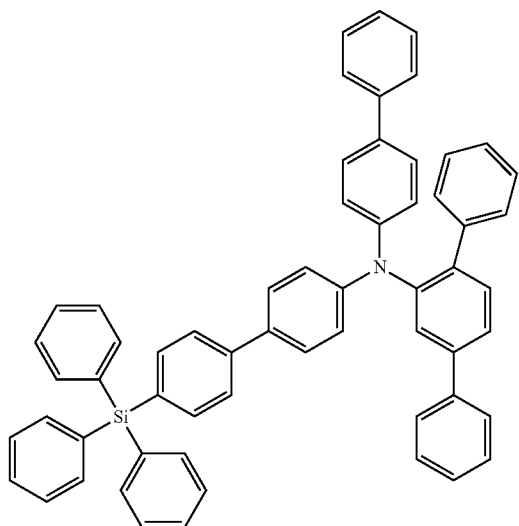
17
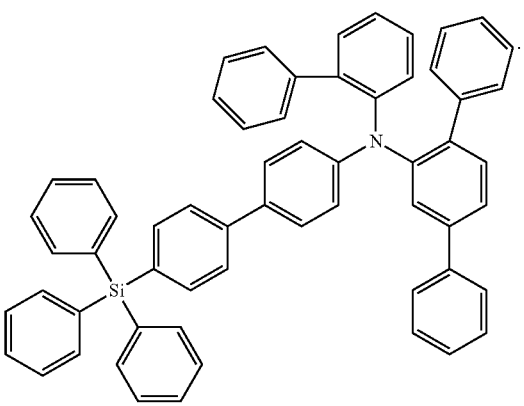
9. The amine compound of claim 1, wherein the amine compound represented by Formula 1 is any one selected from Compounds 18 to 28 in the following Compound Group 2:
Compound Group 2
18
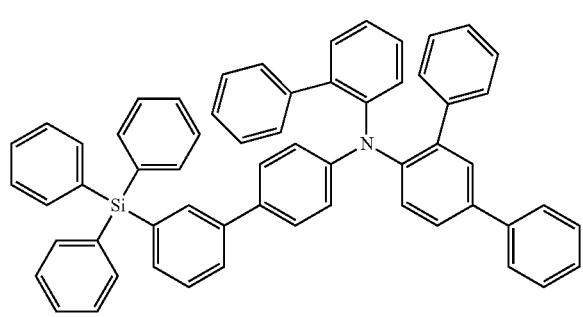
19
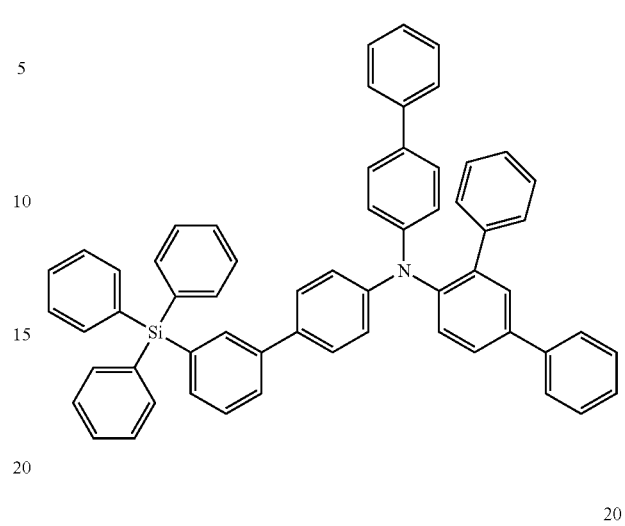
20
21
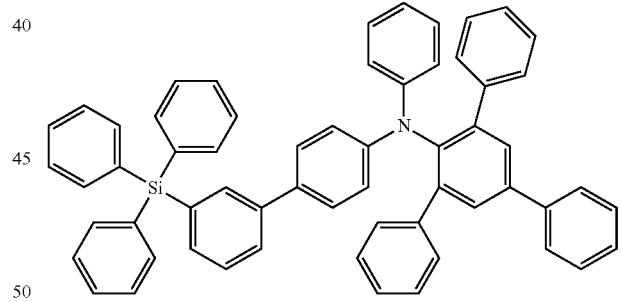
22
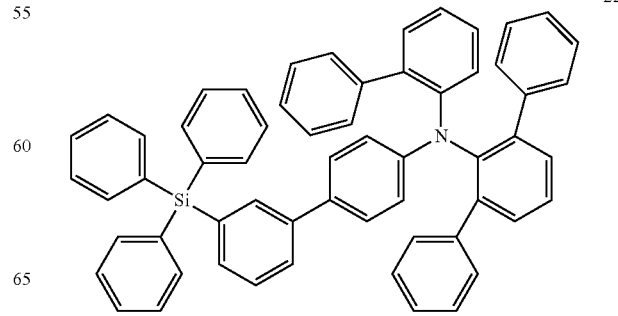

23
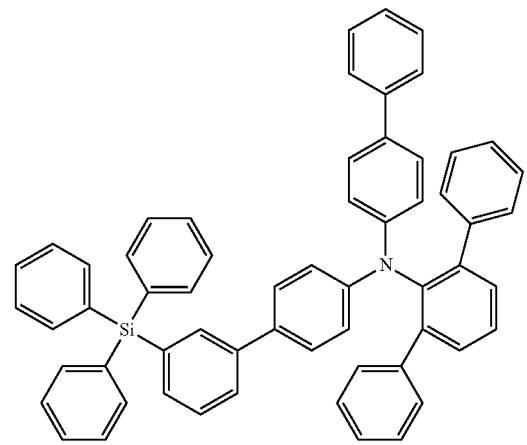
24
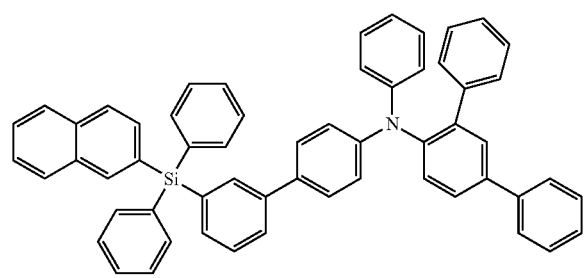
25
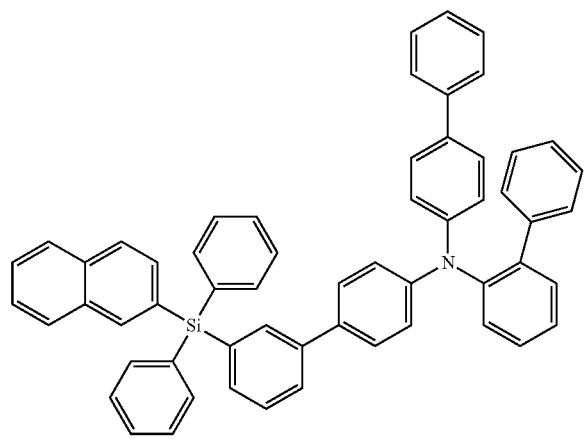
26
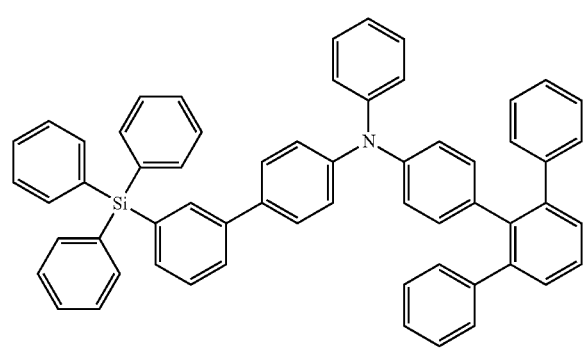
27
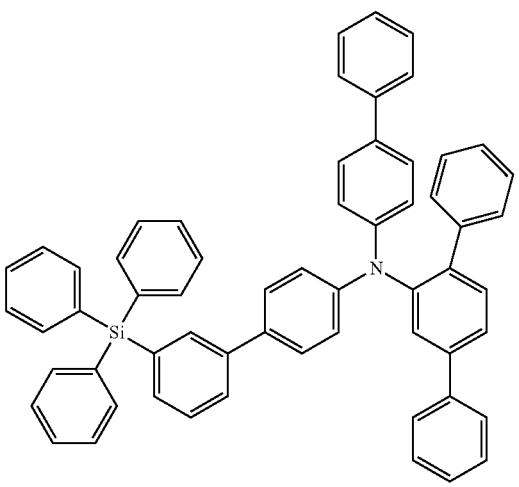
28
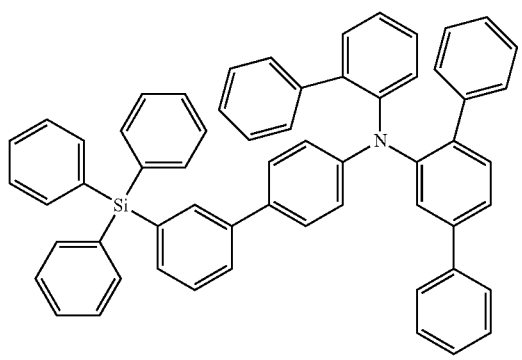
10. The amine compound of claim 1, wherein the amine compound represented by Formula 1 is any one selected from Compounds 29 to 44 in the following Compound Group 3:
Compound Group 3
29
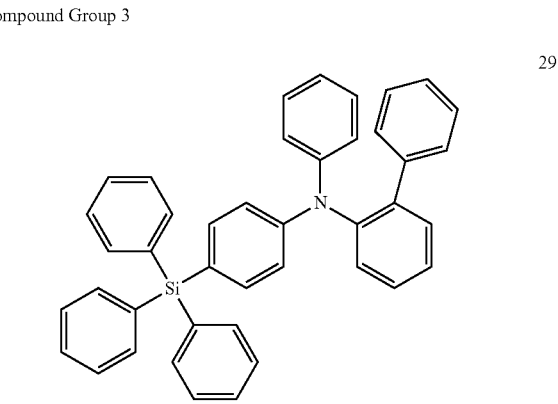

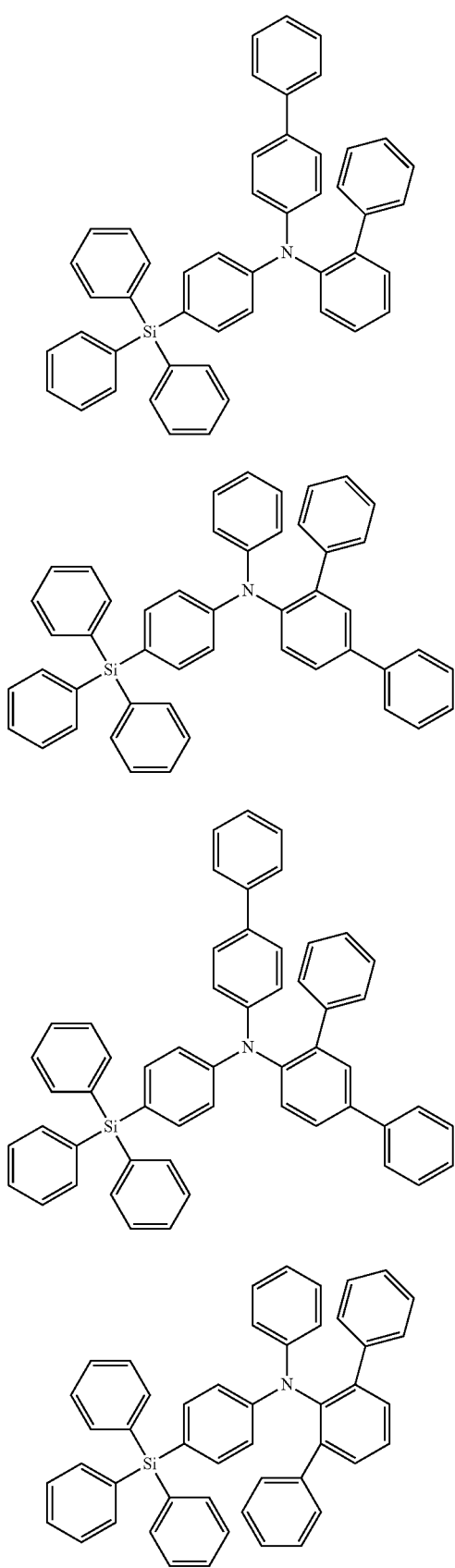
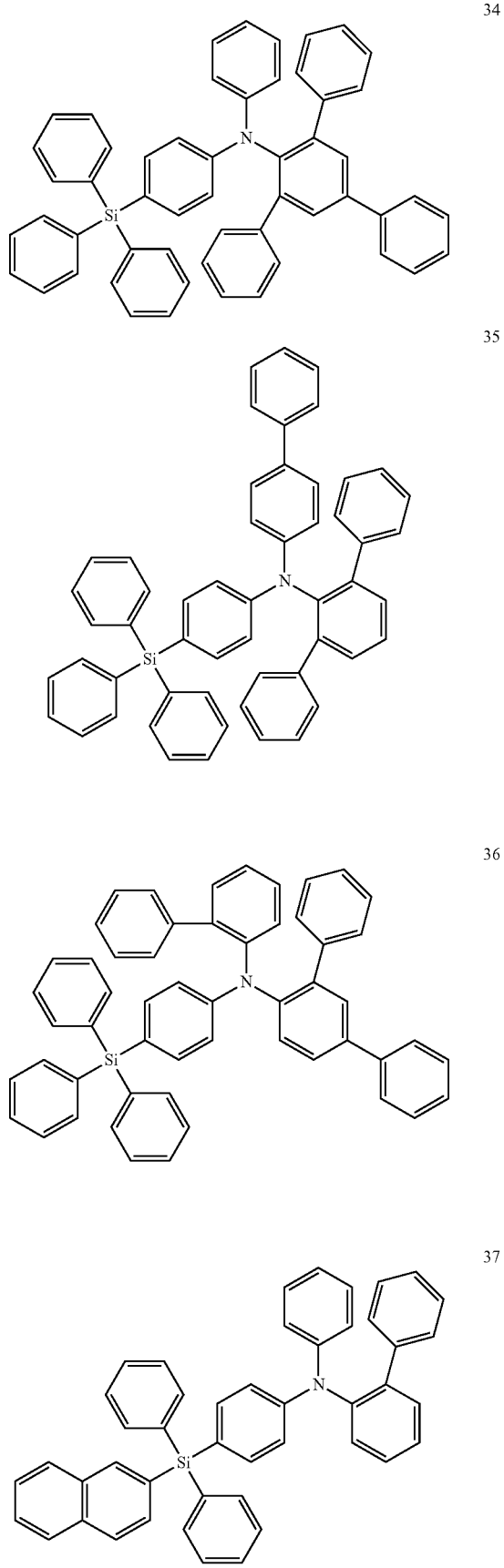

-continued
38
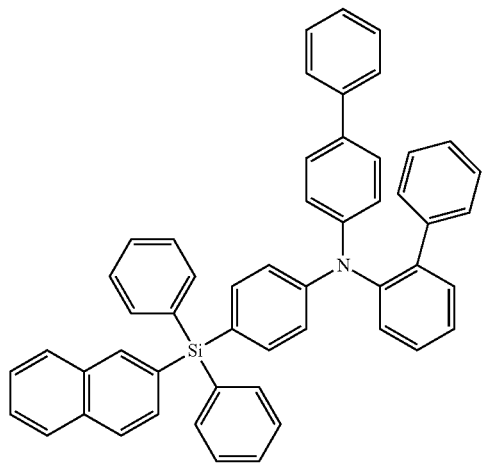
39
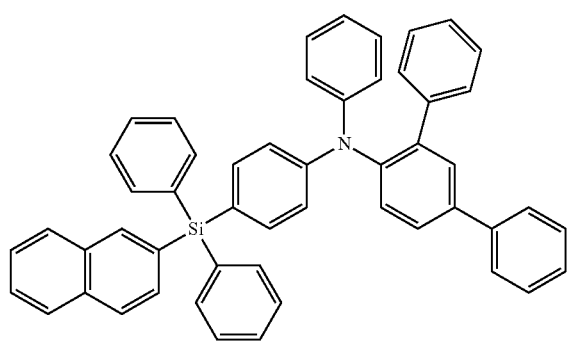
40
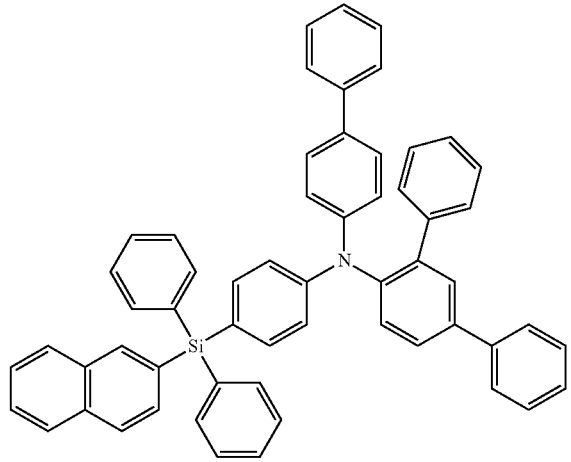
41
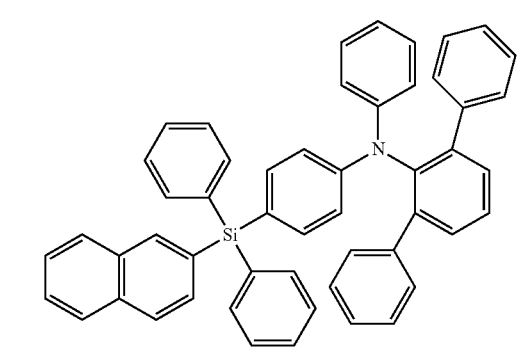
-continued
42
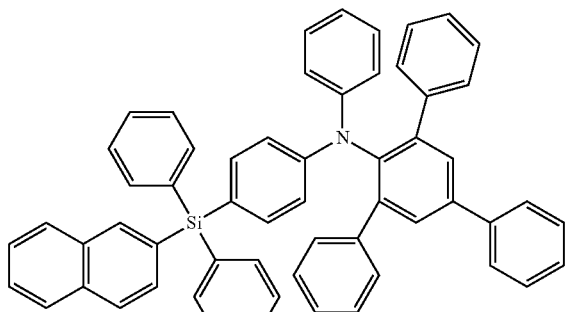
43
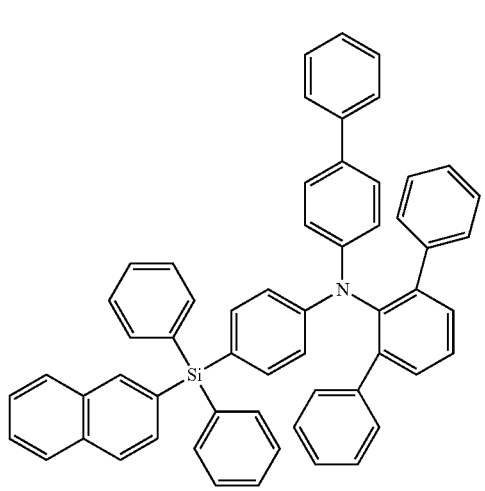
44
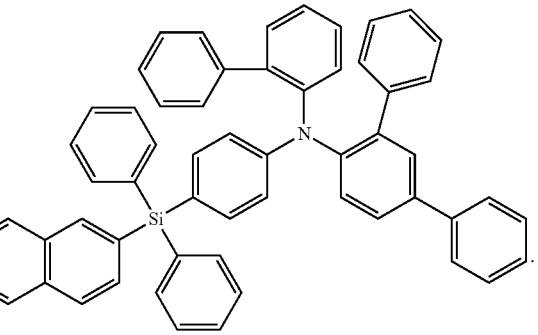
11. The amine compound of claim 1, wherein the amine compound represented by Formula 1 is any one selected from Compounds 45 to 60 in the following Compound Group 4:

Compound Group 4
45
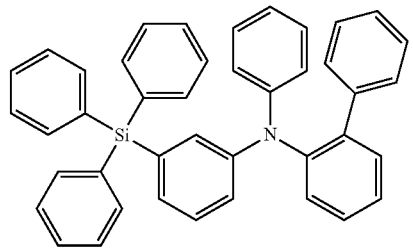
46
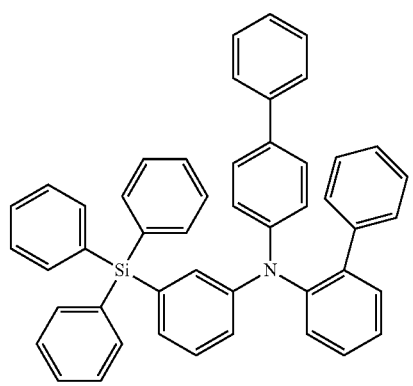
47
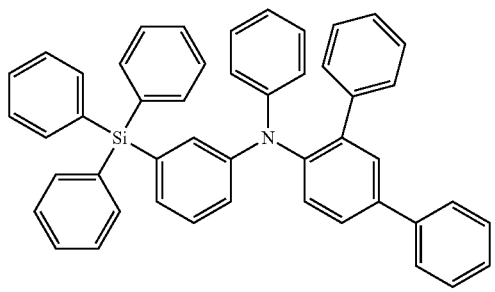
48
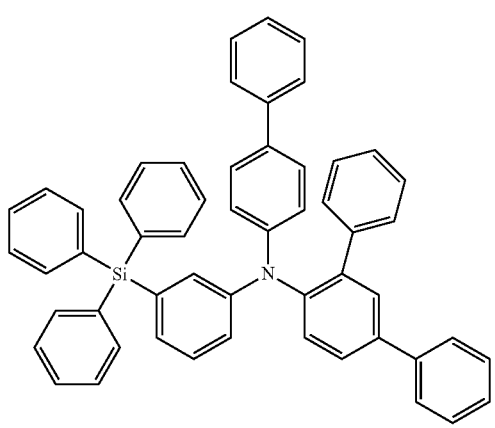
-continued
49
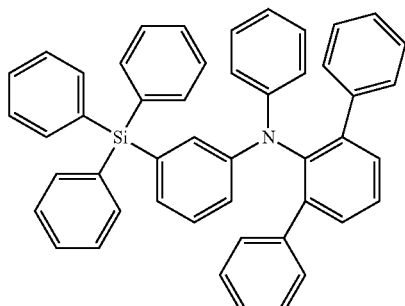
50
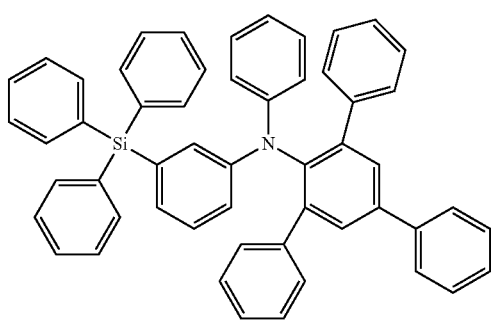
51
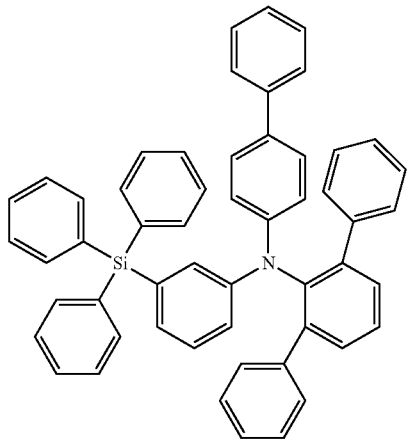
52
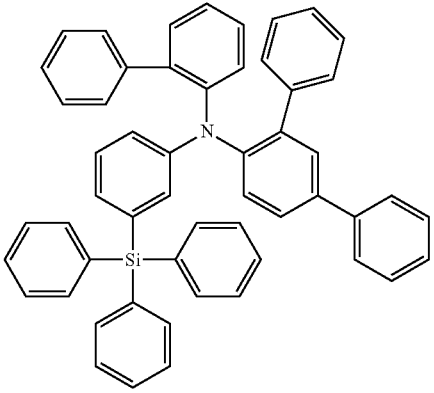

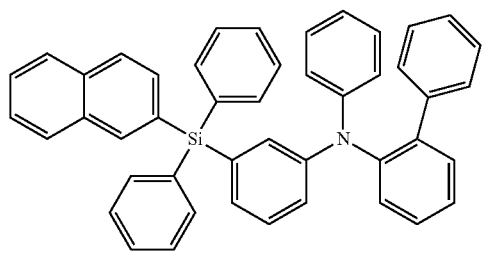
53
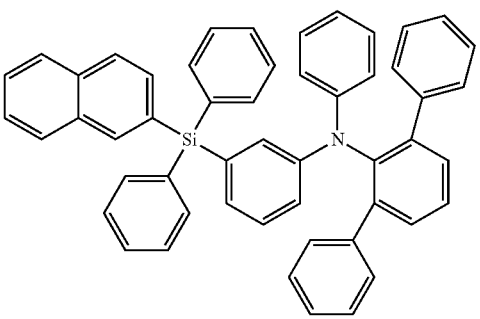
57
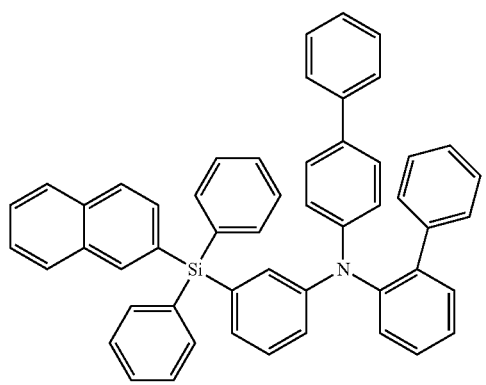
54
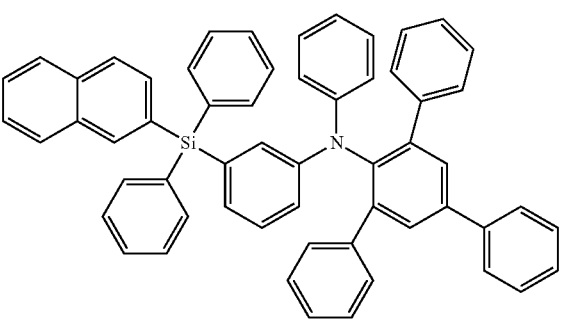
58
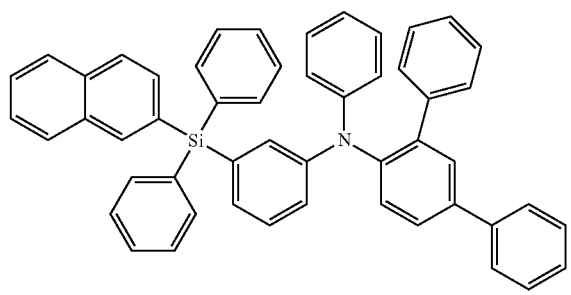
55
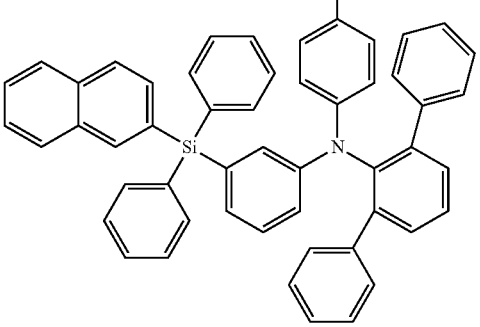
59
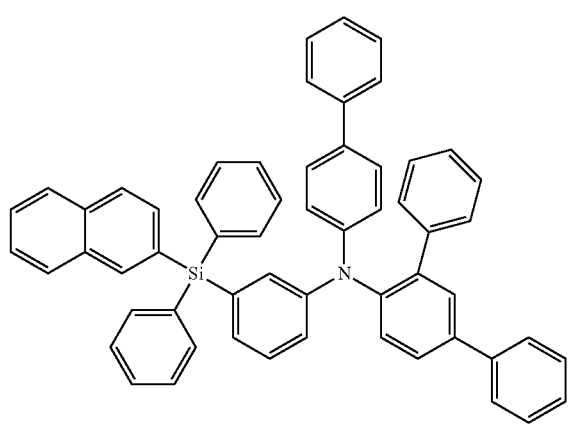
56
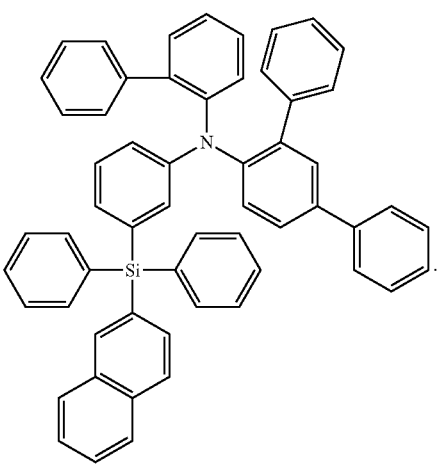
60
12. An organic electroluminescence device, comprising:
a first electrode;
a hole transport region on the first electrode;

an emission layer on the hole transport region;

an electron transport region on the emission layer; and a second electrode on the electron transport region, wherein the hole transport region comprises an amine compound represented by the following Formula 1:

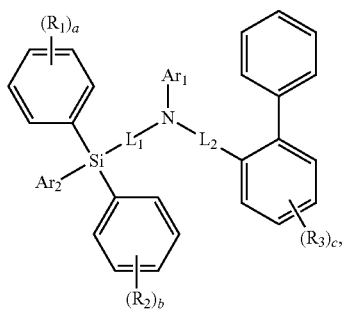

Formula 1 wherein Ar₁ and Ar₂ are each independently a substituted or unsubstituted aryl group having 6 to 30 carbon atoms for forming a ring, or a substituted or unsubstituted heteroaryl group having 2 to 30 carbon atoms for forming a ring, $L_1$ is a substituted or unsubstituted phenylene group, or a substituted or unsubstituted divalent biphenyl group, $L_2$ is a direct linkage, a substituted or unsubstituted arylene group having 6 to 30 carbon atoms for forming a ring, or a substituted or unsubstituted heteroarylene group having 2 to 30 carbon atoms for forming a ring, $R_1$ to $R_3$ are each independently selected from hydrogen, deuterium, a halogen atom, a substituted or unsubstituted alkyl group having 1 to 20 carbon atoms, a substituted or unsubstituted aryl group having 6 to 30 carbon atoms, and a substituted or unsubstituted heteroaryl group having 2 to 30 carbon atoms for forming a ring, "a" and "b" are each independently an integer of 0 to 5, and "c" is an integer of 0 to 4.

13. The organic electroluminescence device of claim 12, wherein the hole transport region comprises:

a hole injection layer on the first electrode; and a hole transport layer on the hole injection layer, and the hole transport layer comprises the amine compound represented by Formula 1.

14. The organic electroluminescence device of claim 12, wherein the amine compound represented by Formula 1 is represented by the following Formula 2:

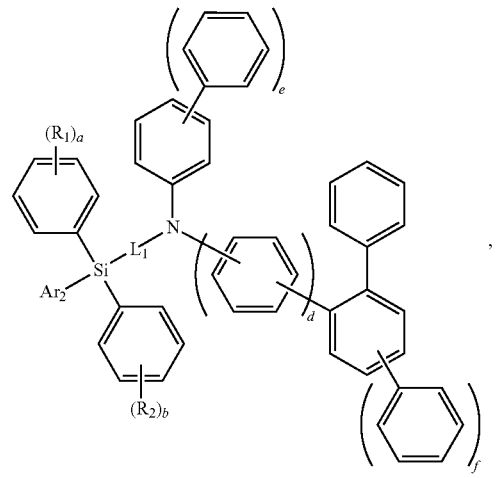

Formula 2 wherein in Formula 2, "d" is 0 or 1, "e" is 0 or 1, "f" is an integer of 0 to 2, wherein if "f" is 2 and "d" is 1, "e" is 0; and $L_1$, $R_1$, $R_2$, $Ar_2$, "a" and "b" are the same as defined in Formula 1.

15. The organic electroluminescence device of claim 12, wherein $Ar_1$ is a substituted or unsubstituted phenyl group, or a substituted or unsubstituted biphenyl group.

16. The organic electroluminescence device of claim 12, wherein $Ar_2$ is a substituted or unsubstituted phenyl group, or a substituted or unsubstituted naphthyl group.

17. The organic electroluminescence device of claim 12, wherein the amine compound represented by Formula 1 is represented by one of the following Formulae 3-1 to 3-7:

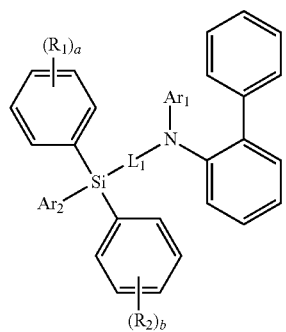

Formula 3-1

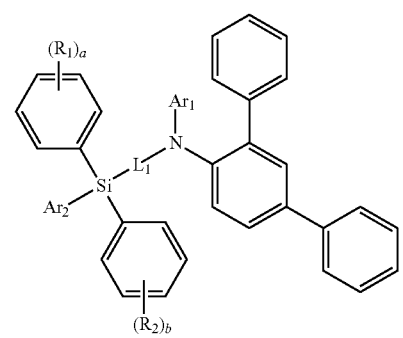

Formula 3-2

Formula 3-3
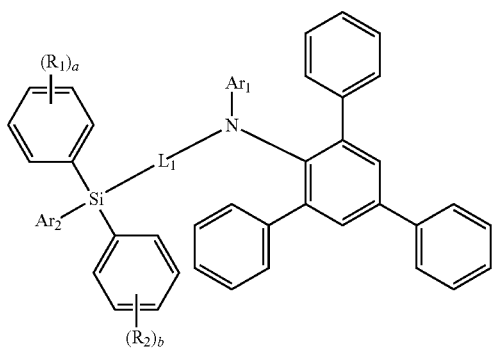
Formula 3-4
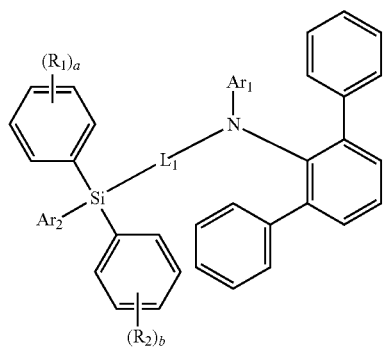
Formula 3-5
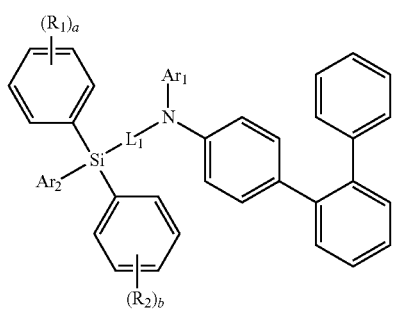
Formula 3-6
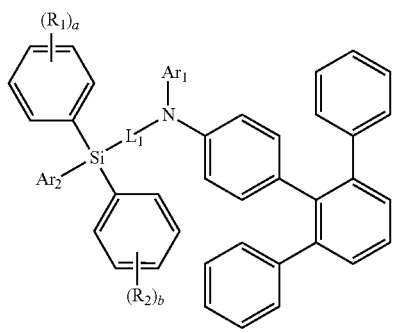
Formula 3-7
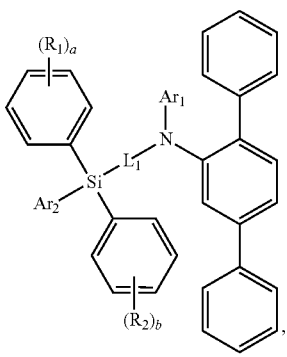
wherein in Formulae 3-1 to 3-7, $R_1$, $R_2$, $Ar_1$, $Ar_2$, Li, "a" and "b" are the same as defined in Formula 1.
18. The organic electroluminescence device of claim 12, wherein the amine compound represented by Formula 1 is represented by one of the following Formulae 4-1 to 4-4:
Formula 4-1
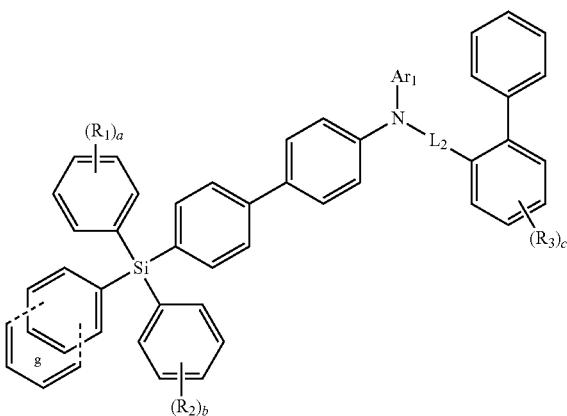
Formula 4-2
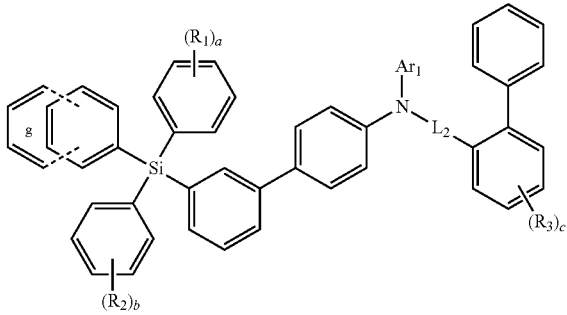

Formula 4-3
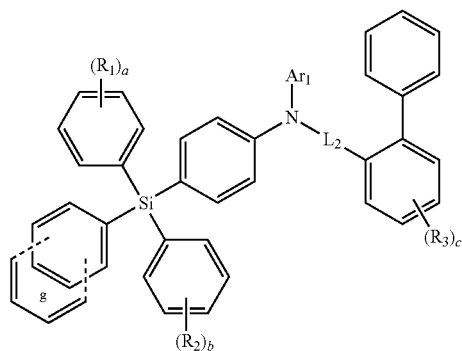
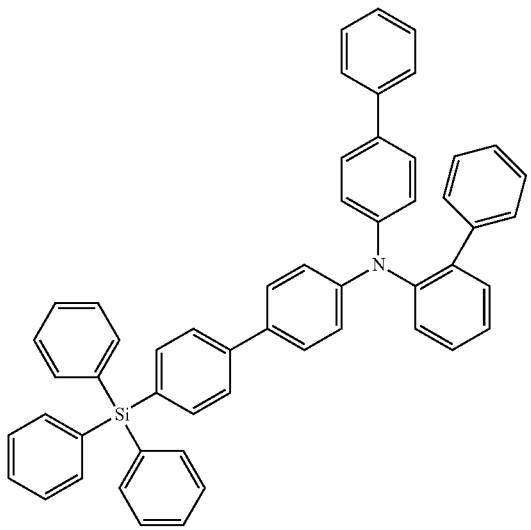
Formula 4-4
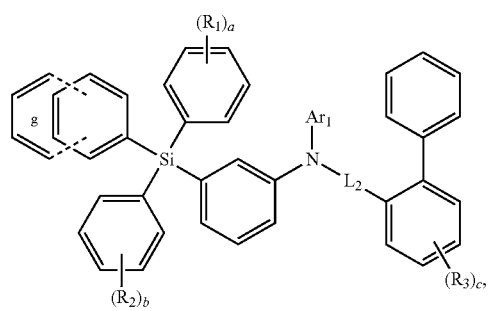
wherein in Formulae 4-1 to 4-4,
"g" is 0 or 1, and
$R_1$, $R_2$, $R_3$, $Ar_1$, $L_2$, "a", "b" and "c" are the same as defined in Formula 1.
19. The organic electroluminescence device of claim 12, wherein the amine compound represented by Formula 1 is any one selected from Compounds 1 to 60 in the following Compound Groups 1 to 4:
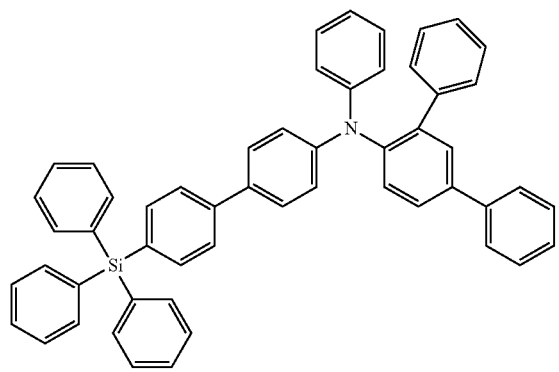
Compound Group 1
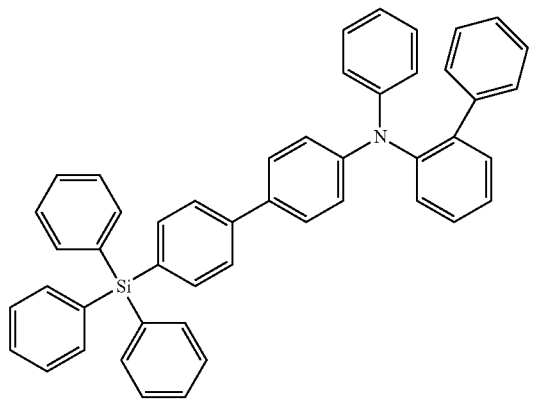
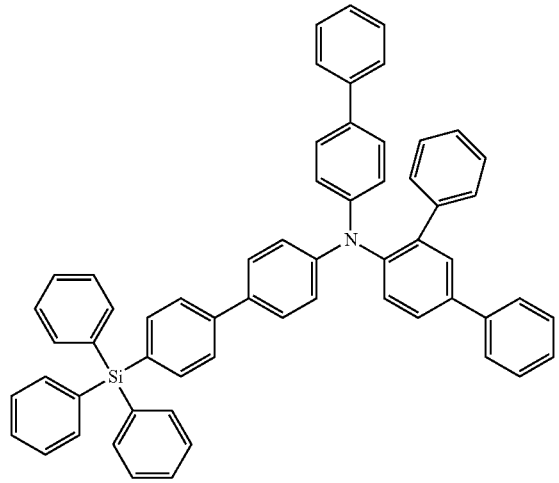

5
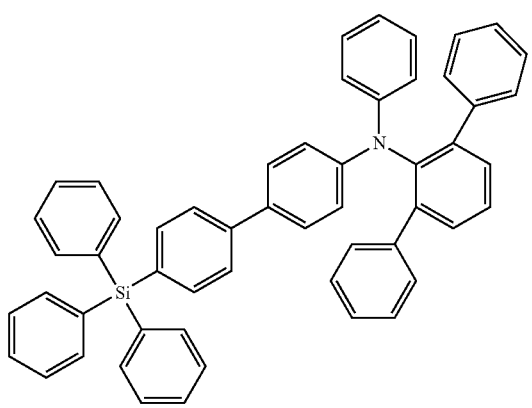
6
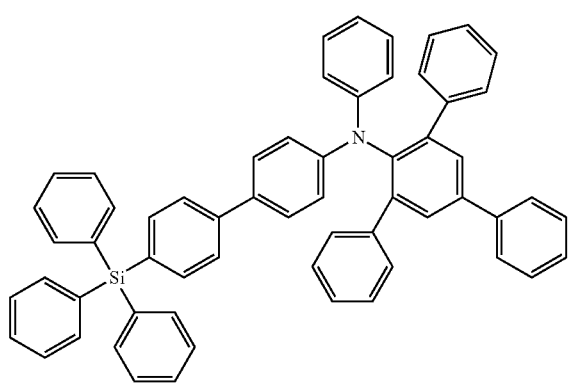
7
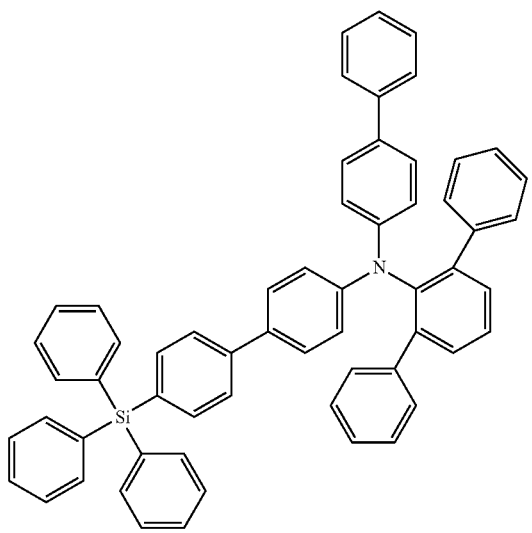
8
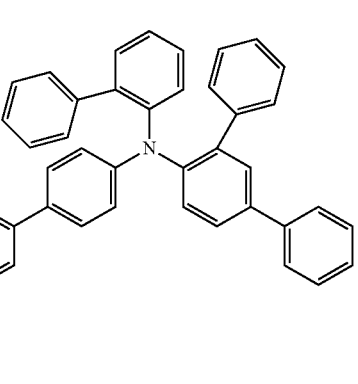
9
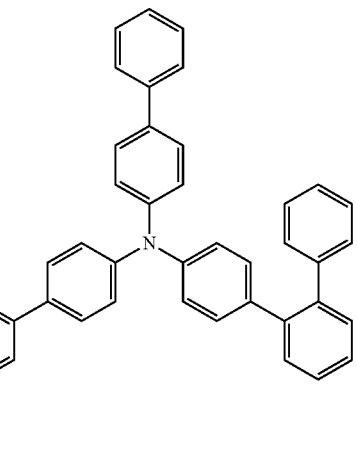
10
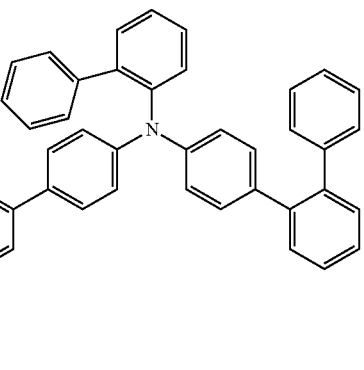

-continued
11
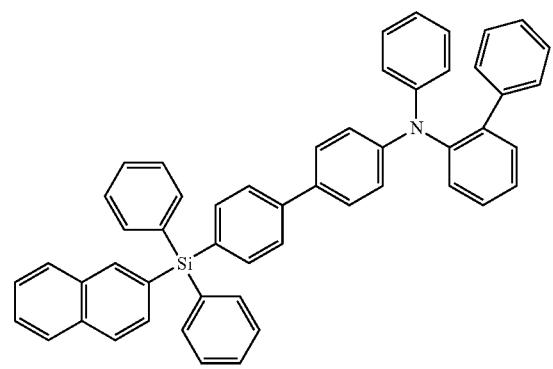
12
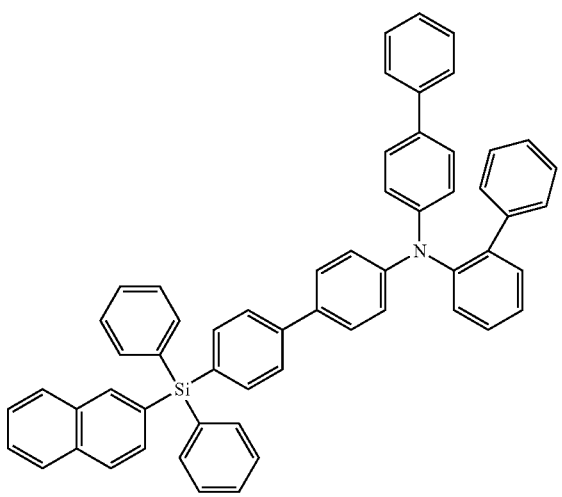
13
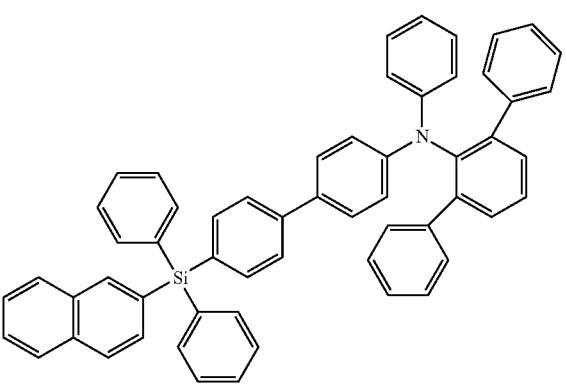
14
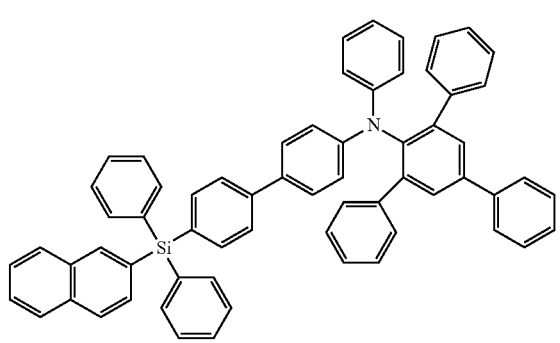
-continued
15
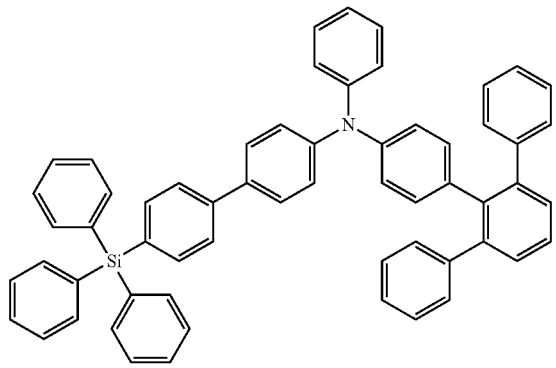
16
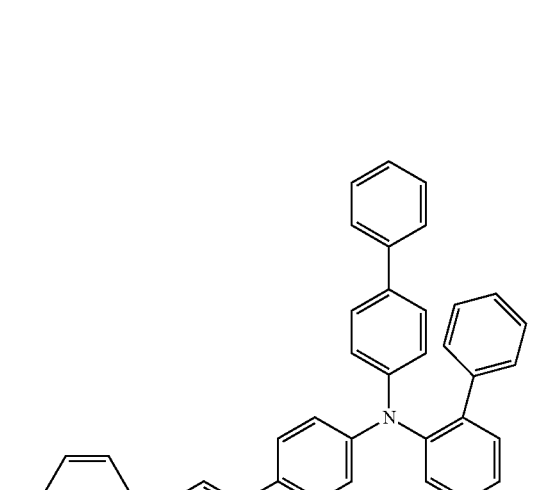
17
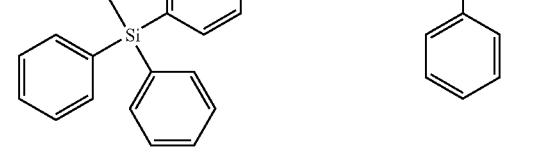

Compound Group 2
18
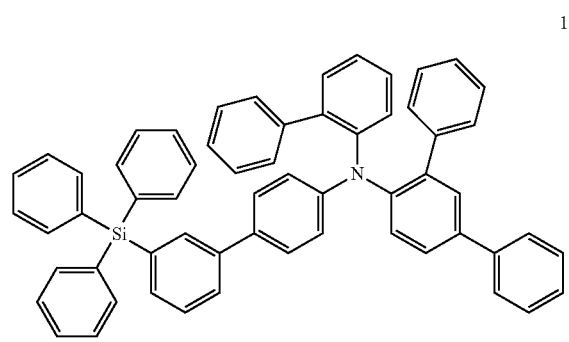
22
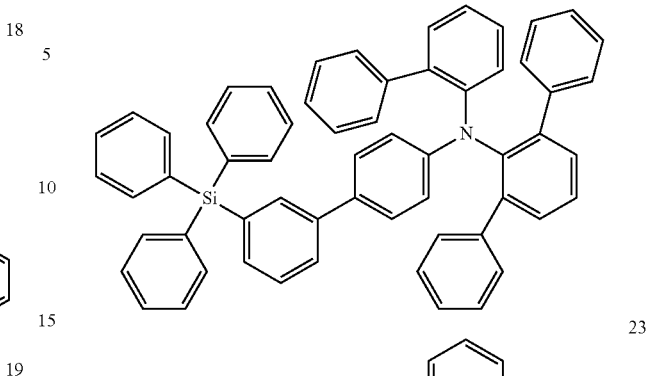
19
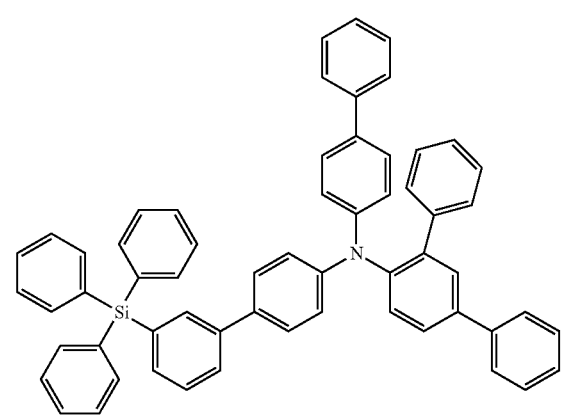
23
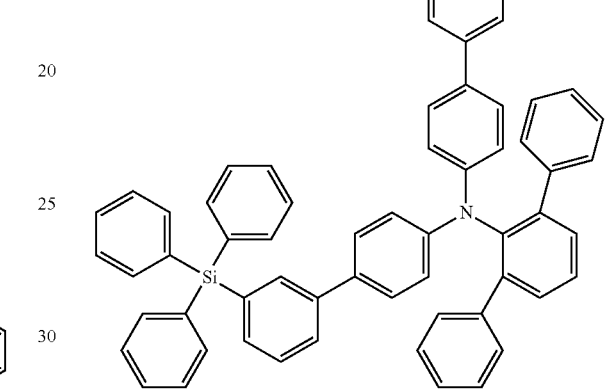
20
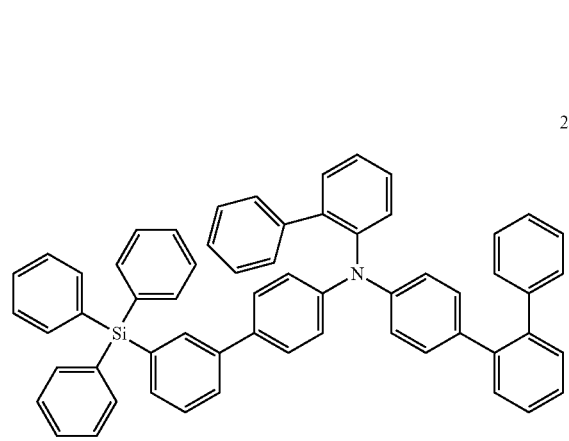
24
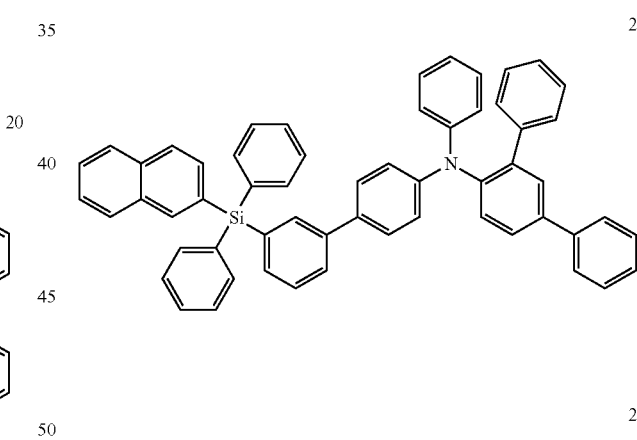
21
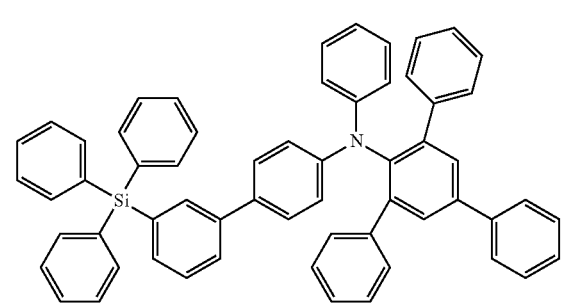
25
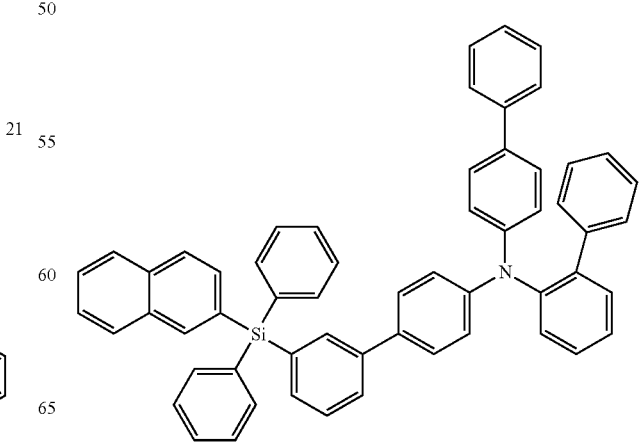

26
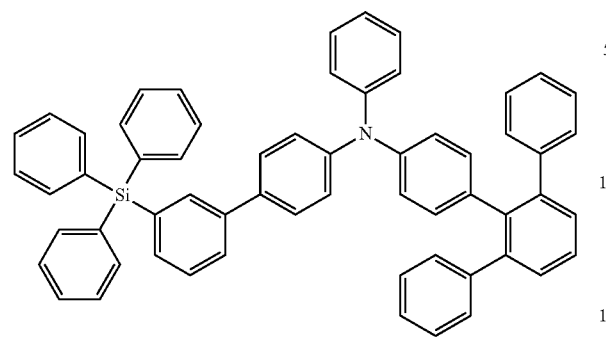
27
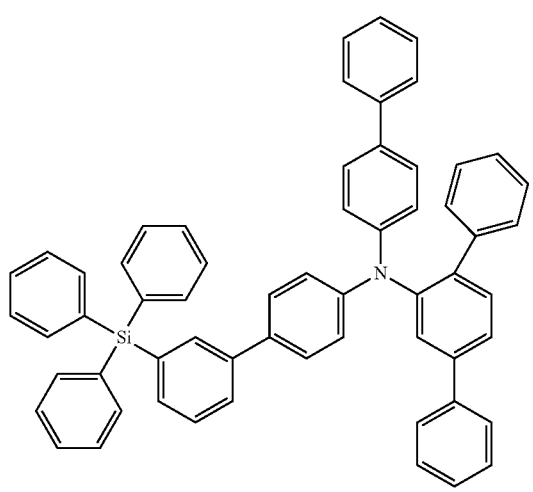
28
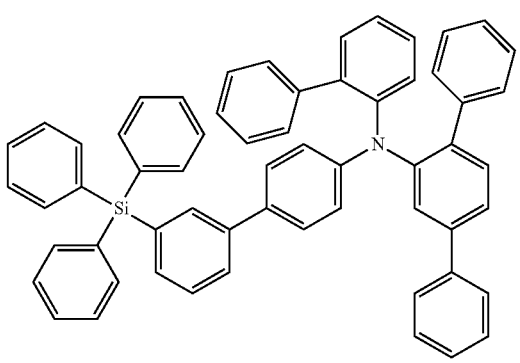
Compound Group 3
29
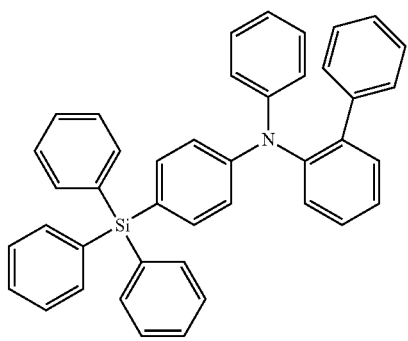
30
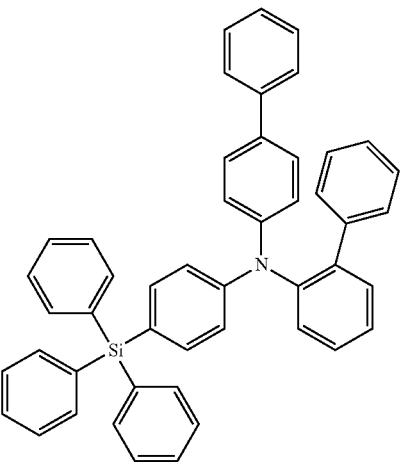
31
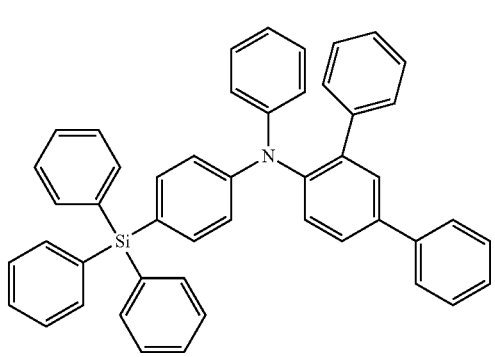
32
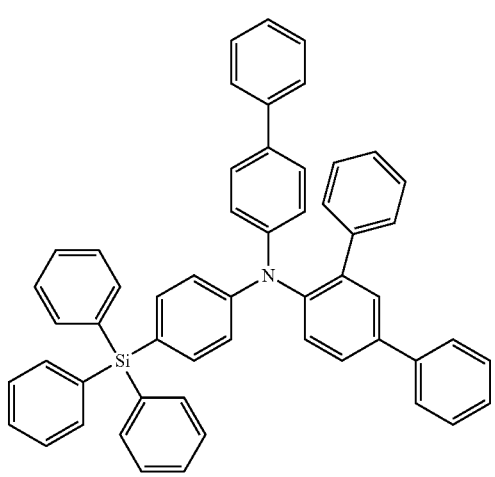
33
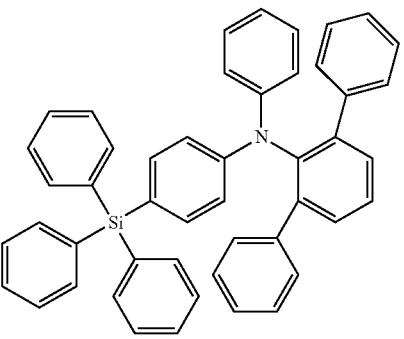

34
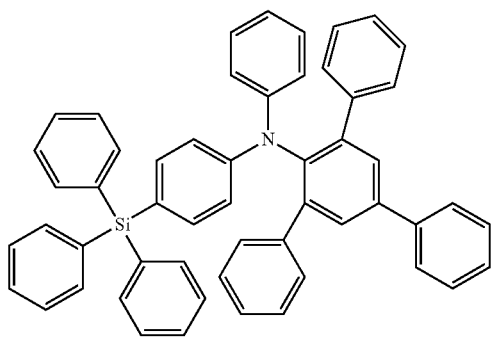
35
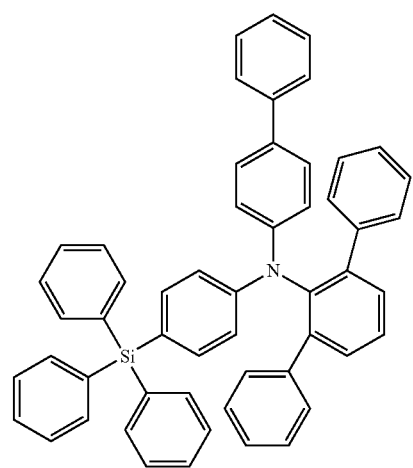
36
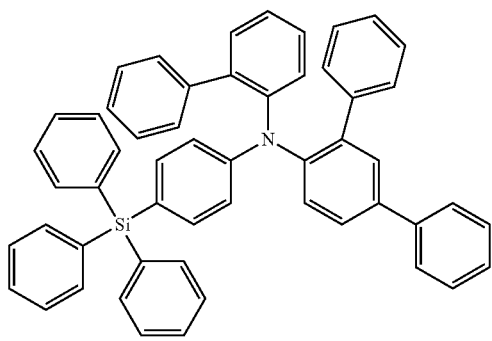
37
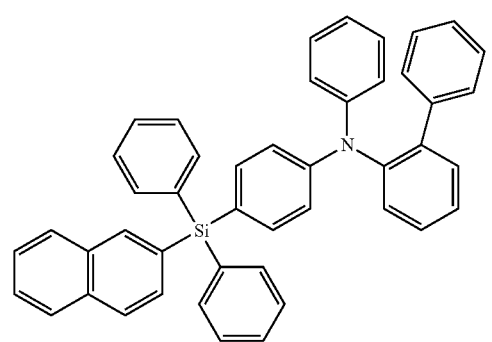
38
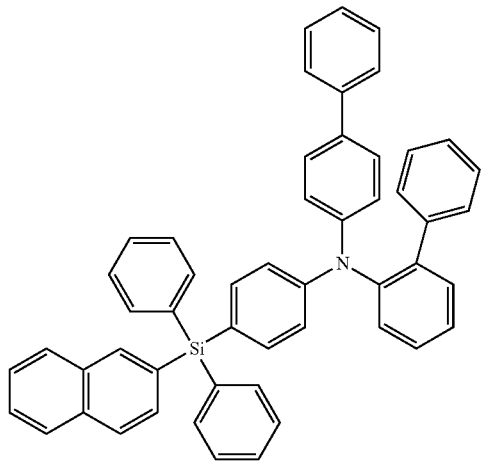
39
40
41
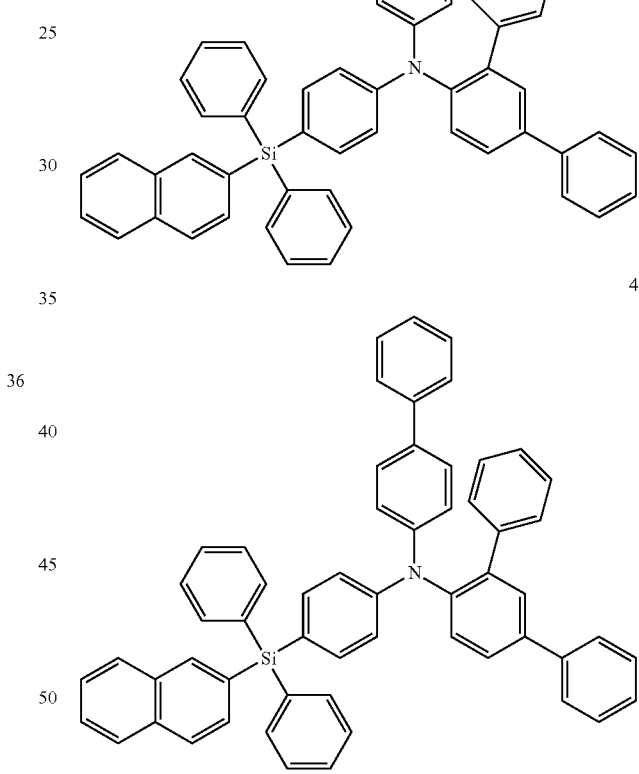

42
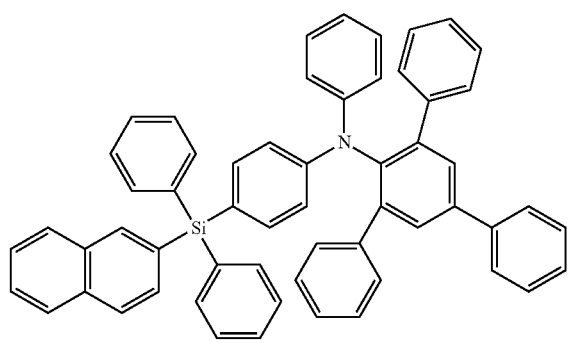
43
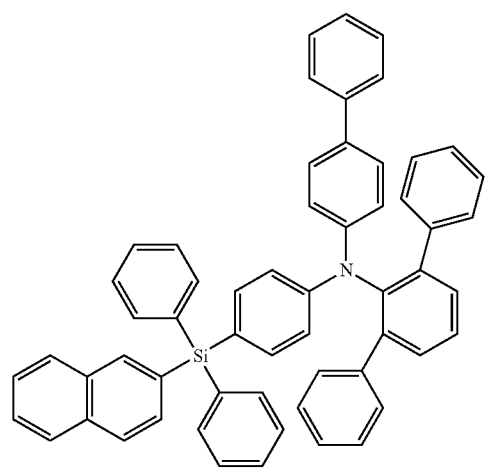
44
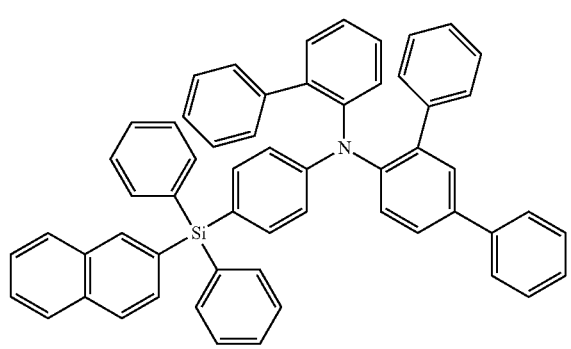
Compound Group 4
45
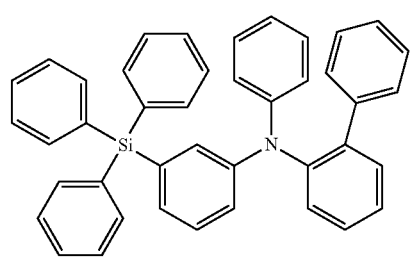
46
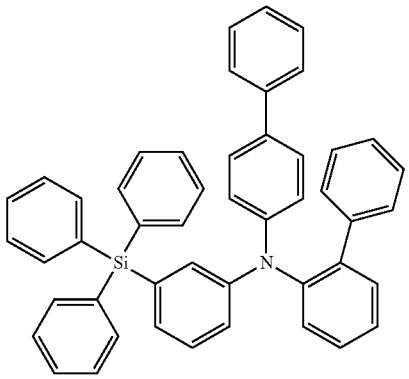
47
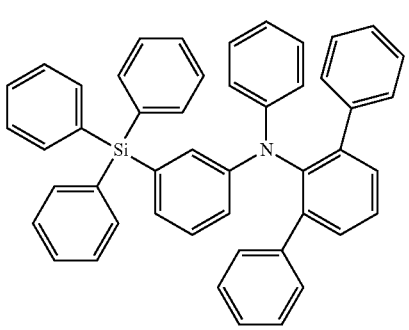
48
49

50
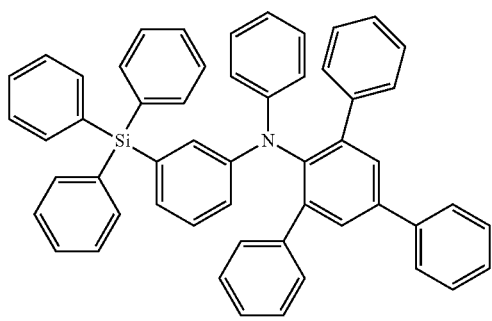
51
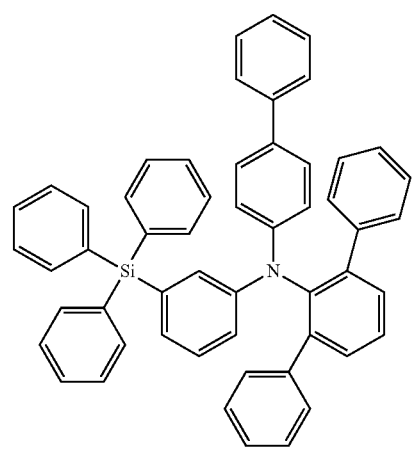
52
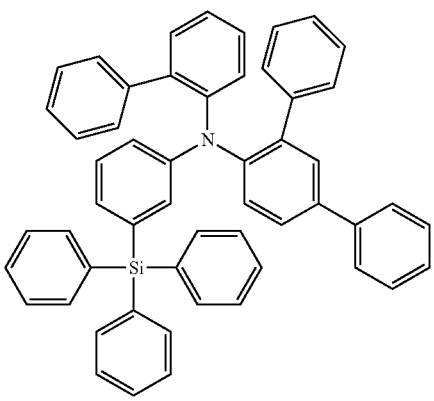
53
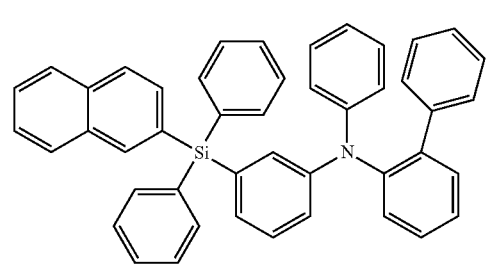
54
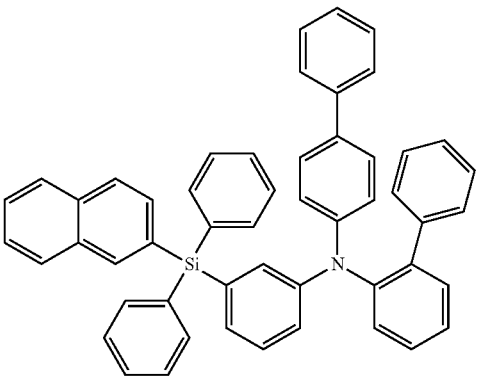
55
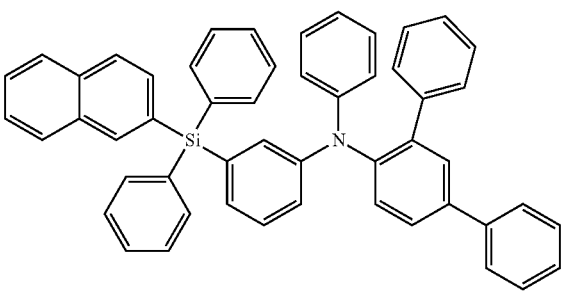
56
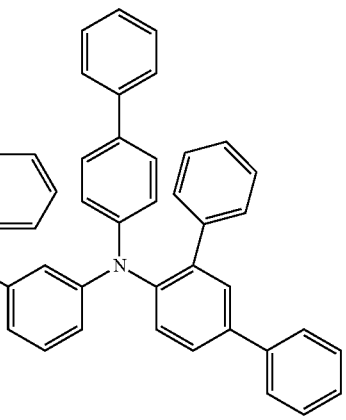

57
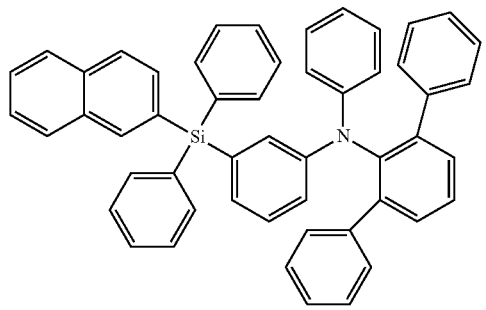
58
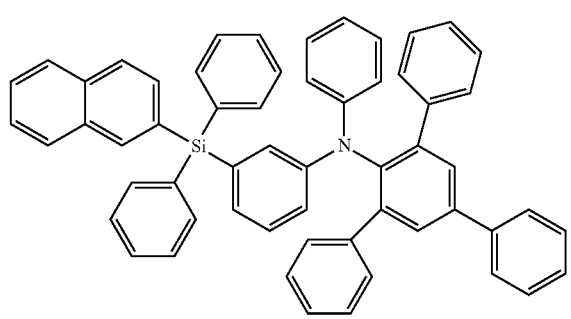
59
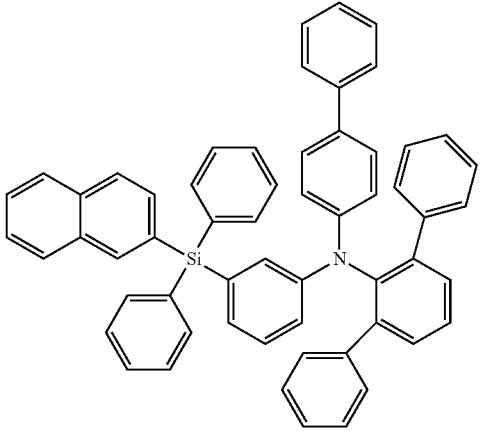
60
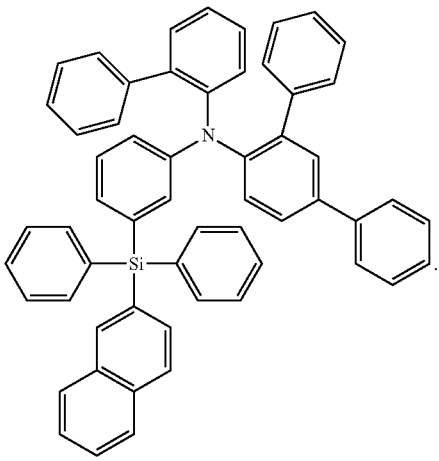
* * * * *

UNITED STATES PATENT AND TRADEMARK OFFICE
CERTIFICATE OF CORRECTION

PATENT NO. : 10,777,747 B2  
APPLICATION NO. : 15/830956  
DATED : September 15, 2020  
INVENTOR(S) : Hiroaki Itoi et al.

Page 1 of 1

It is certified that error appears in the above-identified patent and that said Letters Patent is hereby corrected as shown below:

In the Claims

In Column 76, Line 23, Claim 17    Delete "Li," and insert -- $L_1$, --

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*